US007879524B2

(12) United States Patent
Soejima et al.

(10) Patent No.: US 7,879,524 B2
(45) Date of Patent: Feb. 1, 2011

(54) IMAGE-FORMING METHOD USING HEAT-SENSITIVE TRANSFER SYSTEM

(75) Inventors: Shin Soejima, Haibara-gun (JP); Kazuaki Oguma, Minami-ashigara (JP)

(73) Assignee: Fujifilm Corporation, Tokyo (JP)

(*) Notice: Subject to any disclaimer, the term of this patent is extended or adjusted under 35 U.S.C. 154(b) by 488 days.

(21) Appl. No.: 12/058,556

(22) Filed: Mar. 28, 2008

(65) Prior Publication Data

US 2008/0254383 A1 Oct. 16, 2008

(30) Foreign Application Priority Data

Mar. 29, 2007 (JP) ............................ 2007-088236

(51) Int. Cl.
*G03F 7/00* (2006.01)
*B41M 5/20* (2006.01)
*B41M 5/24* (2006.01)

(52) U.S. Cl. ...................... 430/200; 430/199; 430/905; 430/964; 430/201; 503/227; 428/32.5

(58) Field of Classification Search .............. 430/270.1, 430/199, 200, 201, 964, 905; 503/227; 428/32.5
See application file for complete search history.

(56) References Cited

U.S. PATENT DOCUMENTS

| | | | | |
|---|---|---|---|---|
| 4,764,178 | A | 8/1988 | Gregory et al. | |
| 5,158,928 | A | 10/1992 | Bach et al. | |
| 6,261,995 | B1 * | 7/2001 | Nakajima et al. | 503/227 |
| 6,972,139 | B1 * | 12/2005 | Teegarden et al. | 428/32.85 |
| 7,022,453 | B2 * | 4/2006 | Miyake et al. | 430/200 |
| 7,112,396 | B2 * | 9/2006 | Miyake et al. | 430/200 |
| 7,381,685 | B2 * | 6/2008 | Oguma et al. | 503/227 |
| 7,470,649 | B2 * | 12/2008 | Nakane et al. | 503/227 |
| 7,485,402 | B2 * | 2/2009 | Arai et al. | 430/201 |
| 7,534,546 | B2 * | 5/2009 | Oguma et al. | 430/201 |
| 2005/0069656 | A1 | 3/2005 | Nakane et al. | |
| 2008/0248949 | A1 * | 10/2008 | Kariya | 503/201 |

FOREIGN PATENT DOCUMENTS

| | | | |
|---|---|---|---|
| JP | 6255194 | A | 3/1987 |
| JP | 7-29504 | B2 | 1/1991 |
| JP | 4357088 | A | 12/1992 |
| JP | 8-207461 | A | 8/1996 |
| JP | 2005-119280 | A | 5/2005 |

* cited by examiner

*Primary Examiner*—Amanda C. Walke
(74) *Attorney, Agent, or Firm*—Sughrue Mion, PLLC

(57) ABSTRACT

An image-forming method applying a heat-sensitive transfer system which uses a heat-sensitive transfer image-receiving sheet and a heat-sensitive transfer sheet, in which the heat-sensitive transfer image-receiving sheet has a support, at least one dye receptor layer on the support, and at least one heat insulation layer containing both hollow polymer particles and a hydrophilic polymer that is disposed between the dye receptor layer and the support; and the heat-sensitive transfer sheet has at least one yellow heat transfer layer, at least one magenta heat transfer layer, and/or at least one cyan heat transfer layer on a support:

comprising controlling each glass transition point (Tg-A) of three heat transfer layers so that they decrease in area order; and comprising transferring at least three kinds of heat transfer dyes contained in the heat transfer layers to the dye receptor layer in order.

10 Claims, 2 Drawing Sheets

IMAGE-FORMING METHOD USING HEAT-SENSITIVE TRANSFER SYSTEM

FIELD OF THE INVENTION

The present invention relates to an image-forming method using a heat-sensitive (thermal) transfer system, which has an excellent continuous printing suitability and forms an image that hardly involves defects.

BACKGROUND OF THE INVENTION

Various heat-sensitive transfer recording methods have been known so far. Among these methods, dye diffusion transfer recording systems attract attention as a process that can produce a color hard copy having an image quality closest to that of silver halide photography (see, for example, "Joho Kiroku (Hard Copy) to Sono Zairyo no Shintenkai (Information Recording (Hard Copy) and New Development of Recording Materials)" published by Toray Research Center Inc., 1993, pp. 241-285; and "Printer Zairyo no Kaihatsu (Development of Printer Materials)" published by CMC Publishing Co., Ltd., 1995, p. 180). Moreover, this system has advantages over silver halide photography: it is a dry system, it enables direct visualization from digital data, it makes reproduction simple, and the like. Further with a recent trend of speeding-up in printing, the dye diffusion transfer recording system is getting to have such an advantage that a printing time necessary to discharge a head of one sheet is short.

In this dye diffusion transfer recording system, a heat-sensitive transfer sheet (hereinafter also referred to as an ink sheet) containing dyes is superposed on a heat-sensitive transfer image-receiving sheet (hereinafter also referred to as an image-receiving sheet), and then the ink sheet is heated by a thermal head whose exothermic action is controlled by electric signals, in order to transfer the dyes contained in the ink sheet to the image-receiving sheet, thereby recording an image information. Three colors: cyan, magenta, and yellow, are used for recording a color image by overlapping one color to other, thereby enabling transferring and recording a color image having continuous gradation for color densities.

From the view point of improving coloring properties in this system, proposals to use various dyes are disclosed (see publications such as JP-A-7-232482 ("JP-A" means unexamined published Japanese patent application), JP-A-5-221161, JP-A-4-357088, and JP-A-62-55194). However, there is a problem that a rate of occurrence of image defect in the time when the obtained image is continuously processed is higher than that of silver salt photography that has a long history in the technical field of color print materials. Especially, with a mass scale-continuous processing, shriveling occurs in a ribbon, so that a problem of transfer failure arises. In addition, generation of blocking and sticking increases a rate of occurrence of printing failure, which results in worsening of profitability. Further, recently from the view point of improvement in profitability, a processing speed of the printer tends to be improved. In order to respond to such a trend, it is becoming important to have a passing suitability as the best mode. Under such the background, it has been studied to change the back surface of an ink sheet in order to improve the sticking (see JP-A-8-207461). Although there is a tendency that the sticking is further worsened by use of a high speed printer, a solution to improve the sticking has not yet found out. Although the blocking is also worsened by speeding-up, a solution by use of materials has not yet found out.

In this system of thermally transferring a dye, methods of controlling glass transition temperature (Tg) are proposed from the view point of improvement in coloring efficiency (see JP-B-7-29504 ("JP-B" means examined Japanese patent publication) and JP-A-2005-119280). In discussion about a printer, especially a passing property under the high speed conditions (transferring failure owing to occurrence of sticking, blocking and shriveling in a ribbon), it becomes an important factor to control Tg of a heat transfer layer of the ink sheet in an adequate relation ship to the image-receiving sheet in order to control a transport property between the ink sheet and the image-receiving sheet during transfer. Further in this system, although it has become ordinary to print yellow, magenta, cyan and the like in an area order, there is no knowledge relating to specific solution for Tg value balance among these colors. Further, with respect to the colored ink that is composed of a dye and a binder as primary components, although the colored ink is a system in which because an interaction between the dye and the binder is large, a simple additivity is unwarrantable, a specific solution relating to a specific control means for Tg of the whole heat transfer layers has not yet been found.

SUMMARY OF THE INVENTION

The present invention resides in an image-forming method applying a heat-sensitive transfer system which uses a heat-sensitive transfer image-receiving sheet and a heat-sensitive transfer sheet, in which the heat-sensitive transfer image-receiving sheet comprises a support, at least one dye receptor layer on the support, and at least one heat insulation layer containing both hollow polymer particles and a hydrophilic polymer that is disposed between the dye receptor layer and the support; and the heat-sensitive transfer sheet comprises at least one yellow heat transfer layer, at least one magenta heat transfer layer, and/or at least one cyan heat transfer layer on a support:

comprising controlling each glass transition point (Tg-A) of three heat transfer layers so that they decrease in area order; and comprising transferring at least three kinds of heat transfer dyes contained in the heat transfer layers to the dye receptor layer in order.

Further, the present invention resides in a heat-sensitive transfer sheet comprising at least one yellow heat transfer layer, at least one magenta heat transfer layer, and at least one cyan heat transfer layer on a support, wherein glass transition points (Tg-A) of the yellow heat transfer layer, the magenta heat transfer layer, and the cyan heat transfer layer decrease in that order.

Other and further features and advantages of the invention will appear more fully from the following description, appropriately referring to the accompanying drawings.

DETAILED DESCRIPTION OF THE INVENTION

Figure 1:
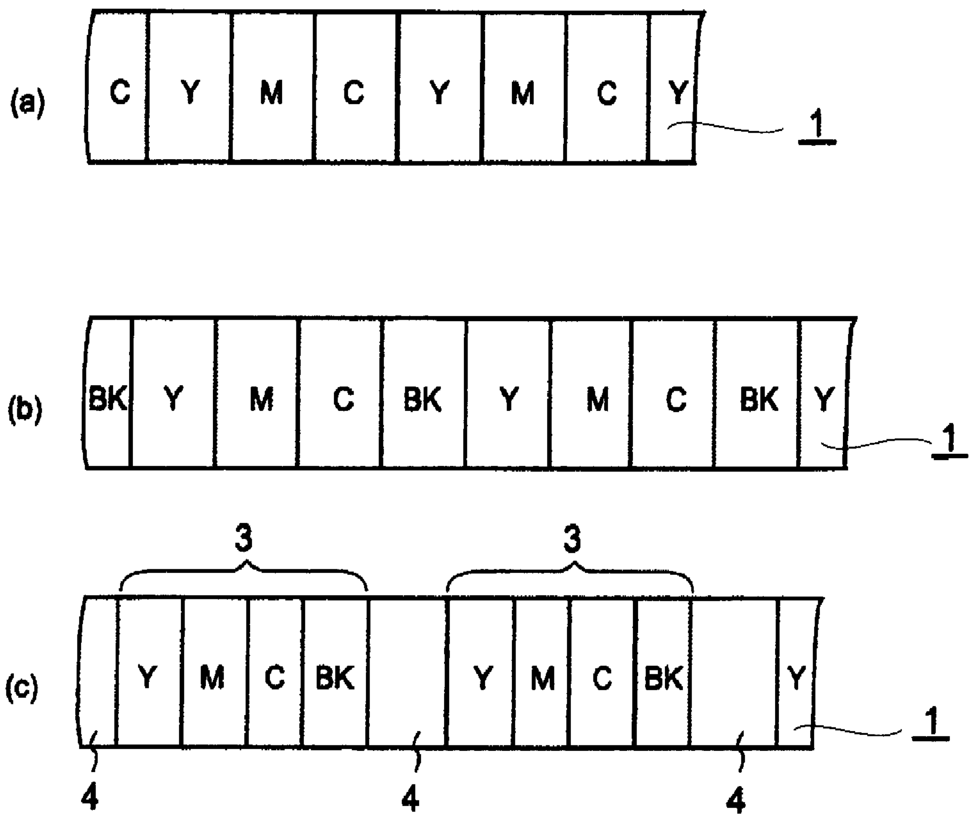
FIG. 1 (*a*) to FIG. 1 (*c*) are plane figures showing one embodiment of the heat-sensitive transfer sheet (ink sheet).

The present invention provides the following means:

(1) An image-forming method applying a heat-sensitive transfer system which uses a heat-sensitive transfer image-receiving sheet and a heat-sensitive transfer sheet, in which the heat-sensitive transfer image-receiving sheet comprises a support, at least one dye receptor layer on the support, and at least one heat insulation layer containing both hollow polymer particles and a hydrophilic polymer that is disposed between the dye receptor layer and the support; and the heat-sensitive transfer sheet comprises at least one yellow heat transfer layer, at least one magenta heat transfer layer, and/or at least one cyan heat transfer layer on a support:

comprising controlling each glass transition point (Tg-A) of three heat transfer layers so that they decrease in area order; and comprising transferring at least three kinds of heat transfer dyes contained in the heat transfer layers to the dye receptor layer in order.

(2) The image-forming method as described in the above item (1), wherein the heat-sensitive transfer sheet comprises a yellow heat transfer layer, a magenta heat transfer layer, and a cyan heat transfer layer, and each layer is formed on the surface of the same support in area order.

(3) The image-forming method as described in the above item (1) or (2), comprising the step of:

using a printer in which a maximum ultimate temperature (Tm) of a thermal head is 180° C. or more to 450° C. or less, at the time when a heat-sensitive transfer is performed using the heat-sensitive transfer sheet containing the heat transfer dye.

(4) The image-forming method as described in any one of the above items (1) to (3), wherein the printer has line speed of 0.8 m sec/line or less at the time of image formation.

(5) The image-forming method as described in any one of the above items (1) to (4), wherein at least one of the hydrophilic polymer contained in the heat insulation layer of the heat-sensitive transfer image-receiving sheet is gelatin.

(6) The image-forming method as described in any one of the above items (1) to (5), comprising the steps of:

superposing the heat-sensitive transfer sheet on the heat-sensitive transfer image-receiving sheet so that the dye receptor layer of the heat-sensitive transfer image-receiving sheet is in contact with the heat transfer layer of the heat-sensitive transfer sheet; and giving thermal energy from a thermal head in accordance with image signals, thereby to form an image.

(7) The image-forming method as described in any one of the above items (1) to (6), comprising the steps of:

superposing the heat-sensitive transfer sheet on the heat-sensitive transfer image-receiving sheet so that the receptor layer of the heat-sensitive transfer image-receiving sheet is in contact with the heat transfer layer of the heat-sensitive transfer sheet;

giving thermal energy from a thermal head in accordance with image signals, thereby to form an image; and forming a protective layer by using the thermal head.

(8) A heat-sensitive transfer sheet comprising at least one yellow heat transfer layer, at least one magenta heat transfer layer, and at least one cyan heat transfer layer on a support, wherein glass transition points (Tg-A) of the yellow heat transfer layer, the magenta heat transfer layer, and the cyan heat transfer layer decrease in that order.

(9) The heat-sensitive transfer sheet as described in the above item (8), wherein the glass transition point of the yellow heat transfer layer is 50° C. or more to 85° C. or less, the glass transition point of the magenta heat transfer layer is 46° C. or more to 80° C. or less, and the glass transition point of the cyan heat transfer layer is 45° C. or more to 75° C. or less.

(10) The heat-sensitive transfer sheet as described in the above item (8) or (9), wherein a difference of the glass transition point between the yellow heat transfer layer and the magenta heat transfer layer is 1° C. or more, and a difference of the glass transition point between the magenta heat transfer layer and the cyan heat transfer layer is 1° C. or more.

The present invention will be explained in detail below.

(1) Heat-Sensitive Transfer Sheet

The following is an explanation of a heat-sensitive transfer sheet (ink sheet) that is used in the present invention.

The ink sheet that is used together with the heat-sensitive transfer image-receiving sheet at the time of a heat-sensitive transfer image formation is composed of a support and, disposed thereon, a heat transfer layer (hereinafter sometimes referred to as a dye layer) containing a diffusion transfer dye that is prepared in the form of a dye ink.

Hereinafter, the heat transfer layer for use in the present invention will be explained.

(Heat Transfer Layer)

The heat transfer layer contains at least a sublimation type dye and a binder resin. It is a preferable embodiment of the present invention that the ink may contains organic or inorganic finely divided powder, waxes, silicone resins, and fluorine-containing organic compounds, in accordance with necessity.

The dye for use in the present invention is not particularly limited, so far as the dye is able to diffuse by heat and/or able to be incorporated in a sublimation type heat-sensitive transfer sheet, and able to transfer by heat from the sublimation type heat-sensitive transfer sheet to a heat-sensitive transfer image-receiving sheet. Accordingly, as the dye that is used for the heat-sensitive transfer sheet, ordinarily used dyes or known dyes can be effectively used.

Preferable examples of the dye include diarylmethane-series dyes; triarylmethane-series dyes; thazole-series dyes; methine-series dyes such as merocyanine; azomethine-series dyes typically exemplified by indoaniline, acetophenoneazomethine, pyrazoloazomethine, imidazole azomethine, imidazo azomethine, and pyridone azomethine; xanthene-series dyes; oxazine-series dyes; cyanomethylene-series dyes typically exemplified by dicyanostyrene, and tricyanostyrene; thazine-series dyes; azine-series dyes; acridine-series dyes; benzene azo-series dyes; azo-series dye such as pyridone azo, thiophene azo, isothiazole azo, pyrol azo, pyralazo, imidazole azo, thiadiazole azo, triazole azo, disazo; spiropyran-series dyes; indolinospiropyran-series dyes; fluoran-series dyes; rhodaminelactam-series dyes; naphthoquinone-series dyes; anthraquinone-series dyes; and quinophthalon-series dyes.

Specific examples of the yellow dyes include Disperse Yellow 231, Disperse Yellow 201 and Solvent Yellow 93. Specific examples of the magenta dyes include Disperse Violet 26, Disperse Red 60, and Solvent Red 19. Specific examples of the cyan dyes include Solvent Blue 63, Solvent Blue 36, Disperse Blue 354 and Disperse Blue 35. As a matter of course, it is also possible to use suitable dyes other than these dyes as exemplified above.

Further, dyes each having a different hue from each other as described above may be arbitrarily combined together. For instance, a black hue can be obtained from a combination of dyes.

Dyes that can be preferably used in the present invention are explained in detail below.

In the heat transfer layer of the ink sheet that is used in the present invention, use can be made of dyes that have been usually employed as a yellow dye. Among these, at least one dye represented by any one of formulae (Y1) to (Y4) is preferably contained in the heat transfer layer. However, the yellow dye that can be used in the present invention is not limited to these dyes.

First, the dye represented by formula (Y1) is explained in detail below.

Formula (Y1)

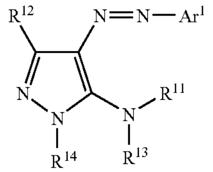

In formula (Y1), $Ar^1$, $R^{12}$ and $R^{14}$ represent a monovalent substituent. $R^{11}$ and $R^{13}$ represent a hydrogen atom or a monovalent substituent. There is no particular limitation on the substituent. Representative examples of the substituent include a halogen atom, an alkyl group, an alkenyl group, an alkynyl group, an aryl group, a heterocyclic group, a cyano group, an alkoxy group, an aryloxy group, an acyloxy group, a carbamoyloxy group, an alkoxycarbonyloxy group, an aryloxycarbonyloxy group, an amino group (including an alkylamino group, an anilino group, and a heterocyclic amino group), an acylamino group, an aminocarbonylamino group, an alkoxycarbonylamino group, an aryloxycarbonylamino group, a sulfamoylamino group, an alkyl- or aryl-sulfonylamino group, an alkylthio group, a sulfamoyl group, an alkyl- or aryl-sulfinyl group, an alkyl- or aryl-sulfonyl group, an acyl group, an aryloxycarbonyl group, an alkoxycarbonyl group, a carbamoyl group, an aryl- or heterocyclic-azo group, and an imido group. Each of these groups may further be substituted.

In formula (Y1), $R^{13}$ and $R^{14}$ may form a ring. There is no particular limitation to atoms necessary to form a ring. Typical examples are the atoms represented by $—C(R^{15})═N—$, $—N═C(R^{15})—$, $—C(═O)—C(R^{15})═C(R^{16})—$, or $—C(═O)—N(R^{15})—C(═O)—$, wherein $R^{15}$ and $R^{16}$ each independently represent a hydrogen atom or a substituent. Examples of the substituent are the same as examples of the substituent represented by $R^{11}$, $R^{12}$, $R^{13}$ and $R^{14}$.

$R^{12}$ represents a hydrogen atom, an alkyl group, an alkoxy group, an aryl group, an alkoxycarbonyl group, a cyano group, or a carbamoyl group, preferably. $R^{14}$ represents a hydrogen atom, an alkyl group, an aryl group, or a heteroaryl group, preferably. $R^{11}$ and $R^{13}$ each independently represent a hydrogen atom or an alkyl group, preferably. And each of the above-mentioned groups may further be substituted.

In formula (Y1), as $Ar^1$, preferred is an aryl group that may be substituted or unsubstituted with a substituent. Examples of the substituent include those groups exemplified above as a substituent of $R^{11}$, $R^{12}$, $R^{13}$ and $R^{14}$, and in addition, an alkyloxycarbonyl group, a sulfonyl group, a sulfonylamino group, a hydroxyl group, and a nitro group. Further, a heterocyclic group is also preferred as $Ar^1$. Preferable examples of the heterocyclic group include an imidazolyl group, a pyridyl group, a pyrazolyl group, a thiazolyl group, a benzoimidazolyl group, a quinonyl group, a benzopyrazolyl group, a benzothiazolyl group, an isothiazolyl group, a benzoisothiazolyl group, a pyridoisothiazolyl group, and a thiadiazolyl group.

The maximum absorption wavelength of the azo dye represented by formula (Y1) that can be used in the present invention is preferably in the range of from 400 nm to 480 nm, more preferably from 420 nm to 460 nm.

Preferable examples of the compound represented by formula (Y1) are shown below, but the compounds that can be used in the present invention are not limited to the following specific examples.

Y1-1

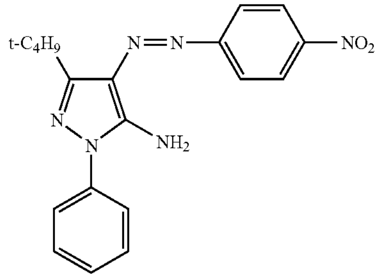

Y1-2

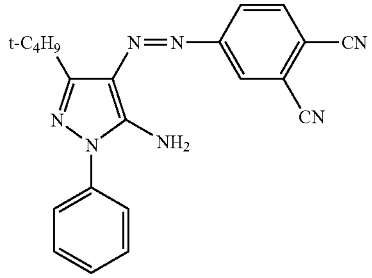

Y1-3

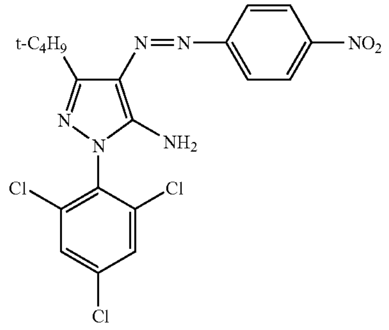

Y1-4

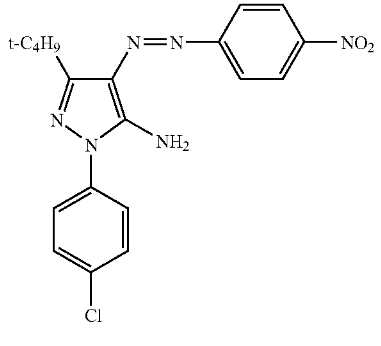

-continued

Y1-5

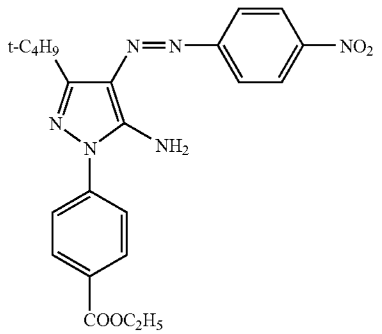

Y1-6

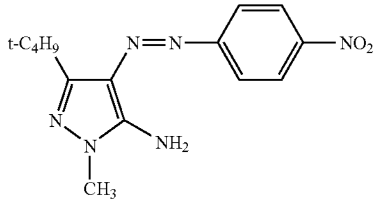

Y1-7

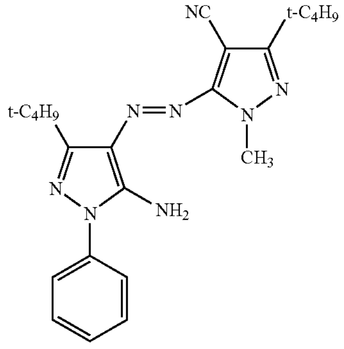

Y1-8

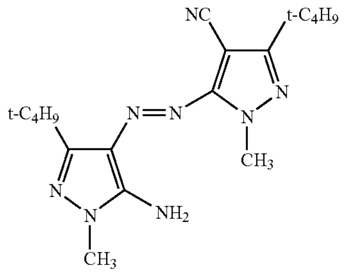

Y1-9

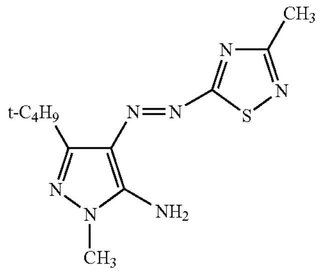

-continued

Y1-10

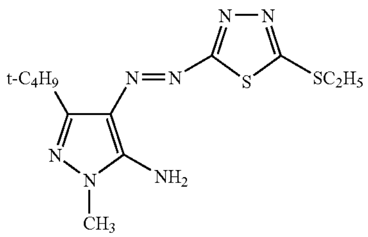

The dye represented by formula (Y1) can be synthesized according to a usual manner.

Next, the dye represented by formula (Y2) is explained in detail below.

Formula (Y2)

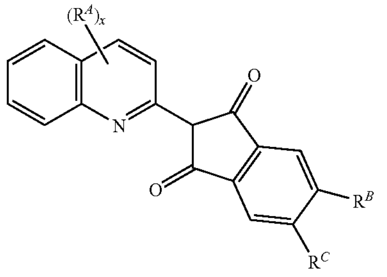

In formula (Y2), $R^A$ represents a substituent. Preferable examples of the substituent include a halogen atom, a hydroxyl group, an alkyl group having 1 to 8 carbon atoms, a cycloalkyl group, an alkoxy group, an alkoxycarbonyl group, an alkylthio group, an alkylsulfonyl group, an amino group, an alkylamino group, an arylamino group, a sulfonamide group, an aryloxy group, and an arylthio group, and more preferable an alkyl group having 1 to 8 carbon atoms and a hydroxyl group. x represents an integer of 0 to 6. x is preferable an integer of 0 to 3, more preferable 1 to 2. $R^B$ and $R^C$ each independently represent an acyl group, an alkoxycarbonyl group, or a carbamoyl group.

Among the above groups, the group having an alkyl moiety, an aryl moiety, or a heterocyclic moiety as a partial structure, may further be substituted with a substituent(s). Examples of the substituent include a halogen atom, an unsaturated alkyl group, a cycloalkyl group, an aryl group, a heterocyclic group, an alkoxy group, an acyloxy group, a carbamoyloxy group, an alkoxycarbonyloxy group, an aryloxycarbonyloxy group, an amino group, an acylamino group, an aminocarbonylamino group, an alkoxycarbonylamino group, a sulfamoylamino group, an alkyl- or arylsulfonylamino group, an alkylthio group, a sulfamoyl group, an alkyl group, an aryl-sulfinyl group, an aryl-sulfonyl group, an acyl group, an aryloxycarbonyl group, an alkoxycarbonyl group, a carbamoyl group, an aryl- or heterocyclic-azo group, an imido group, a hydroxyl group, a cyano group, a nitro group, a sulfo group, and a carboxyl group.

Preferable examples of the compound represented by formula (Y2) are shown below, but the compounds that can be used in the present invention are not limited to the following specific examples.

Y2-1

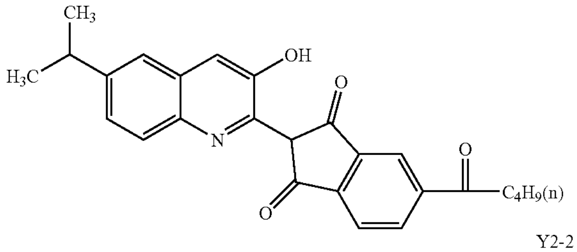

Y2-2

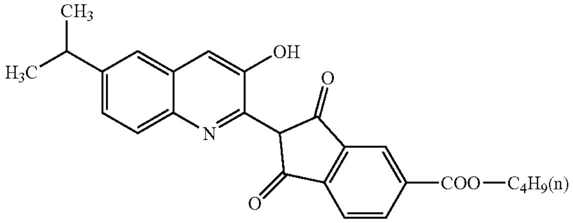

Y2-3

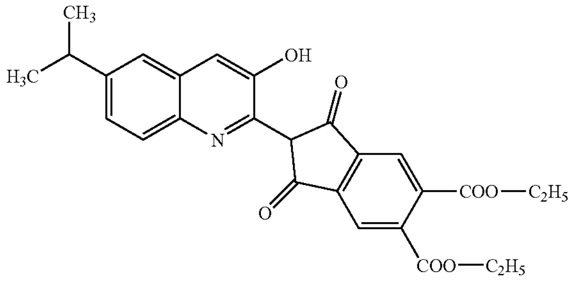

Next, the dye represented by formula (Y3) is explained in detail below.

Formula (Y3)

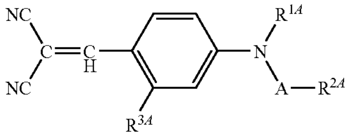

In formula (Y3), $R^{1A}$ represents an allyl group or an alkyl group. $R^{2A}$ represents a substituted or unsubstituted alkyl, aryl or acyl group. A represents $—CH_2—$, $—CH_2CH_2—$, $—CH_2CH_2O—$, $—CH_2CH_2OCH_2—$, or $—CH_2CH_2OCH_2CH_2—$. $R^{3A}$ represents a hydrogen atom or an alkyl group. Each group may further be substituted (including, for example, a cycloalkyl group, an alkoxy group, an acyloxy group, and a hydroxyl group).

Preferable examples of the compound represented by formula (Y3) are shown below, but the compounds that can be used in the present invention are not limited to the following specific examples.

Y3-1

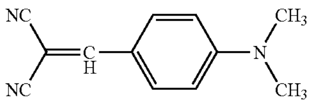

-continued

Y3-2

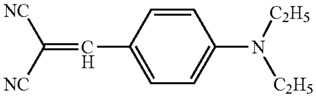

Y3-3

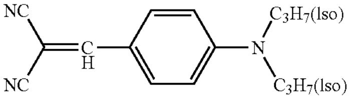

Y3-4

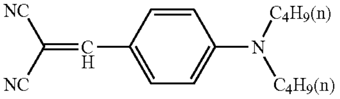

Y3-5

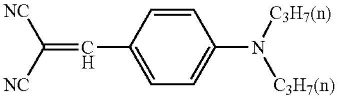

Y3-6

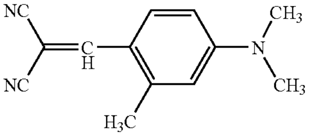

Y3-7

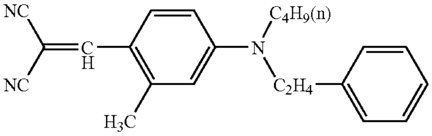

Y3-8

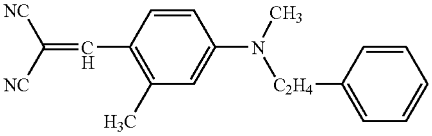

Y3-9

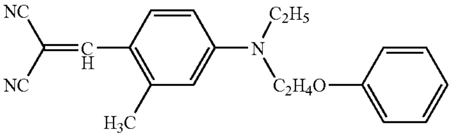

Y3-10

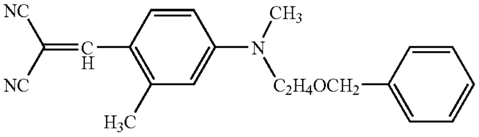

Y3-11

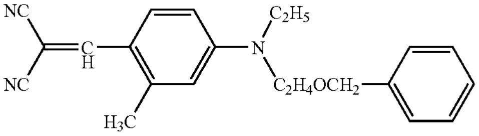

Y3-12

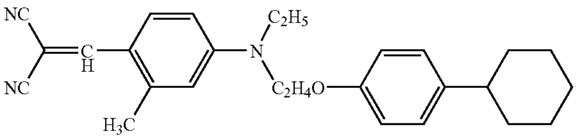

-continued

Y3-13

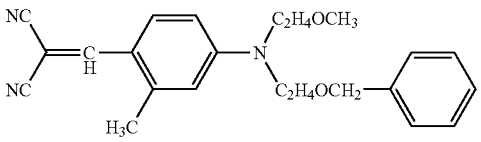

Y3-14

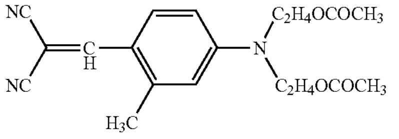

Next, the dye represented by formula (Y4) is explained in detail below.

Formula (Y4)

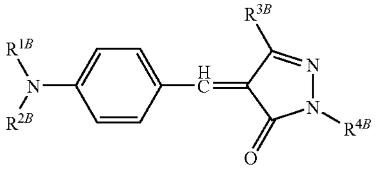

In formula (Y4), $R^{1B}$, $R^{2B}$, $R^{3B}$, and $R^{4B}$ each independently represent a hydrogen atom or a substituent. Examples of the substituent include an alkyl group, an aryl group, an alkoxy group, and alkylamino group.

Preferable examples of the compound represented by formula (Y4) are shown below, but the compounds that can be used in the present invention are not limited to the following specific examples.

Y4-1

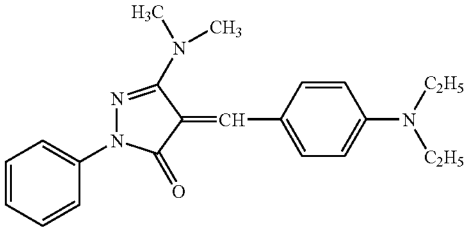

Y4-2

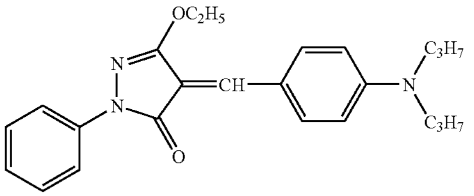

Y4-3

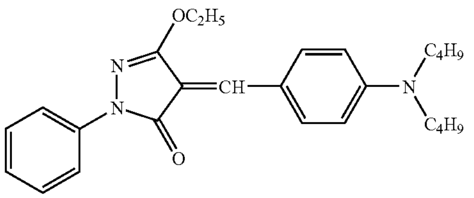

The dyes represented by any one of formulae (Y2), (Y3), and (Y4) can be synthesized according to a usual method.

In the heat transfer layer of the ink sheet that is used in the present invention, use can be made of dyes that have been usually employed as a magenta dye. Among these, at least one magenta dye represented by any one of formulae (M1) to (M4) is preferably used. However, the magenta dye that can be used in the present invention is not limited to these dyes.

First, the dye represented by formula (M1) is explained below.

Formula (M1)

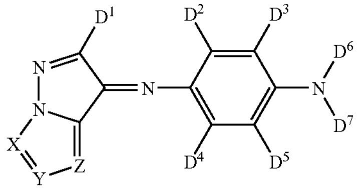

In formula (M1), $D^1$, $D^2$, $D^3$ $D^4$, and $D^5$ each independently represent a hydrogen atom, a halogen atom, an alkyl group, an alkoxy group, an aryl group, an aryloxy group, a cyano group, an acylamino group, a sulfonylamino group, a ureido group, an alkoxycarbonylamino group, an alkylthio group, an arylthio group, an alkoxycarbonyl group, a carbamoyl group, a sulfamoyl group, a sulfonyl group, an acyl group, or an amino group; $D^6$ and $D^7$ each independently represent a hydrogen atom, an alkyl group, alkylcyano group or an aryl group; $D^6$ and $D^7$ may be bonded together to form a ring; $D^3$ and $D^6$ and/or $D^5$ and $D^7$ may be bonded together to form a ring; X, Y, and Z each independently represent $=C(D^8)$- or a nitrogen atom, in which $D^8$ represents a hydrogen atom, an alkyl group, an aryl group, an alkoxy group, an aryloxy group, or an amino group; when X and Y each represent $=C(D^8)$- or Y and Z each represent $=C(D^8)$-, two $D^8$s may be bonded together to form a saturated or unsaturated carbon ring; and each of the above-mentioned groups may further be substituted.

Among the dyes represented by formula (M1), a dye represented by formula (M1B) is preferable.

Formula (M1B)

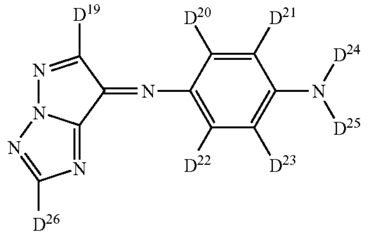

In formula (M1B), $D^{19}$, $D^{20}$, $D^{21}$ $D^{22}$, and $D^{23}$ each independently represent a hydrogen atom, a halogen atom, an alkyl group, an alkoxy group, an aryl group, an aryloxy group, a cyano group, an acylamino group, a sulfonylamino group, a ureido group, an alkoxycarbonylamino group, an alkylthio group, an arylthio group, an alkoxycarbonyl group, a carbamoyl group, a sulfamoyl group, a sulfonyl group, an acyl group, or an amino group. $D^{24}$ and $D^{25}$ each independently represent a hydrogen atom, an alkyl group, alkylcyano group or an aryl group. $D^{24}$ and $D^{25}$ may be bonded together to form a ring. $D^{21}$ and $D^{24}$ and/or $D^{23}$ and $D^{25}$ may be bonded together to form a ring. $D^{26}$ represents an alkyl group, an aryl group, an alkoxy group, an aryloxy group, or an amino group. And each of the above-mentioned groups may further be substituted.

Preferable examples of the compound represented by formula (M1) are shown below, but the compounds that can be used in the present invention are not limited to the following specific examples.

M1-1

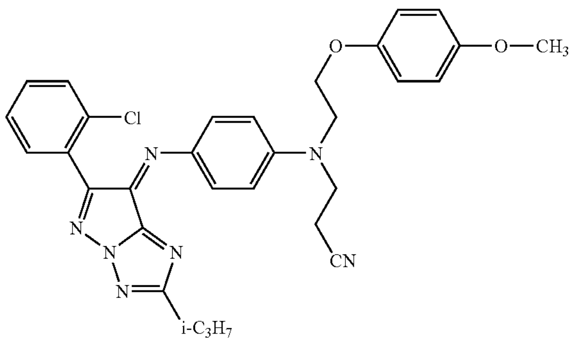

M1-2

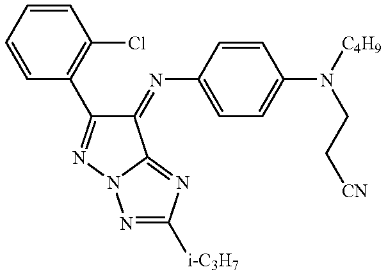

M1-3

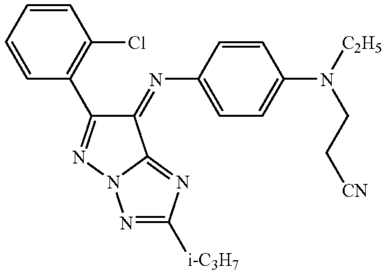

M1-4

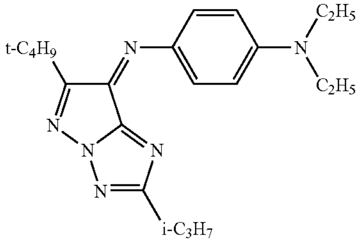

M1-5

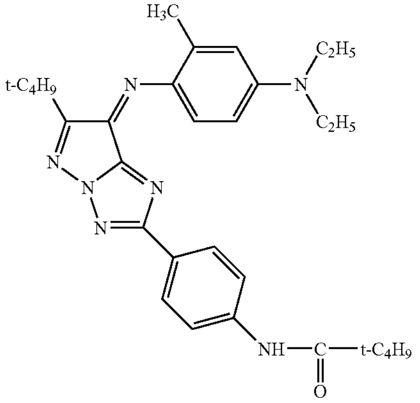

-continued

M1-6

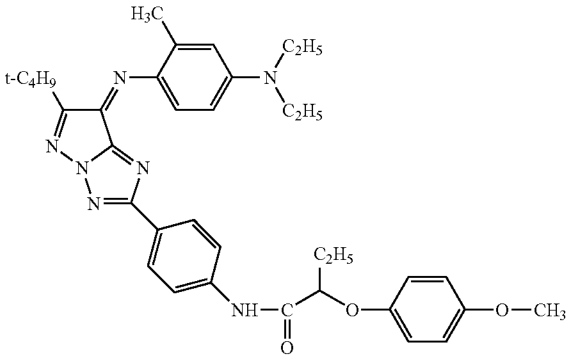

M1-7

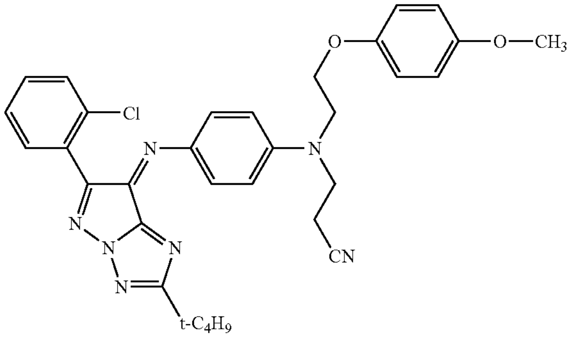

Second, the dye represented by formula (M2) is explained in detail.

$$A\text{-}N{=}N\text{-}E \qquad \text{formula (M2)}$$

In formula (M2), A represents an optionally substituted heterocyclic group whose hetero ring is selected from imidazole, pyrrazole, thiazole, benzothiazole, isothiazole, benzoisothiazole, and thiophene. Preferred heterocyclic rings are an imidazoyl group, a pyrazolyl group, a thiazolyl group, a benzothiazolyl group, an isothiazolyl group, a benzoisothiazolyl group, or a thienyl group, of these substituents, preferred is an imidazoyl group. Each of which may further be substituted.

Examples of the substituent with which the heterocyclic group represented by A may be substituted include a cyano group, a thiocyano group, a nitro group, a halogen atom, an alkyl group, an alkoxy group, a formyl group, an alkylthio group, an alkylsulfonyl group, an alkoxycarbonyl group, and an alkylcarbonyl group. Of these substituents, preferred are a cyano group, a thiocyano group, a cyanomethyl group, a nitro group, and alkyl group.

E represents an optionally substituted aminophenyl group, tetrahydroquinolinyl group, yulolidyl group, or aminoquinolinyl group. Herein, the amino moiety in the aminophenyl group and the aminoquinolinyl group embraces an amino group and a substituted amino group. Examples of the substituent with which E may be substituted include an alkyl group, an alkenyl group, a cycloalkyl group, an aryl group, an amide group, and a heterocyclic group.

E is preferably an aminophenyl group which is not substituted or substituted with an alkyl group, an amide group.

Preferable examples of the compound represented by formula (M2) are shown below, but the compounds that can be used in the present invention are not limited to the following specific examples.

M2-1

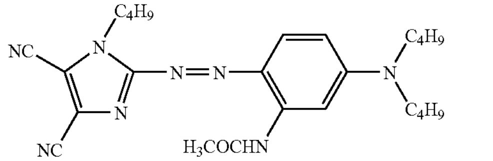

M2-2

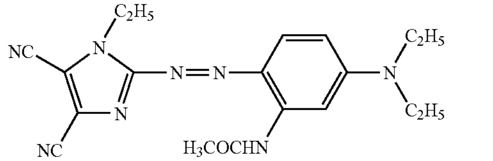

M2-3

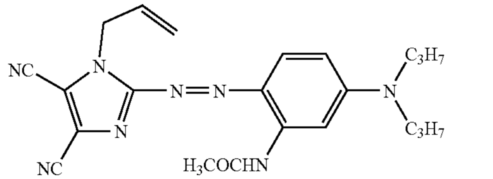

M2-4

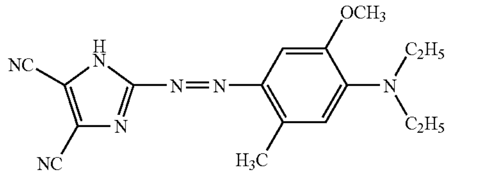

M2-5

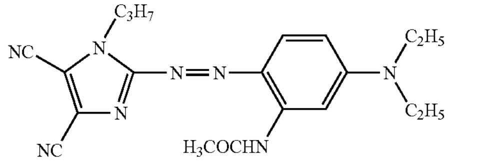

M2-6

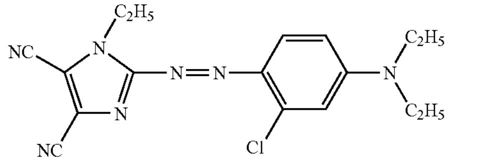

M2-7

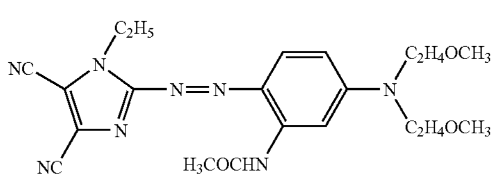

Next, the dye represented by formula (M3) or (M4) is explained in detail.

Formula (M3)

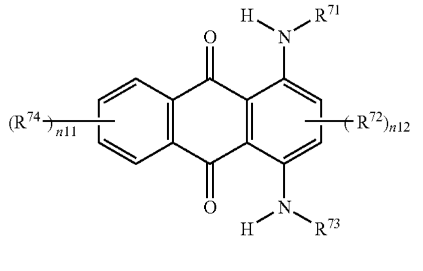

-continued

Formula (M4)

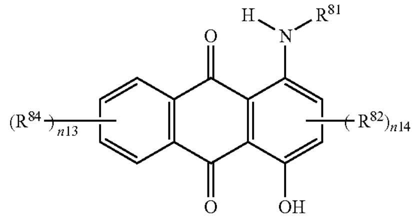

In formula (M3), $R^{71}$ and $R^{73}$ each independently represent a hydrogen atom or a substituent; $R^{72}$ and $R^{74}$ each independently represent a substituent; n11 represents an integer of 0 to 4; n12 represents an integer of 0 to 2; when n11 represents an integer of 2 to 4, $R^{74}$s may be the same or different from each other; and when n12 represents 2, $R^{72}$s may be the same or different from each other.

Examples of the substituents represented by $R^{71}$ to $R^{74}$ include a halogen atom, an alkyl group (including a cycloalkyl group regardless of ring number), an alkenyl group (including a cycloalkenyl group regardless of ring number), an alkynyl group, an aryl group, a heterocyclic group, a cyano group, an alkoxy group, an aryloxy group, an acyloxy group, a carbamoyloxy group, an alkoxycarbonyloxy group, an aryloxycarbonyloxy group, an amino group (including an alkylamino group and an anilino group), an acylamino group, an aminocarbonylamino group, an alkoxycarbonylamino group, an aryloxycarbonylamino group, a sulfamoylamino group, an alkyl- or aryl-sulfonylamino group, an alkylthio group, an sulfamoyl group, an alkyl- or aryl-sulfinyl group, an alkyl- or aryl-sulfonyl group, an acyl group, an aryloxycarbonyl group, an alkoxycarbonyl group, a carbamoyl group, an aryl- or heterocyclic-azo group, and an imido group. Each of the above-mentioned substituents may further be substituted.

$R^{71}$ and $R^{73}$ each are a hydrogen atom, a substituted or unsubstituted alkyl group, a substituted or unsubstituted alkenyl group, a substituted or unsubstituted aryl group, or a substituted or unsubstituted heterocyclic group; preferably a hydrogen atom or a substituted or unsubstituted alkyl group, more preferably a hydrogen atom or a substituted or unsubstituted alkyl group having 1 to 6 carbon atoms, and further preferably a hydrogen atom.

$R^{72}$ and $R^{74}$ each independently represent a halogen atom, an alkyl group, an alkenyl group, an alkynyl group, an aryl group, a heterocyclic group, a cyano group, an alkoxy group, an aryloxy group, an acyloxy group, a carbamoyloxy group, an alkoxycarbonyloxy group, an aryloxycarbonyloxy group, an amino group, an acylamino group, an aminocarbonylamino group, an alkoxycarbonylamino group, an aryloxycarbonylamino group, a sulfamoylamino group, an alkyl- or aryl-sulfonylamino group, an alkylthio group, an sulfamoyl group, an alkyl- or aryl-sulfinyl group, an alkyl- or aryl-sulfonyl group, an acyl group, an aryloxycarbonyl group, an alkoxycarbonyl group or a carbamoyl group; preferably an alkoxy group, an aryloxy group, an acyloxy group, a carbamoyloxy group, an alkoxycarbonyloxy group, or an aryloxycarbonyloxy group; more preferably an alkoxy group or an aryloxy group. Each of the above-mentioned substituents may further be substituted.

In formula (M4), $R^{81}$ represents a hydrogen atom or a substituent, $R^{82}$ and $R^{84}$ each independently represent a substituent, n13 represents an integer of 0 to 4, and n14 represents an integer of 0 to 2. When n13 represents an integer of 2 to 4, $R^{84}$s may be the same or different from each other. When n14 represents 2, $R^{82}$s may be the same or different from each other. Examples of the substituents each represented by $R^{81}$, $R^{82}$ and $R^{84}$ include those given as examples of the substituent each represented by $R^{71}$ to $R^{74}$ set forth above.

Examples of the substituent represented by $R^{81}$ include those given as examples of the substituents as described about $R^{71}$ and $R^{73}$, and preferable examples thereof are also same. $R^{81}$ is more preferably a hydrogen atom or a substituted or unsubstituted alkyl group having 1 to 6 carbon atoms, and further preferably a hydrogen atom.

Examples of the substituent represented by $R^{82}$ and $R^{84}$ include those given as examples of the substituent as described about $R^{72}$ and $R^{74}$. $R^{82}$ and $R^{84}$ each independently are preferably an alkoxy group, an aryloxy group, an acyloxy group, a carbamoyloxy group, an alkoxycarbonyloxy group and an aryloxycarbonyloxy group; and more preferably an alkoxy group and an aryloxy group. Each of these groups may be further substituted.

The following is an explanation about a preferable combination of various substituents (atoms) that a dye represented by formula (M3) or (M4) may have: A preferred compound is a compound in which at least one of the substituents is the above-described preferable substituent. A more preferred compound is a compound in which more substituents are the above-described preferable substituents. The most preferred compound is a compound in which all substituents are the above-described preferable substituents.

In the compound represented by formula (M3), it is preferable that $R^{71}$ is a hydrogen atom, $R^{72}$ is an aryloxy group, $R^{73}$ is a hydrogen atom, n11 is an integer of 0, and n12 is an integer of 0 to 2. It is more preferable that $R^{71}$ is a hydrogen atom, $R^{72}$ is an aryloxy group, $R^{73}$ is a hydrogen atom, n11 is integer of 0, and n12 is an integer of 2.

In the compound represented by formula (M4), it is preferable that $R^{81}$ is a hydrogen atom, $R^{82}$ is an aryloxy group, n13 is an integer of 1 or 2, and n14 is an integer of 0. It is more preferable that $R^{81}$ is a hydrogen atom, $R^{82}$ is an aryloxy group, n13 is an integer of 1, and n14 is an integer of 0. It is further preferable that $R^{81}$ is a hydrogen atom, $R^{82}$ is an aryloxy group, n13 is an integer of 1, n14 is an integer of 0, and said $R^{82}$ is positioned at ortho-site to the amino group.

Preferable examples of the compound represented by formula (M3) or (M4) are shown below, but the compounds that can be used in the present invention are not limited to the following specific examples.

M3-1

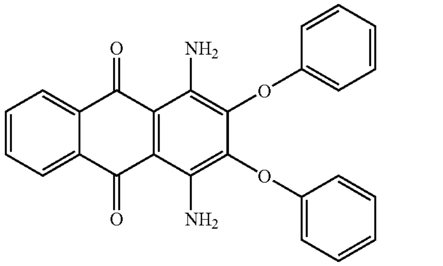

M3-2

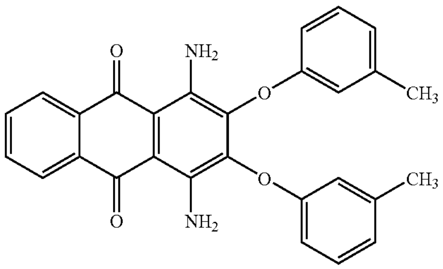

-continued

M3-3

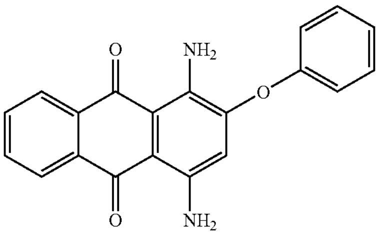

M3-4

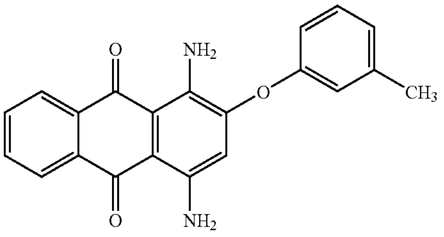

M4-1

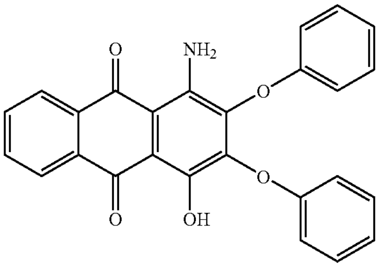

M4-2

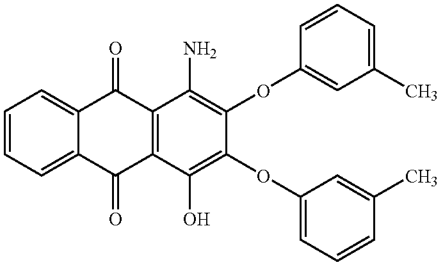

M4-3

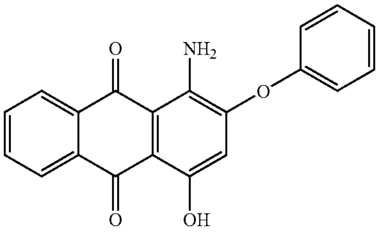

M4-4

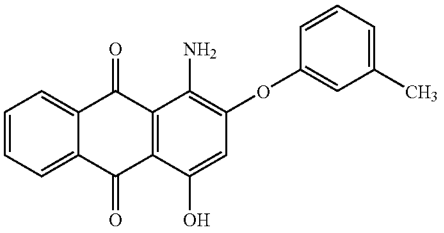

The dye represented by any one of formulae (M1) to (M4) can be synthesized according to a usual manner.

In the heat transfer layer of the ink sheet that is used in the present invention, use can be made of dyes that have been usually employed as a cyan dye. Among these, the cyan dye represented by formula (C1) or (C2) is preferably used. However, the cyan dye that can be used in the present invention is not limited to these dyes.

First, the dye represented by formula (C1) is explained in detail.

Formula (C1)

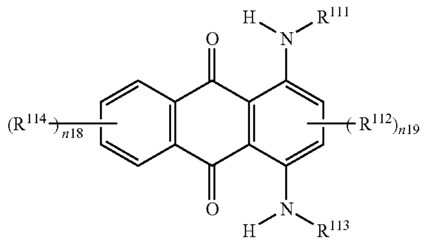

In formula (C1), $R^{111}$ and $R^{113}$ each independently represent a hydrogen atom or a substituent. $R^{112}$ and $R^{114}$ each independently represent a substituent; n18 represents an integer of 0 to 4; n19 represents an integer of 0 to 2. When n18 represents an integer of 2 to 4, $R^{114}$s may be the same or different from each other, and when n19 represents 2, $R^{112}$s may be the same or different from each other; each of these groups may further be substituted. Examples of the substituents represented by $R^{111}$ to $R^{114}$ include a halogen atom, an alkyl group, an alkenyl group, an alkynyl group, an aryl group, a heterocyclic group, an alkoxy group, an aryloxy group, a formyloxy group, a carbamoyloxy group, an alkoxycarbonyloxy group, an aryloxycarbonyloxy group, an amino group, an acylamino group, an aminocarbonylamino group, an alkoxycarbonylamino group, an aryloxycarbonylamino group, a sulfamoylamino group, an alkyl- or aryl-sulfonylamino group, an alkylthio group, an sulfamoyl group, an alkyl- or aryl-sulfinyl group, an alkyl- or aryl-sulfonyl group, an acyl group, an aryloxycarbonyl group, an alkoxycarbonyl group, a carbamoyl group, an aryl- or heterocyclic-azo group, and an imido group.

$R^{111}$ and $R^{113}$ each independently are preferably a hydrogen atom, a substituted or unsubstituted alkyl group, a substituted or unsubstituted alkenyl group, a substituted or unsubstituted aryl group, and a substituted or unsubstituted heterocyclic group. $R^{111}$ and $R^{113}$ each independently are more preferably a hydrogen atom, a substituted or unsubstituted alkyl group having 1 to 6 carbon atoms, or a substituted or unsubstituted aryl group.

$R^{112}$ and $R^{114}$ each independently are preferably a halogen atom, an alkyl group, an alkenyl group, an alkynyl group, an aryl group, a heterocyclic group, a cyano group, an alkoxy group, an aryloxy group, an acyloxy group, a carbamoyloxy group, an alkoxycarbonyloxy group, an aryloxycarbonyloxy group, an amino group, an acylamino group, an aminocarbonylamino group, an alkoxycarbonylamino group, an aryloxycarbonylamino group, a sulfamoylamino group, an alkyl- or aryl-sulfonylamino group, an alkylthio group, an sulfamoyl group, an alkyl- or aryl-sulfinyl group, an alkyl- or aryl-sulfonyl group, an acyl group, an aryloxycarbonyl group, an alkoxycarbonyl group, and a carbamoyl group. $R^{112}$ and $R^{114}$ each independently are more preferably a hydrogen atom, a halogen atom, an alkyl group, an alkenyl group, an aryl group, a heterocyclic group, an alkoxy group, an aryloxy group, an acyloxy group, a carbamoyloxy group, an alkoxycarbonyloxy group, an aryloxycarbonyloxy group, an amino group, an acylamino group, an aminocarbonylamino group, an alkoxycarbonylamino group, an aryloxycarbonylamino group, an alkylthio group, an acyl group, an aryloxycarbonyl group, an alkoxycarbonyl group, or carbamoyl group, further preferably a halogen atom, a substituted or unsubstituted alkyl group, a substituted or unsubstituted alkenyl group, a substituted or unsubstituted aryl group, or a substituted or unsubstituted heterocyclic group; and further more preferably a substituted or unsubstituted alkyl group.

Preferable examples of the compound represented by formula (C1) are shown below, but the compounds that can be used in the present invention are not limited to the following specific examples.

C1-1

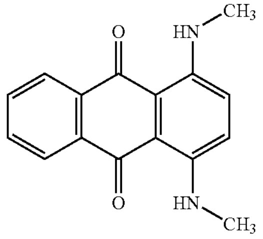

C1-2

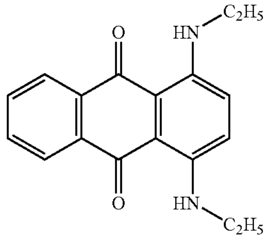

C1-3

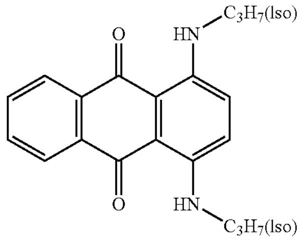

C1-4

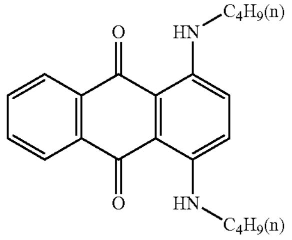

C1-5

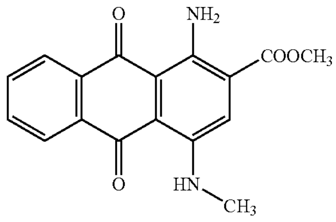

-continued

C1-6

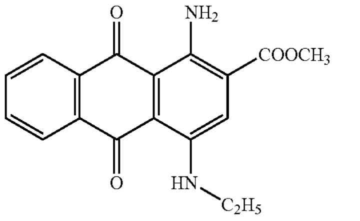

C1-7

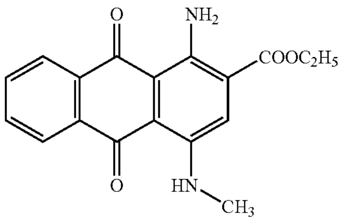

C1-8

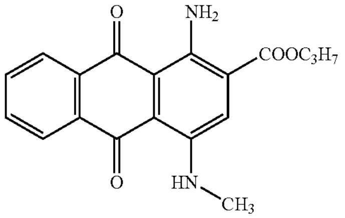

C1-9

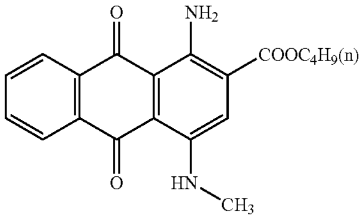

C1-10

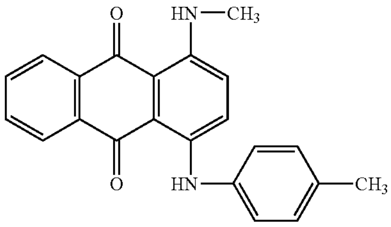

C1-11

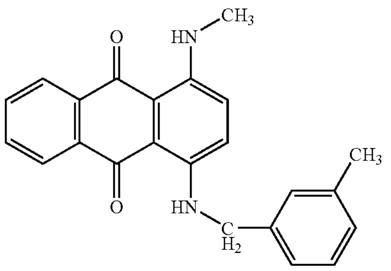

-continued

C1-12

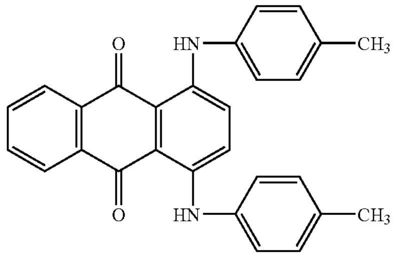

Among the dyes represented by formula (C1), those not available on the market can be synthesized according to the methods described in publications or specifications of U.S. Pat. Nos. 4,757,046 and 3,770,370, German Patent No. 2316755, JP-A-2004-51873, JP-A-7-137455, and JP-A-61-31292, and J. Chem. Soc. Perkin. Transfer I, 2047 (1977), *Merocyanine Dye-Doner Element Used in thermal Dye Transfer*, authored by Champan.

Next, the dye represented by formula (C2) is explained in detail.

Formula (C2)

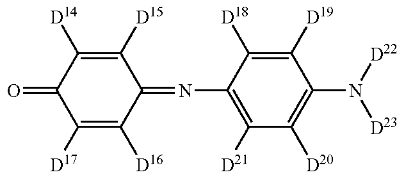

In formula (C2), $D^{14}$ to $D^{21}$ each independently represent a hydrogen atom, a halogen atom, an alkyl group, an alkoxy group, an aryl group, an aryloxy group, a cyano group, an acylamino group, a sulfonylamino group, a ureido group, an alkoxycarbonylamino group, an alkylthio group, an arylthio group, an alkoxycarbonyl group, a carbamoyl group, a sulfamoyl group, a sulfonyl group, an acyl group or an amino group. $D^{22}$ and $D^{23}$ each independently represent a hydrogen atom, an alkyl group or an aryl group. $D^{22}$ and $D^{23}$ may be bonded together to form a ring. $D^{19}$ and $D^{22}$ and/or $D^{20}$ and $D^{23}$ may be bonded together to form a ring.

$D^{14}$ is preferably an acylamino group, a ureido group or an alkoxycarbonyl group, more preferably an acylamino group, or a ureido group, furthermore preferably an acylamino group, and most preferably a group represented by the following formula (IV).

$$—NH—C(=O)\text{-}D^{24}$$ Formula (IV)

In formula (IV), $D^{24}$ is an alkyl group (preferably an alkyl group having 1 to 12 carbon atoms, e.g., methyl, ethyl, isopropyl, n-propyl, t-butyl), an aryl group (preferably an aryl group having 6 to 10 carbon atoms, e.g., phenyl, m-nitrophenyl, p-nitrophenyl, p-tolyl, p-methoxyphenyl, naphthyl, m-chlorophenyl, p-chlorophenyl) or a heterocyclic group (preferably a 5- to 8-membered heterocyclic group having 0 to 10 carbon atoms and containing, as a ring-constituting atom(s), a hetero atom selected from an oxygen atom, a nitrogen atom and a sulfur atom, e.g., pyridyl, furyl, tetrahydrofuryl). $D^{24}$ is preferably a heterocyclic group or an alkyl group, and more preferably a pyridyl group, a furyl group, a tetrahydrofuryl group or a methyl group.

$D^{15}$, $D^{16}$, $D^{18}$, $D^{19}$, $D^{20}$, and $D^{21}$ each are preferably a hydrogen atom or an alkyl group (preferably an alkyl group having 1 to 12 carbon atoms, e.g., methyl, ethyl, isopropyl, n-propyl, t-butyl), and more preferably a hydrogen atom, a methyl group or an ethyl group. $D^{17}$ is preferably a hydrogen atom, an alkyl group (preferably an alkyl group having 1 to 12 carbon atoms, e.g., methyl, ethyl, isopropyl, n-propyl, t-butyl), a halogen atom, a cyano group, a nitro group, or a heterocyclic group; and more preferably a hydrogen atom or a halogen atom. $D^{16}$ and $D^{17}$ may be bonded together to form a ring. $D^{22}$ and $D^{23}$ each are preferably a hydrogen atom or an alkyl group (preferably an alkyl group having 1 to 12 carbon atoms, e.g., methyl, ethyl, isopropyl, n-propyl, t-butyl), and more preferably a methyl group, an ethyl group or an n-propyl group. These alkyl groups may be substituted with another substituent. In the case that the alkyl group is substituted with another substituent, preferable examples of the "another" substituent include a heterocyclic group, a halogen atom, an alkoxy group, an aryloxy group, an amino group, an acyl group, a acyloxy group, an acylamino group, an alkylthio group, an arylthio group, a sulfonylamino group, a sulfonyl group, a sulfinyl group, a carbamoyl group, a sulfamoyl group, an alkoxycarbonyl group and an aryloxycarbonyl group, with more preferable example being a carbamoyl group. $D^{22}$ and $D^{23}$ each are further preferably a hydrogen atom, a methyl group or an ethyl group.

Preferable examples of the compound represented by formula (C2) are shown below, but the compounds that can be used in the present invention are not limited to the following specific examples.

C2-1

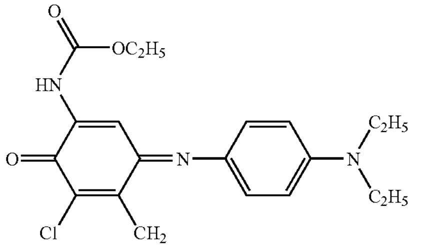

C2-2

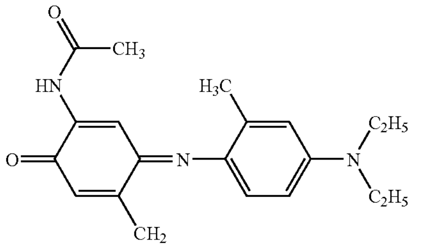

C2-3

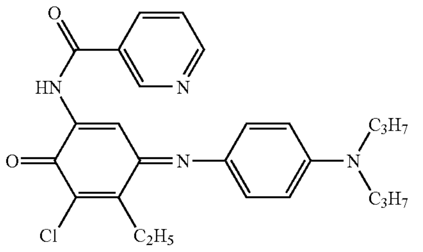

-continued

C2-4

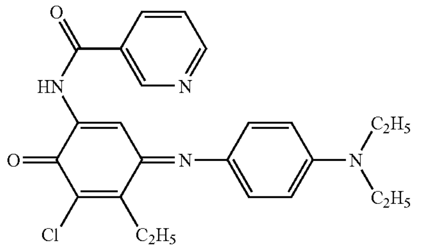

C2-5

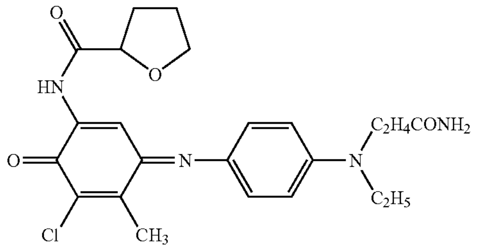

C2-6

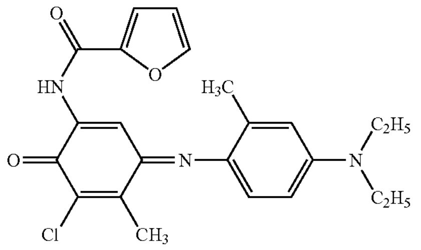

C2-7

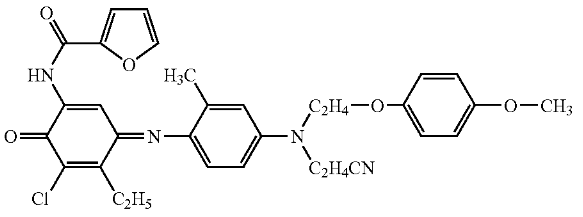

The dye represented by formula (C2) can be synthesized according to a usual manner.

As the binder resins that are contained in a dye ink in order to carry the above-described dyes, various materials are known and are able to be used in the present invention. Examples of the resins include modified cellulose resins such as ethyl cellulose, hydroxyethyl cellulose, ethyl hydroxycellulose, hydroxypropyl cellulose, ethylhydroxyethyl cellulose, methyl cellulose, cellulose acetate, cellulose acetate butyrate, cellulose acetate propionate, and cellulose nitrate; vinyl resins such as polyvinyl alcohol, polyvinyl acetate, polyvinyl butyrate, polyvinyl acetal, polyvinyl pyrroridone, polystyrene, and polyvinyl chloride; acrylic resins such as polyacrylonitrile, polyacrylic acid ester, and polyacrylamide; polyurethane resins; polyamide resins; polyester resins; polycarbonate resins; phenoxy resins; phenol resins; epoxy resins; and various kinds of elastomers. Each of these resins set forth above are preferably used. These resins may be used alone, or mixed together. In the case of polymers, various kinds of resin-constituting monomers may be copolymerized before use. It is also a preferable embodiment to bridge the polymers with various kinds of cross-linking agents.

Especially, modified cellulose resins and vinyl resins are preferably used. More preferably used are propionic acid-modified cellulose resins, polyvinyl butyral and polyvinyl acetal.

The dye ink can be prepared by dissolving or dispersing the above-described sublimation type dye and binder resin in a solvent. As the solvent that is used at the time of preparation, various kinds of known solvents can be used. Examples of the solvent include alcohol solvents such as methanol, ethanol, isopropyl alcohol, butanol, and isobutanol; ketone solvents such as methylethyl ketone, methylisobutyl ketone, and cyclohexanone; aromatic solvents such as toluene and xylene; and water. The solvents may be used singly, or as a mixture thereof.

In addition to the dye and the binder, various kinds of additives can be added to the heat transfer layer in order to improve various performances such as storage stability, traveling properties in a printer, and releasing properties after printing. As typical additives, organic or inorganic fine particles and waxes are preferably used.

As the organic particles, it is preferred to use fine particles of the resin exemplified by polyolefin resins such as polyethylene and polypropylene, fluorine resins, polyamide resins such as nylon resins, urethane resins, styrene-acryl series crosslinked resins, phenol resins, urea resins, melamine resins, polyimide resins, and benzoguanamine resins. Polyethylene fine particles are more preferably used. As the inorganic particles, it is preferred to use fine particles of, for example, calcium carbonate, silica, clay, talc, titanium oxide, magnesium hydroxide, or zinc oxide.

The organic or inorganic fine particles are preferably contained in a range of from 0.5 to 5% by mass, based on the binder resin of the heat transfer layer.

It is also a preferable embodiment that a wax is contained to the heat transfer layer in addition to the above-described sublimation type dye, binder, and organic or inorganic fine particles. As the wax that can be used, preferred are waxes derived from petroleum such as microcrystalline wax and paraffin wax; waxes derived from mineral such as montan wax; waxes derived from plants such as carnauba wax, Japan wax and candelilla wax; waxes derived from animals such as bees wax, spermaceti, insect wax and shellac wax; synthetic waxes such as Fischer-Tropsch wax, various kinds of low molecular polyethylene, aliphatic acid esters, aliphatic acid amides and silicone wax and partially modified waxes.

Further, another preferable embodiment is to contain resins such as silicone resin, fluorine resin, acrylic resin, cellulose resin, vinyl chloride-vinyl acetate copolymer, and pyroxylin in the dye layer ink. These waxes and resins may be contained in the heat transfer layer in the range of from 0.1% by mass to 10% by mass, preferably from 1% by mass to 3% by mass, based on the total solid content of the heat transfer layer.

Next, explained is a composition of the heat-sensitive transfer sheet that is used in the present invention.

The heat-sensitive transfer sheet of the present invention has at least one heat transfer layer containing at least one dye, which is disposed on one surface of the support, and the heat transfer layer is formed by applying a coating liquid for heat transfer layer.

(Support)

As the support, any one of previously known materials can be used, so far as such the material has both a heat resistance and a mechanical strength necessary to the requirements for the support. Specific examples of preferable supports include thin papers such as a glassine paper, a condenser paper, and a paraffin paper; high-temperature polyesters such as polyethyleneterephthalate, polyethylenenaphthalate, polybutyleneterephthalate, polyphenylene sulfide, polyetherketone, and polyethersulfone; stretched or unstreched films of plastics such as polypropylene, polycarbonate, cellulose acetate, polyethylene derivatives, poly(vinyl chloride), poly(vinylidene chloride), polystyrene, polyamide, polyimide, polymethylpentene, and ionomers; and laminates of these materials. Of these materials, polyester films are especially preferred. Stretched polyester films are most preferred. A thickness of the support can be properly determined in accordance with the material of the support so that the mechanical strength and the heat resistance become optimum. Specifically, it is preferred to use a support having a thickness of about 1 μm to about 100 μm, more preferably from about 2 μm to about 50 μm, and further preferably from about 3 μm to about 10 μm.

It is essential in the sublimation type heat-sensitive transfer recording system that only dye(s) having each hue that is contained in a heat-sensitive transfer sheet must be transferred at the time of printing. Transfer of a resin carrying the dye is not preferred. Therefore, a strong adhesion between a heat transfer layer and a support of the heat-sensitive transfer sheet is required. If the adhesion is weak, the heat transfer layer in itself adheres to a heat-sensitive image-receiving sheet, thereby resulting in deterioration of image quality of printing.

In the case of the support such as a polyester film exemplified above as a preferable support, wettability of the ink with each hue as described later is not so sufficient that adhesive strength occasionally lacks.

In order to deal with such the problem, it is preferred to employ a method of physically treating a surface of the support, and/or a method of forming an easy adhesion layer.

It is preferred to form an easy adhesion layer composed of a resin on a support and to dispose a heat transfer layer on the easy adhesion layer. As a resin for forming the easy adhesion layer, there can be used, for example, urethane resins, polyester resins, polypropylene resins, polyol resins, acrylic resins, and reaction products of these resins and isocyanate compounds. Examples of the isocyanate compound include diisocyanate compounds and triisocyanate compounds, each of which is conventionally used. A coating amount of the resin preferably ranges from 0.05 $g/m^2$ to 0.1 $g/m^2$.

In the production of the heat-sensitive transfer sheet, a support on which an easy adhesion layer is disposed in advance can be used, and a heat transfer layer can be formed on the said support.

(Coating Method for the Heat Transfer Layer)

The heat transfer layer that is used in the present invention is formed by applying a coating liquid (an ink) for the heat transfer layer on a support using a gravure printing method or other forming means, followed by drying. The ink for heat transfer layer is obtained by dissolving or dispersing a sublimation type dye, a binder resin and optionally used additives such as organic or inorganic finely divided powder and waxes in a proper solvent.

A thickness of the heat transfer layer is preferably in the range of from about 0.2 $g/m^2$ to about 5 $g/m^2$, more preferably from about 0.4 $g/m^2$ to about 2 $g/m^2$ at the dry state. A content of the sublimation type dye in the heat transfer layer is preferably in the range of from 5% by mass to 90% by mass, more preferably from about 10% by mass to about 70% by mass.

Figure 2:
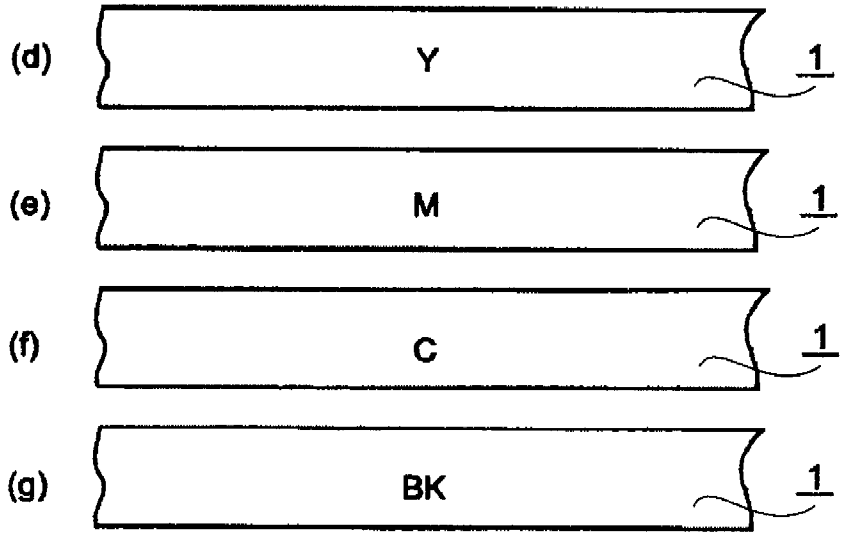
FIG. 2 is a plane figure showing one embodiment of the heat-sensitive transfer sheet in which each heat transfer layer (dye layer) is formed on a separate support, respectively.
Figure 3:
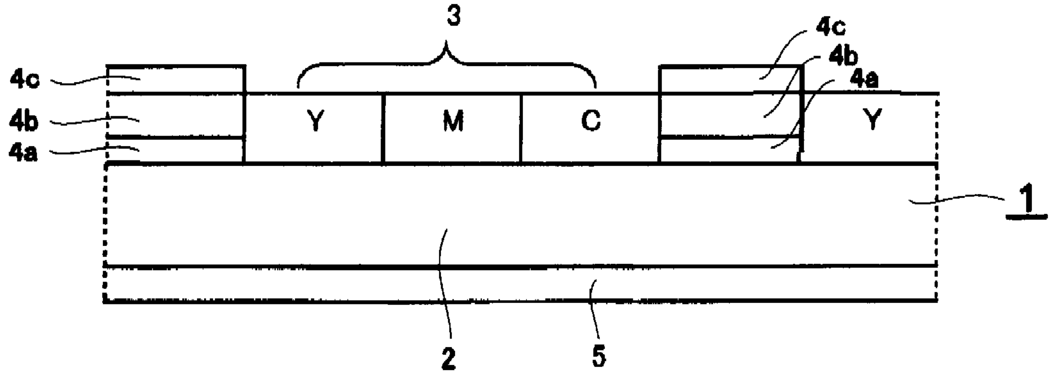
FIG. 3 is a cross-sectional view showing one embodiment of the heat-sensitive transfer sheet.

Next, the heat sensitive transfer sheet of the present invention is explained in detail referred to FIGS. 1 to 3, but the present invention is not intended to be limited thereto. The heat-sensitive transfer sheet of the present invention has at least one heat transfer layer containing at least one dye disposed on a support. It is preferred to dispose heat transfer layers; a yellow heat transfer layer Y, a magenta heat transfer layer M, and a cyan heat transfer layer C; with each hue in area order on the same support as shown in FIG. 1 (*a*). In addition, a black layer BK may be further disposed as shown in FIG. 1 (*b*). Further, as shown in FIG. 1 (C), a transferable protective layer laminate 4 may be disposed between the heat transfer layers constituted of Y, M, C, and BK as described later. However, arrangement of the heat transfer layers with each hue in the present invention is not limited to the above, but any arrangement can be employed in accordance with necessity. It is preferred that the yellow heat transfer layer, the magenta heat transfer layer, and the cyan heat transfer layer are formed in this area order on the support.

Further, a releasing property between a heat-sensitive transfer sheet and a heat-sensitive image-receiving sheet and the like are changed depending on the printing order. Therefore, it is also a preferable embodiment to change a content of additives for use in each of the heat transfer layers in response to the change of releasing properties. For example, as a heat transfer layer is used later for printing, it is possible to increase a content of the releasing agent in the heat transfer layer.

It is also possible to form each of heat transfer layers with each hue on a separate support, in place of disposing the heat transfer layers with each hue on the same support. (FIG. 2)

In the heat-sensitive transfer sheet that is used in the present invention, the heat transfer layer (the dye layer) and the protective layer may have a single layer structure, or a multilayer structure such as a double layer structure and a three or more layer structure. Further, as the heat transfer layers, a single layer structure and a multilayer structure may coexist in the transfer sheet. FIG. 3 shows one example of such the composite layer structure. Each of the yellow heat transfer layer, the magenta heat transfer layer and the cyan heat transfer layer has a single layer structure.

A total thickness of the heat transfer layers having a multilayer structure is preferably in the range of from about 0.2 $g/m^2$ to about 5 $g/m^2$, more preferably from about 0.4 $g/m^2$ to about 2 $g/m^2$. A thickness of one constituting layer of the heat transfer layer is preferably in the range of from about 0.2 $g/m^2$ to about 2 $g/m^2$. A total content of the sublimation type dye in the total heat transfer layers is preferably in the range of from 5% by mass to 90% by mass, more preferably from about 10% by mass to about 70% by mass.

(Transferable Protective Layer Laminate)

It is a preferable embodiment in the present invention to dispose a transferable protective layer laminate in the heat-sensitive transfer sheet. The transferable protective layer laminate is used to protect a heat-sensitive transferred image by forming a protective layer composed of a transparent resin on the heat-sensitive transferred image by heat-sensitive transfer, thereby to improve durability such as scratch resistance, light-fastness, and resistance to weather. Under the conditions that a dye transferred to the image-receiving sheet is left to be exposed at the surface of the image-receiving sheet, image durability, such as light-fastness, scratch resistance, and chemical resistance, are unsatisfactory. Therefore, it is preferred to dispose the transparent protective layer. As a preferable embodiment of the heat-sensitive transfer sheet 1 of the present invention exemplified in FIG. 3, a back layer 5 can be formed on one surface of a support 2, and a transferable protective layer laminate 4 which is constituted a releasing layer 4*a*, a protective layer 4*b* and an adhesive layer 4*c* in this order from the support, can be formed on other surface of the support 2 between ink layers 3 of a yellow heat transfer layer Y, a magenta heat transfer layer M, and a cyan heat transfer layer C. The protective layer 4*b* may be formed by plural layers. In the case where the protective layer 4*b* also has functions of other layers, the releasing layer 4*b* and the adhesive layer 4*c* can be omitted. It is also possible to use a support 2 on which an easy adhesive layer has already been formed.

As a resin forming the protective layer, preferred are resins that are excellent in scratch resistance, chemical resistance, transparency and hardness. Examples of the resin include polyester resins polystyrene resins, acrylic resins, polyurethane resins, acrylic urethane resins, silicone-modified resins of the above-described resins, mixtures of these resins, ionizing radiation-curable resins, and ultraviolet-shielding resins. In addition, there can be used various kinds of resins that are conventionally known as a resin for forming protective layer. Further, in order to give ultraviolet absorbing capacity, or to improve coat separation properties at the time of transfer, gloss, brightness, or the like, it is also preferred to add ultraviolet absorbing agents, antioxidants, fluorescent brightening agents, organic fillers and/or inorganic fillers in accordance with necessity.

As the acrylic resin that can be used in the present invention, it is preferable that polymers derived from at least one monomer selected from conventionally known acrylate monomers and methacrylate monomers. Other monomers than these acrylate-series monomers, such as styrene and acrylonitrile may be co-polymerized with said acryl-series monomers. A preferred monomer is methyl methacrylate. It is preferred that methyl methacrylate is contained in terms of preparation mass ratio of 50 mass % or more in the polymer.

As the polyester resin that can be used in the present invention, there can be used conventionally known saturated polyester resins. Examples of an acid component of the polyester resin used in the present invention, include aromatic dicarboxylic acids such as terephtharic acid, isophtharic acid, orthophtharic acid, 2,6-naphthalene dicarboxylic acid, teterahydrophtharic acid, hexahydrophtharic acid, hexahydroisophtharic acid, and hexahydroterephtharic acid; aliphatic dicarboxylic acids such as succinic acid, adipic acid, azelaic acid, sebacic acid, dodecanedionic acid, and dimmer acid; and alicyclic dicarboxylic acids such as cyclohexane dicarboxylic acid, tricyclodecane dicarboxylic acid, and decalin dicarboxylic acid. Methyl-esterified derivatives of these compounds may be also used. Further, acid anhydrides of these compounds may be also used.

Further, if necessary, the above-mentioned compounds may be also used together with other compounds such as p-(hydroxyethoxy)benzoic acid, hydroxypivalic acid, γ-butyryllactone, ε-caprolactone, fumaric acid, maleic acid, maleic acid anhydrate, itaconic acid, and citraconic acid. Further, if necessary, the above-mentioned compounds may be also used together with tri- or more multi-functional polycarboxylic acids such as tri and tetra carboxylic acids (e.g., trimellitic acid, pyromellitic acid), in so far as the proportion of the tri- or more multi-functional polycarboxylic acids is 10 mol % or less of the entire carboxylic acid components. Particularly preferred is the composition that contains at least one acid component which is an aromatic carboxylic acid a part of which is substituted with a sulfonic acid or a salt thereof, in one molecular chain. It is preferable to conduct polymerization with setting the upper limit of a substitution amount of the sulfonic acid (or salt thereof) within a range that ensures solubility to organic solvents, since this would make it possible to use the polyester resin with mixing with other organic-solvent-soluble additives or resins. As a preferable aromatic dicarboxylic acid substituted with the sulfonic acid (or salt thereof), there are exemplified sulfoterephtharic acid, 5-sulfoisophtharic acid, 4-sulfophtharic acid, 4-sulfonaphthalene-2,7-dicarboxylic acid, 5-(4-sulfophenoxy) isophtharic acid, ammonium salts of these acids, and metal salts of these acids wherein examples of the metal include lithium, potassium, magnesium, calcium, copper, and iron. Of these acids, sodium salt of 5-sulfoisophthalic acid is especially preferred.

Examples of a polyol component that is another component of the polyester resin that can be used in the present invention, include ethylene glycol, 1,2-propylene glycol, 1,3-propane diol, 1,4-butane diol, neopentyl glycol, 1,5-pentane diol, 1,6-hexane diol, 3-methyl-1,5-pentane diol, 1,9-nonane diol, 2-ethyl-2-butylpropane diol, hydroxypivalic acid neopentylglycol ester, dimethylolheptane, and 2,2,4-trimethyl-1,3-pentane diol. If necessary, there can be also used diethylene glycol, triethylene glycol, dipropylene glycol, polyethylene glycol, polypropylene glycol, polytetramethylene glycol, ethylene oxide adducts of neopentyl glycol, and propylene oxide adducts of neopentyl glycol.

As aromatic-group-containing glycols, there are paraxylene glycol, metaxylene glycol, orthoxylene glycol, 1,4-phenylene glycol, ethylene oxide adduct of 1,4-phenylene glycol, bisphenol A, and glycols obtained by adding from 1 to several moles of ethylene oxide or propylene oxide to the two phenolic hydroxyl groups of bisphenols, such as ethylene oxide adducts or propylene oxide adducts of bisphenol A. Examples of alicyclic diol components include tricyclodecane diol, tricyclodecane dimethylol, tricyclodecane dimethanol (TCD-M), cyclohexane diol, 1,4-cyclohexane dimethanol, hydrogenated bisphenol A, ethylene oxide adducts or propylene oxide adducts of hydrogenated bisphenol A. As the above-described polyester resin, a preferable glass transition temperature ranges from 50° C. to 120° C., and a preferable molecular weight ranges from 2,000 to 40,000. A molecular weight ranging from 4,000 to 20,000 is more preferred, because so-called “foil-off” properties at the time of transfer of the protective layer are improved.

The use of the ionizing radiation-curable resins enables to obtain a protective layer that is excellent in both resistance to plasticizers and scratch resistance in particular. As an example, there are resins that are obtained by cross-linking and curing radical polymerizable polymers or oligomers upon irradiation of ionizing radiation. At this moment, polymerization and cross-link may be performed by adding a photopolymerization initiator in accordance with necessity, followed by irradiation of electron beam or ultraviolet ray. Further, known ionizing radiation-curable resins can be used.

It is also a preferable embodiment that a protective layer contains ultraviolet-absorbing agents and/or ultraviolet-shielding resins in order to give light-fastness to the printed matter.

With respect to these ultraviolet-absorbing agents, it is preferred to use a combination of ultraviolet-absorbing agents having a different system from each other so that an effective ultraviolet-absorbing wavelength region can be covered in accordance with characteristics of the dye that is used for image formation. With respect to the non-reactive ultraviolet-absorbing agents, a mixture of ultraviolet-absorbing agents having a different structure from each other is preferably used in order to prevent the ultraviolet-absorbing agent from precipitation.

Examples of the organic fillers and/or the inorganic fillers include polyethylene wax, bis-amide, nylon, acrylic resin, cross-linked polystyrene, silicone resin, silicone rubber, talc, calcium carbonate, titanium oxide, alumina, and silica fine particles such as micro silica and colloidal silica. In the heat-sensitive transfer sheet according to the present invention, not only these exemplified materials, but also known other materials can be used preferably.

With respect to the organic fillers and/or the inorganic fillers, it is preferred that not only a particle size of the fillers is 10 μm or less, preferably in the range of from 0.1 μm to 3 μm but also the fillers have good sliding properties and high transparency. An addition amount of the filler is preferably a degree to which transparency is kept at the time of transfer. Specifically, the addition amount is preferably in the range of from 0 to 100 mass parts, based on 100 mass parts of the resin.

Depending on the kind of resin for forming protective layer, the protective layer is formed by the same method as the method of forming the above-described dye layer A thickness of the protective layer is preferably in the range of from about 0.5 μm to about 10 μm.

(Release Layer)

In the case where a protective layer is difficult to separate from a support at the time of transfer, it is also a preferable embodiment to form a release layer 4*a* between the support and the protective layer. The release layer can be formed by the steps of preparing a coating liquid composed of a material that is excellent in release properties, such as waxes, silicone wax, silicone resin, and fluorine resin; a relatively high melting point resin that does not melt by heat from a thermal head, such as cellulose-based resin, acrylic resin, polyurethane resin, polyvinyl acetal resin, acrylic vinyl ether-based resin, maleic acid anhydride resin, silicone resin, fluorine resin; or the above-described resins containing a heat release agent such as waxes, and then coating the coating liquid according to a previously known coating method such as gravure coat and gravure reverse coat, followed by drying. Of these resins, preferred are acryl resins obtained by polymerizing acrylic acid or methacrylic acid singly, or copolymerizing acrylic acid or methacrylic acid with other monomers. These acrylic resins are excellent in adhesion to the substrate sheet, and release properties from the protective layer. Further, these resins may be used alone or in a combination of these resins.

The release layer remains at the side of a support at the time of printing (transfer).

A thickness of the release layer is preferably in the range of from about 0.5 μm to about 10 μm. Various kinds of particles are incorporated in the release layer, or alternatively a surface of the release layer at the protective layer-coating side is subjected to a matt treatment, thereby to mat the surface of the release layer. Resultantly, the surface of the image-receiving sheet after printing can be mat-finished (flatten).

A separation layer may be formed between a transferable protective layer and a release layer. The separation layer is transferred together with the protective layer. After transfer, the separation layer becomes the outermost layer of the printed image-receiving sheet. Therefore, the separation layer is composed of a resin that is excellent in transparency, abrasion resistance and chemical resistance. As the resin, there are exemplified acrylic resin, epoxy resin, polyester resin, and styrene resin. Further, additives such as fillers and waxes may be added to the separation layer.

(Adhesive Layer)

It is preferred to dispose an adhesive layer on a protective layer as the outermost layer of the transferable protective layer laminate. Thereby, transfer properties of the protective layer are improved. In the adhesive layer, there can be used known pressure-sensitive adhesives, heat-sensitive adhesives, and thermoplastic resins. Specific examples of the adhesives include resins that are excellent in adhesiveness at the time of heating, such as polyester resin, vinyl chloride-vinyl acetate copolymer resin, acrylic resin, acrylic material-ultraviolet absorbing agent copolymer resin, ultraviolet absorbing resin, butyral resin, epoxy resin, polyamide resin, vinyl chloride resin, and polycarbonate resin. Of these resins, preferred are thermoplastic resins having a glass transition temperature of from 40° C. to 80° C.

If Tg is less than 40° C., adhesiveness between the coated image and a transparent protective layer tends to become insufficient. On the other hand, if Tg is more than 80° C., transfer properties of the transparent protective layer tends to become insufficient.

Further, especially preferred are polyvinylchloride resins, polyvinyl acetate resins, and vinyl chloride-vinyl acetate copolymer resins, each of which has a polymerization degree of from 50 to 300, more preferably from 50 to 250.

As the ultraviolet absorbing resin, there can be used resins such as products that are obtained by reaction and bonding of a thermoplastic resin or an ionizing radiation curable resin with a reactive ultraviolet absorbing agent.

The adhesive layer may contain ultraviolet absorbing agents as described above. Further, it is optional to add other additives such as coloring pigments, white pigments, extender pigments, fillers, antistatic agents, antioxidants, and fluorescent whitening agents in accordance with necessity. The adhesion layer is formed by coating and then drying a coating liquid containing the above-described resin for construction of the adhesion layer, and the above-described additives that are optionally added to the adhesion layer, so that a thickness of the adhesion layer preferably becomes a range of from 0.5 μm to about 10 μm at the dry state. A dry thickness of the adhesive layer preferably ranges from 0.5 μm to 5 μm, more preferably from 0.5 μm to 3 μm.

(Ultraviolet Absorber)

The ultraviolet absorber preferably absorbs light at wavelengths in the ultraviolet region, and the absorption edge of the absorption of the ultraviolet absorber is preferably out of the visible region. Specifically, after addition of the ultraviolet absorbing agent to a receptor layer so as to form a heat-sensitive transfer image-receiving sheet, it is preferred that the resultant heat-sensitive transfer image-receiving sheet has the maximum absorption in the wavelength region of from 330 nm to 370 nm and has an absorption density Abs of 0.8 or more at the maximum absorption wavelength, more preferably has an absorption density Abs of 0.5 or more at 380 nm. Also, the heat-sensitive transfer image-receiving sheet has an absorption density of, preferably, Abs 0.1 or less at 400 nm. If the absorption density at a wavelength range exceeding 400 nm is high, it is not preferable because an image is made yellowish. As the ultraviolet absorbing agents, use can be made of conventionally known inorganic or organic ultraviolet absorbing agents. As the organic ultraviolet absorbing agents, use can be made of non-reactive ultraviolet absorbing agents such as salicylate-series, benzophenone-series, benzotriazole-series, triazine-series, substituted acrylonitrile-series, nickel chelate-series, and hindered amine-series ultraviolet absorbing agents; and copolymers or graft polymers of thermoplastic resins (e.g., acrylic resins) and activated products obtained by introducing to the above-described non-reactive ultraviolet absorbing agents; addition-polymerizable double bonds originated from a vinyl group, an acryroyl group, a methaeryroyl group, or the like, or alternatively by introducing thereto other types of groups such as an alcoholic hydroxyl group, an amino group, a carboxyl group, an epoxy group, and an isocyanate group. Of these ultraviolet absorbing agents, preferred are organic ultraviolet absorbing agents as described below, especially benzophenone-series, benzotriazole-series, and triazine-series ultraviolet absorbing agents.

In addition, disclosed is a method of obtaining ultraviolet-shielding resin by the steps of dissolving ultraviolet absorbing agents in a monomer or oligomer of the resin that is used in the protective layer, and then polymerizing the monomer or oligomer (JP-A-2006-21333). In this case, it is preferred that the ultraviolet absorbing agents are not reactive.

Examples of the articles that have been sold as ultraviolet absorbing agents on the market include Tinuvin-P (a product of Ciba-Geigy), JF-77 (a product of JOHOKU CHEMICAL), SEA SOUP 701 (a product of SHIROISHI CALCIUM), SUMI SOUP 200 (a product of Sumitomo Chemical), BIO SOUP 520 (a product of KYODO CHEMICAL), and ADK STAB LA-32 (a product of ADEKA).

In the present invention, the ultraviolet absorber may be made to have a higher molecular weight. In this case, the ultraviolet absorber has a mass average molecular weight of preferably 10,000 or more, and more preferably 100,000 or more. As a means of obtaining a higher-molecular weight ultraviolet absorber, it is preferable to graft an ultraviolet absorber on a polymer. The polymer as the principal chain preferably has a polymer skeleton less capable of being dyed than the receptor polymer to be used together. Also, when the polymer is used to form a film, the film preferably has sufficient film strength. The graft ratio of the ultraviolet absorber to the polymer principal chain is preferably 5 to 20% by mass and more preferably 8 to 15% by mass.

Also, the polymer containing a unit having ultraviolet absorbing ability (ultraviolet absorber unit) may be made to be used in a form of a latex. When the polymer is made to be used in a form of a latex, an aqueous dispersion-system coating solution may be used in application and coating to form the receptor layer, and this enables reduction of production cost. As a method of making the latex polymer (or making the polymer latex-wise), a method described in, for example, Japanese Patent No. 3450339 may be used. As the ultraviolet absorber to be used in a form of a latex, the following commercially available ultraviolet absorbers may be used which include ULS-700, ULS-1700, ULS-1383MA, ULS-1635 MH, XL-7016, ULS-933LP, and ULS-935LH, manufactured by Ipposha Oil Industries Co., Ltd.; and New Coat UVA-1025W, New Coat UVA-204W, and New Coat UVA-4512M, manufactured by Shin-Nakamura Chemical Co., Ltd. (all of these names are trade names).

In the case of using the polymer containing a unit having ultraviolet absorbing ability in a form of a latex, it may be mixed with a latex of the receptor polymer capable of being dyed, and the resulting mixture is coated. By doing so, a receptor layer, in which the ultraviolet absorber is homogeneously dispersed, can be formed.

The addition amount of the polymer containing a unit having ultraviolet absorbing ability or its latex is preferably 5 to 50 parts by mass, and more preferably 10 to 30 parts by mass, to 100 parts by mass of the receptor polymer capable of being dyed or its latex to be used to form the receptor layer.

The ultraviolet absorber may be either an organic compound or an inorganic compound.

In the case of the organic ultraviolet absorber, those represented by any one of the following formulae (1) to (8) are preferable.

The ultraviolet absorber represented by any one of the following formulae (1) to (8) is explained below.

Formula (1)

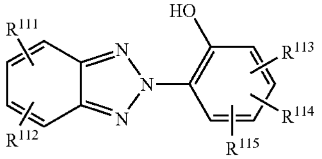

In formula (1), $R^{111}$, $R^{112}$, $R^{113}$, $R^{114}$, and $R^{115}$ each independently represent a hydrogen atom, a halogen atom, an alkyl group (including a cycloalkyl group and a bicycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an aryl- or heterocyclic-azo group, an imido group, a phosphino group, a phosphinyl group, a phosphinyloxy group, a phosphinylamino group, or a silyl group.

Formula (2)

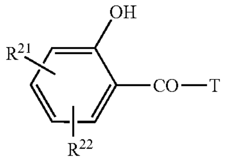

In formula (2), $R^{21}$ and $R^{22}$ each independently represent a hydrogen atom, a halogen atom, an alkyl group (including a cycloalkyl group and a bicycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an aryl- or heterocyclic-azo group, an imido group, a phosphino group, a phosphinyl group, a phosphinyloxy group, a phosphinylamino group, or a silyl group. T represents an aryl group, a heterocyclic group, or an aryloxy group. T preferably represents an aryl group.

Formula (3)

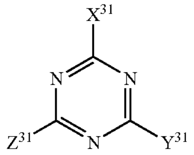

In the formula (3), $X^{31}$, $Y^{31}$ and $Z^{31}$ each independently represent a substituted or unsubstituted alkyl group, aryl group, alkoxy group, aryloxy group, alkylthio group, arylthio group or heterocyclic group. At least one of $X^{31}$, $Y^{31}$ and $Z^{31}$ represents a group represented by the following Formula (a).

Formula (a)

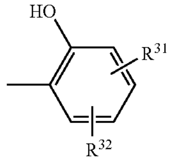

In formula (a), $R^{31}$ and $R^{32}$ each independently represent a hydrogen atom, a halogen atom, an alkyl group (including a cycloalkyl group and a bicycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an aryl- or heterocyclic-azo group, an imido group, a phosphino group, a phosphinyl group, a phosphinyloxy group, a phosphinylamino group, or a silyl group. Also, the neighboring $R^{31}$ and $R^{32}$ may be combined to form a ring.

Formula (4)

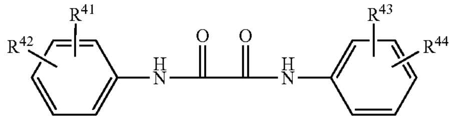

In formula (4), $R^{41}$, $R^{42}$, $R^{43}$, and $R^{44}$ each independently represent a hydrogen atom, a halogen atom, an alkyl group (including a cycloalkyl group and a bicycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an aryl- or heterocyclic-azo group, an imido group, a phosphino group, a phosphinyl group, a phosphinyloxy group, a phosphinylamino group, or a silyl group.

Formula (5)

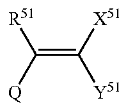

In the formula (5), Q represents an aryl group or a five- or six-membered heterocyclic group, $R^{51}$ represents a hydrogen atom or an alkyl group, $X^{51}$ and $Y^{51}$ each independently represent a cyano group, $-COOR^{52}$, $-CONR^{52}R^{53}$, $-COR^{52}$, $-SO_2OR^{52}$ or $-SO_2NR^{52}R^{53}$, wherein $R^{52}$ and $R^{53}$ each independently represent a hydrogen atom, an alkyl group or an aryl group. One among $R^{52}$ and $R^{53}$ preferably represents a hydrogen atom. Also, $X^{51}$ and $Y^{51}$ may be combined to form a five- or six-membered ring. When $X^{51}$ and $Y^{51}$ are respectively a carboxyl group, they may respectively have a salt form.

Formula (6)

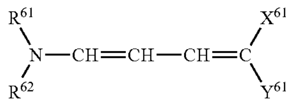

In the formula (6), $R^{61}$ and $R^{62}$ each independently represent a hydrogen atom, an alkyl group or an aryl group, or nonmetal atomic groups which are combined with each other to form a five- or six-membered ring. Also, any one of $R^{61}$ and $R^{62}$ may be combined with a methine group adjacent to the nitrogen atom to form a five- or six-membered ring. $X^{61}$ and $Y^{61}$ may be the same or different and have the same meanings as $X^{51}$ and $Y^{51}$ in formula (5).

Formula (7)

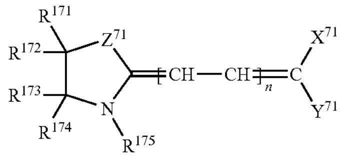

In the formula (7), $R^{171}$, $R^{172}$, $R^{173}$, and $R^{174}$ may be the same or different, and each independently represent a hydrogen atom, an alkyl group or an aryl group, provided that $R^{171}$ and $R^{174}$ may be combined with each other to form a double bond, wherein when $R^{171}$ and $R^{174}$ are combined with each other to form a double bond, $R^{172}$ and $R^{173}$ may be combined with each other to form a benzene ring or a naphthalene ring. $R^{175}$ represents an alkyl group or an aryl group, $Z^{71}$ represents an oxygen atom, a sulfur atom, a methylene group, an ethylene group, $>N-R^{176}$ or $>C(R^{177})(R^{178})$, where $R^{176}$ represents an alkyl group or an aryl group, and $R^{177}$ and $R^{178}$ may be the same or different and respectively represent a hydrogen atom or an alkyl group. $X^{71}$ and $Y^{71}$ may be the same or different, and have the same meanings as $X^{51}$ and $Y^{51}$ in the formula (5). n denotes 0 or 1.

Formula (8)

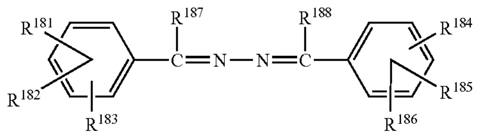

In formula (8), $R^{181}$ to $R^{186}$ each independently represent a hydrogen atom, a halogen atom, an alkyl group (including a cycloalkyl group and a bicycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an aryl- or heterocyclic-azo group, an imido group, a phosphino group, a phosphinyl group, a phosphinyloxy group, a phosphinylamino group, or a silyl group; $R^{187}$ and $R^{188}$ may be the same or different and each represent a hydrogen atom, an alkyl group, or an aryl group, and $R^{187}$ and $R^{188}$ may bond together to form a 5- or 6-membered ring.

In the formulae (1) to (8) and (a), each substituent in, for example, groups having an alkyl part, aryl part or heterocyclic part may be substituted with the following substituents. In the explanations of each group described in the formulae (1) to (8) and (a), specific examples include exemplified groups of the corresponding groups among the groups shown below.

Such groups will be explained and exemplified hereinbelow.

Specific examples include: a halogen atom (e.g. a chlorine atom, a bromine atom, or an iodine atom); an alkyl group [which represents a substituted or unsubstituted linear, branched, or cyclic alkyl group, and which includes an alkyl group (preferably an alkyl group having 1 to 30 carbon atoms, e.g. a methyl group, an ethyl group, an n-propyl group, an isopropyl group, a t-butyl group, an n-octyl group, an eicosyl group, a 2-chloroethyl group, a 2-cyanoethyl group, or a 2-ethylhexyl group), a cycloalkyl group (preferably a substituted or unsubstituted cycloalkyl group having 3 to 30 carbon atoms, e.g. a cyclohexyl group, a cyclopentyl group, or a 4-n-dodecylcyclohexyl group), a bicycloalkyl group (preferably a substituted or unsubstituted bicycloalkyl group having 5 to 30 carbon atoms, i.e. a monovalent group obtained by removing one hydrogen atom from a bicycloalkane having 5 to 30 carbon atoms, e.g. a bicyclo[1,2,2]heptan-2-yl group or a bicyclo[2,2,2]octan-3-yl group), and a tricyclo or higher structure having three or more ring structures; and an alkyl group in substituents described below (e.g. an alkyl group in an alkylthio group) represents such an alkyl group of the above concept]; an alkenyl group [which represents a substituted or unsubstituted linear, branched, or cyclic alkenyl group, and which includes an alkenyl group (preferably a substituted or unsubstituted alkenyl group having 2 to 30 carbon atoms, e.g. a vinyl group, an allyl group, a prenyl group, a geranyl group, or an oleyl group), a cycloalkenyl group (preferably a substituted or unsubstituted cycloalkenyl group having 3 to 30 carbon atoms, i.e. a monovalent group obtained by removing one hydrogen atom from a cycloalkene having 3 to 30 carbon atoms, e.g. a 2-cyclopenten-1-yl group or a 2-cyclohexen-1-yl group), and a bicycloalkenyl group (which represents a substituted or unsubstituted bicycloalkenyl group, preferably a substituted or unsubstituted bicycloalkenyl group having 5 to 30 carbon atoms, i.e. a monovalent group obtained by removing one hydrogen atom from a bicycloalkene having one double bond, e.g. a bicyclo[2,2,1]hept-2-en-1-yl group or a bicyclo[2,2,2]oct-2-en-4-yl group)]; an alkynyl group (preferably a substituted or unsubstituted alkynyl group having 2 to 30 carbon atoms, e.g. an ethynyl group, a propargyl group, or a trimethylsilylethynyl group); an aryl group (preferably a substituted or unsubstituted aryl group having 6 to 30 carbon atoms, e.g. a phenyl group, a p-tolyl group, a naphthyl group, an m-chlorophenyl group, or an o-hexadecanoylaminophenyl group); a heterocyclic group (preferably a monovalent group obtained by removing one hydrogen atom from a substituted or unsubstituted 5- or 6-membered aromatic or nonaromatic heterocyclic compound; more preferably a 5- or 6-membered aromatic heterocyclic group having 3 to 30 carbon atoms, e.g. a 2-furyl group, a 2-thienyl group, a 2-pyrimidinyl group, a 2-benzothiazolyl group); a cyano group; a hydroxyl group; a nitro group; a carboxyl group; an alkoxy group (preferably a substituted or unsubstituted alkoxy group having 1 to 30 carbon atoms, e.g. a methoxy group, an ethoxy group, an isopropoxy group, a t-butoxy group, an n-octyloxy group, or a 2-methoxyethoxy group); an aryloxy group (preferably a substituted or unsubstituted aryloxy group having 6 to 30 carbon atoms, e.g. a phenoxy group, a 2-methylphenoxy group, a 4-t-butylphenoxy group, a 3-nitrophenoxy group, or a 2-tetradecanoylaminophenoxy group); a silyloxy group (preferably a silyloxy group having 3 to 20 carbon atoms, e.g. a trimethylsilyloxy group or a t-butyldimethylsilyloxy group); a heterocyclic oxy group (preferably a substituted or unsubstituted heterocyclic oxy group having 2 to 30 carbon atoms, e.g. a 1-phenyltetrazol-5-oxy group or a 2-tetrahydropyranyloxy group); an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, e.g. a formyloxy group, an acetyloxy group, a pivaloyloxy group, a stearoyloxy group, a benzoyloxy group, or a p-methoxyphenylcarbonyloxy group); a carbamoyloxy group (preferably a substituted or unsubstituted carbamoyloxy group having 1 to 30 carbon atoms, e.g. an N,N-dimethylcarbamoyloxy group, an N,N-diethylcarbamoyloxy group, a morpholinocarbonyloxy group, an N,N-di-n-octylaminocarbonyloxy group, or an N-n-octylcarbamoyloxy group); an alkoxycarbonyloxy group (preferably a substituted or unsubstituted alkoxycarbonyloxy group having 2 to 30 carbon atoms, e.g. a methoxycarbonyloxy group, an ethoxycarbonyloxy group, a t-butoxycarbonyloxy group, or an n-octylcarbonyloxy group); an aryloxycarbonyloxy group (preferably a substituted or unsubstituted aryloxycarbonyloxy group having 7 to 30 carbon atoms, e.g. a phenoxycarbonyloxy group, a p-methoxyphenoxycarbonyloxy group, or a p-n-hexadecyloxyphenoxycarbonyloxy group); an amino group (preferably an amino group, a substituted or unsubstituted alkylamino group having 1 to 30 carbon atoms, or a substituted or unsubstituted anilino group having 6 to 30 carbon atoms, e.g. an amino group, a methylamino group, a dimethylamino group, an anilino group, an N-methyl-anilino group, or a diphenylamino group); an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms, e.g. a formylamino group, an acetylamino group, a pivaloylamino group, a lauroylamino group, a benzoylamino group, or a 3,4,5-tri-n-octyloxyphenylcarbonylamino group); an aminocarbonylamino group (preferably a substituted or unsubstituted aminocarbonylamino group having 1 to 30 carbon atoms, e.g. a carbamoylamino group, an N,N-dimethylaminocarbonylamino group, an N,N-diethylaminocarbonylamino group, or a morpholinocarbonylamino group); an alkoxycarbonylamino group (preferably a substituted or unsubstituted alkoxycarbonylamino group having 2 to 30 carbon atoms, e.g. a methoxycarbonylamino group, an ethoxycarbonylamino group, a t-butoxycarbonylamino group, an n-octadecyloxycarbonylamino group, or an N-methyl-methoxycarbonylamino group); an aryloxycarbonylamino group (preferably a substituted or unsubstituted aryloxycarbonylamino group having 7 to 30 carbon atoms, e.g. a phenoxycarbonylamino group, a p-chlorophenoxycarbonylamino group, or an m-n-octyloxyphenoxycarbonylamino group); a sulfamoylamino group (preferably a substituted or unsubstituted sulfamoylamino group having 0 to 30 carbon atoms, e.g. a sulfamoylamino group, an N,N-dimethylaminosulfonylamino group, or an N-n-octylaminosulfonylamino group); an alkyl- or aryl-sulfonylamino group (preferably a substituted or unsubstituted alkylsulfonylamino group having 1 to 30 carbon atoms, or a substituted or unsubstituted arylsulfonylamino group having 6 to 30 carbon atoms, e.g. a methylsulfonylamino group, a butylsulfonylamino group, a phenylsulfonylamino group, a 2,3,5-trichlorophenylsulfonylamino group, or a p-methylphenylsulfonylamino group); a mercapto group; an alkylthio group (preferably a substituted or unsubstituted alkylthio group having 1 to 30 carbon atoms, e.g. a methylthio group, an ethylthio group, or an n-hexadecylthio group); an arylthio group (preferably a substituted or unsubstituted arylthio group having 6 to 30 carbon atoms, e.g. a phenylthio group, a p-chlorophenylthio group, or an m-methoxyphenylthio group); a heterocyclic thio group (preferably a substituted or unsubstituted heterocyclic thio group having 2 to 30 carbon atoms, e.g. a 2-benzothiazolylthio group or a 1-phenyltetrazol-5-ylthio group); a sulfamoyl group (preferably a substituted or unsubstituted sulfamoyl group having 0 to 30 carbon atoms, e.g. an N-ethylsulfamoyl group, an N-(3-dodecyloxypropyl)sulfamoyl group, an N,N-dimethylsulfamoyl group, an N-acetylsulfamoyl group, an N-benzoylsulfamoyl group, or an N—(N'-phenylcarbamoyl)sulfamoyl group); a sulfo group; an alkyl- or aryl-sulfinyl group (preferably a substituted or unsubstituted alkylsulfinyl group having 1 to 30 carbon atoms, or a substituted or unsubstituted arylsulfinyl group having 6 to 30 carbon atoms, e.g. a methylsulfinyl group, an ethylsulfinyl group, a phenylsulfinyl group, or a p-methylphenylsulfinyl group); an alkyl- or aryl-sulfonyl group (preferably a substituted or unsubstituted alkylsulfonyl group having 1 to 30 carbon atoms, or a substituted or unsubstituted arylsulfonyl group having 6 to 30 carbon atoms, e.g. a methylsulfonyl group, an ethylsulfonyl group, a phenylsulfonyl group, or a p-methylphenylsulfonyl group); an acyl group (preferably a formyl group, a substituted or unsubstituted alkylcarbonyl group having 2 to 30 carbon atoms, a substituted or unsubstituted arylcarbonyl group having 7 to 30 carbon atoms, or a substituted or unsubstituted heterocyclic carbonyl group having 4 to 30 carbon atoms, which is bonded to said carbonyl group through a carbon atom, e.g. an acetyl group, a pivaloyl group, a 2-chloroacetyl group, a stearoyl group, a benzoyl group, a p-n-octyloxyphenylcarbonyl group, a 2-pyridylcarbonyl group, or a 2-furylcarbonyl group); an aryloxycarbonyl group (preferably a substituted or unsubstituted aryloxycarbonyl group having 7 to 30 carbon atoms, e.g. a phenoxycarbonyl group, an o-chlorophenoxycarbonyl group, an m-nitrophenoxycarbonyl group, or a p-t-butylphenoxycarbonyl group); an alkoxycarbonyl group (preferably a substituted or unsubstituted alkoxycarbonyl group having 2 to 30 carbon atoms, e.g. a methoxycarbonyl group, an ethoxycarbonyl group, a t-butoxycarbonyl group, or an n-octadecyloxycarbonyl group); a carbamoyl group (preferably a substituted or unsubstituted carbamoyl group having 1 to 30 carbon atoms, e.g. a carbamoyl group, an N-methylcarbamoyl group, an N,N-dimethylcarbamoyl group, an N,N-di-n-octylcarbamoyl group, or an N-(methylsulfonyl)carbamoyl group); an aryl- or heterocyclic-azo group (preferably a substituted or unsubstituted aryl azo group having 6 to 30 carbon atoms, or a substituted or unsubstituted heterocyclic azo group having 3 to 30 carbon atoms, e.g. a phenylazo group, a p-chlorophenylazo group, or a 5-ethylthio-1,3,4-thiadiazol-2-ylazo group); an imido group (preferably an N-succinimido group or an N-phthalimido group); a phosphino group (preferably a substituted or unsubstituted phosphino group having 2 to 30 carbon atoms, e.g. a dimethylphosphino group, a diphenylphosphino group, or a methylphenoxyphosphino group); a phosphinyl group (preferably a substituted or unsubstituted phosphinyl group having 2 to 30 carbon atoms, e.g. a phosphinyl group, a dioctyloxyphosphinyl group, or a diethoxyphosphinyl group); a phosphinyloxy group (preferably a substituted or unsubstituted phosphinyloxy group having 2 to 30 carbon atoms, e.g. a diphenoxyphosphinyloxy group or a dioctyloxyphosphinyloxy group); a phosphinylamino group (preferably a substituted or unsubstituted phosphinylamino group having 2 to 30 carbon atoms, e.g. a dimethoxyphosphinylamino group or a dimethylaminophosphinylamino group); a silyl group (preferably a substituted or unsubstituted silyl group having 3 to 30 carbon atoms, e.g. a trimethylsilyl group, a t-butyldimethylsilyl group, or a phenyldimethylsilyl group).

Among the substituents, with respect to one having a hydrogen atom, the hydrogen atom may be removed and be substituted by any of the above-mentioned substituents. Examples thereof include: an alkylcarbonylaminosulfonyl group, an arylcarbonylaminosulfonyl group, an alkylsulfonylaminocarbonyl group, and an arylsulfonylaminocarbonyl group. Specific examples thereof include a methylsulfonylaminocarbonyl group, a p-methylphenylsulfonylaminocarbonyl group, an acetylaminosulfonyl group, and a benzoylaminosulfonyl group.

When the ultraviolet absorber represented by any one of the formulae (1) to (8) is water-soluble, it is preferred to have an ionic hydrophilic group. The ionic hydrophilic group includes a sulfo group, a carboxyl group, a phosphono group, and a quaternary ammonium group. As the ionic hydrophilic group, a carboxyl group, a phosphono group, and a sulfo group are preferred, and a carboxyl group and a sulfo group are particularly preferred. The carboxyl group, phosphono group, and sulfo group may be in the state of a salt, and the examples of the counter ions for forming the salts include an ammonium ion, an alkali metal ion (e.g., a lithium ion, a sodium ion, and a potassium ion), and an organic cation (a tetramethylammonium ion, a tetramethylguanidium ion, and a tetramethylphosphonium ion).

Among ultraviolet absorbers represented by any one of the Formulae (1) to (8), those represented by any one of the Formulae (1) to (4) are preferable in the point that they themselves have high light fastness, and those represented by any one of the Formulae (1) to (3) are further preferable in view of absorbing characteristics. Among these absorbers, those represented by the Formulae (1) and (3) are particularly preferable. In the case where the ultraviolet absorber is used in a basic condition, on the other hand, compounds represented by any one of the Formulae (4) to (8) are preferable from the viewpoint of preventing coloring caused by dissociation.

The compounds represented by any one of the formulae (1) to (8) can be synthesized by or according to any of the methods described, for example, in JP-B-48-30492, JP-B-55-36984, JP-B-55-125875, JP-B-36-10466, JP-B-48-5496, JP-A-46-3335, JP-A-58-214152, JP-A-58-221844, JP-A-47-10537, JP-A-59-19945, JP-A-63-53544, JP-A-51-56620, JP-A-53-128333, JP-A-58-181040, JP-A-6-211813, JP-A-7-258228, JP-A-8-239368, JP-A-8-53427, JP-A-10-115898, JP-A-10-147577, JP-A-10-182621, JP-T-8-501291 ("JP-T" means searched and published International patent publication), U.S. Pat. No. 3,754,919, U.S. Pat. No. 4,220,711, U.S. Pat. No. 2,719,086, U.S. Pat. No. 3,698,707, U.S. Pat. No. 3,707,375, U.S. Pat. No. 5,298,380, U.S. Pat. No. 5,500,332, U.S. Pat. No. 5,585,228, U.S. Pat. No. 5,814,438, British Patent No. 1,198,337, European Patents No. 323408A, No. 520938A, No. 521823A, No. 531258A, No. 530135A, and No. 520938A.

Also, the structures, material properties and action mechanisms of typical ultraviolet absorbers are described in Andreas Valet, "Light Stabilizers for Paint", issued by Vincentz.

(Back Layer)

The back surface of the heat-sensitive transfer sheet directly contacts with a heating device such as a thermal head, and the sheet travels while the back surface is heated. Therefore, it is preferred to dispose a back layer on the back surface of a support in order to smooth the traveling by preventing the back surface from being heat sealed with the heating device such as a thermal head.

In the back layer, there can be used alone or a mixture of natural or synthetic resins such as cellulosic-series resins (for example, ethyl cellulose, hydroxy cellulose, hydroxypropyl cellulose, methyl cellulose, cellulose acetate, cellulose acetate butyrate, and nitro cellulose), vinyl-series resins (for example, polyvinyl alcohol, polyvinyl acetate, polyvinyl acetal, and polyvinyl pyrrolidone), acrylic-series resins (for example, polymethyl methacrylate, polyethyl methacrylate, polyacryl amide, and acrylonitrile-styrene copolymer), polyamide resins, polyvinyl toluene resins, cumarone indene resins, polyester-series resins, polyurethane resins, silicone-modified or fluorine-modified polyurethane resins, and silicone resins.

In order to improve heat resistance of the back layer, it is a preferable embodiment that the back layer is modified with a crosslinking agent into a crosslinked resin layer.

Further to improve traveling, it is preferable to contain a solid or liquid releasing agent or lubricant in a back layer. As the solid or liquid releasing agent or lubricant, known compounds can be used. Examples of these compounds include various kinds of waxes such as zinc stearate, stearic acid amide, carnauba wax, montan wax, polyethylene wax, and paraffin wax, higher aliphatic acid alcohol, organopolysiloxane, anionic surfactants, cationic surfactants, amphoteric surfactants, nonionic surfactants, fluorine surfactants, organic carboxylic acid and their derivatives, fluorine resins, silicone resin, phosphoric acid ester compounds, and organic or inorganic fine particles.

Such the back layer can be formed using a known coating method. A thickness of the back layer is preferably in the range of from 0.1 μm to 10 μm, more preferably from 0.3 μm to 5 μm, and especially preferably from 0.5 μm to 3 μm.

2) Heat-Sensitive Transfer Image-Receiving Sheet

Next, the heat-sensitive transfer image-receiving sheet (hereinafter also referred to as an image-receiving sheet) used in the present invention will be explained.

The heat-sensitive (thermal) transfer image-receiving sheet used in the present invention is provided with at least one dye-receiving layer (receptor layer) on a support, and at least one heat insulation layer (porous layer) between the support and the receptor layer. Moreover, an undercoat layer such as a white-background-control layer, a charge-control layer (an electrification-control layer), an adhesive layer, and a primer layer, may be provided between the receptor layer and the heat insulation layer.

The receptor layer and the heat insulation layer are preferably formed by a simultaneous multi-layer coating. When the undercoat layer is provided, the receptor layer, the undercoat layer, and the heat insulation layer may be formed by the simultaneous multi-layer coating.

It is preferable that a curling control layer, a writing layer, or a charge-control layer be formed on the backside of the support. Each of these layers may be applied using a usual method such as a roll coating, a bar coating, a gravure coating, and a gravure reverse coating.

<Receptor Layer>

[Thermoplastic Resin]

In the present invention, a thermoplastic resin is preferably used in the receptor layer. Examples of the thermoplastic resin (polymer) that is preferably used in the receptor layer in the present invention include vinyl-series resins, such as halogenated polymers (e.g., polyvinyl chloride and polyvinylidene chloride), polyvinyl acetate, ethylene-vinyl acetate copolymer, vinyl chloride-vinyl acetate copolymer, polyacryl ester, polystylene, and polystylene acrylate; acetal-series resins, such as polyvinylformal, polyvinylbutyral and polyvinylacetal; polyester-series resins, such as polyethylene terephthalate, polybutylene terephthalate and polycaprolactone (e.g., PLACCEL H-5 (trade name) manufactured by DAICEL CHEMICAL INDUSTRIES, LTD.); polycarbonate-series resins; cellulose-series resins, such as those described in JP-A-4-296595 and JP-A-2002-264543; cellulose-series resins, such as cellulose acetate butyrate (e.g., CAB551-0.2 and CAB321-0.1 (each trade name) manufactured by Eastman Chemical Company); polyolefin-series resins, such as polypropylene; and polyamide-series resins, such as urea resins, melamine resins and benzoguanamine resins. These resins may be used optionally blending with each other in the range of compatibility. Resins used for forming the receptor layer are also disclosed in JP-A-57-169370, JP-A-57-207250 and JP-A-60-25793.

It is further preferable that, among these polymers, the receptor layer preferably contain a polycarbonate, a polyester, a polyurethane, a polyvinyl chloride or its copolymer, a styrene-acrylonitrile copolymer, a polycaprolactone, or a mixture of two or more of these. It is particularly preferable that the receptor layer contain a polycarbonate, a polyester, a polyvinyl chloride or its copolymer, or a mixture of two or more of these. The following is a more detailed explanation of polycarbonate, polyester, and polyvinyl chloride. Incidentally, these polymers may be used singly or as mixtures thereof.

(Polyester-Series Polymers)

The polyester-series polymers used in the receptor layer in the present invention is explained in more detail.

The polyester polymers are obtained by polycondensation of a dicarboxylic acid component (including a derivative thereof) and a diol component (including a derivative thereof). The polyester polymers preferably contain an aromatic ring and/or an aliphatic ring. As to technologies related to the alicyclic polyester, those described in JP-A-5-238167 are useful from the viewpoints of ability to incorporate a dye and image stability.

Examples of the dicarboxylic acid component include adipic acid, azelaic acid, isophtharic acid, trimellitic acid, terephtharic acid, 1,4-cyclohexane dicarboxylic acid, and a mixture of two or more of these acids. The dicarboxylic acid component is preferably isophtharic acid, trimellitic acid, terephtharic acid, or a mixture of two or more of these acids. From a viewpoint of improvement in light resistance, a dicarboxylic acid component having an alicyclic structure is more preferable as the dicarboxylic acid component. The dicarboxylic acid component is further preferably 1,4-cyclohexane dicarboxylic acid or isophtharic acid. Specifically, as the dicarboxylic acid component, a mixture of isophtharic acid in an amount of 50 to 100 mol %, trimellitic acid in an amount of 0 to 1 mol %, terephtharic acid in an amount of 0 to 50 mol %, and 1,4-cyclohexane dicarboxylic acid in an amount of 0 to 15 mol %, in which a total amount of these components is 100 mol %, is furthermore preferably used.

Examples of the diol component include ethylene glycol, polyethylene glycol, tricyclodecane dimethanol, 1,4-butanediol, bisphenol, and a mixture of two or more of these diols. The diol component is preferably ethylene glycol, polyethylene glycol or tricyclodecane dimethanol. From a viewpoint of improvement in light resistance, a diol component having an alicyclic structure is more preferable as the diol component. Use can be made of an alicyclic diol component such as cyclohexanediol, cyclohexanedimethanol and cyclohexanediethanol, in addition to tricyclodecane dimethanol. The alicyclic diol component is preferably tricyclodecane dimethanol. Specifically, as the diol component, a mixture of ethylene glycol in an amount of 0 to 50 mol %, polyethylene glycol in an amount of 0 to 10 mol %, tricyclodecane dimethanol in an amount of 0 to 90 mol % (preferably from 30 to 90 mol %, more preferably from 40 to 90 mol %), 1,4-butanediol in an amount of 0 to 50 mol %, and bisphenol A in an amount of 0 to 50 mol %, in which a total amount of these components is 100 mol %, is furthermore preferably used.

In the present invention, as the polyester polymers, it is preferable to use polyester polymers obtained by polycondensation using at least one of the above-described dicarboxylic acid components and at least one of the above-described diol components, so that the thus-obtained polyester polymers could have a molecular weight (mass average molecular weight (Mw)) of generally about 11,000 or more, preferably about 15,000 or more, and more preferably about 17,000 or more. If polyester polymers of too low molecular weight are used, elastic coefficient of the formed receptor layer becomes low and also it raises lack of thermal resistance. Resultantly, it sometimes becomes difficult to assure the releasing property of the heat-sensitive transfer sheet and the image-receiving sheet. A higher molecular weight is more preferable from a viewpoint of increase in elastic coefficient. The molecular weight is not limited in particular, so long as such failure does not occur that a higher molecular weight makes the polymer difficult to be dissolved in a solvent for a coating solution at the time of forming the receptor layer, or that an adverse effect arises in adhesive properties of the receptor layer to a substrate sheet after coating and drying the receptor layer. However, the molecular weight is preferably about 25,000 or less, and at highest a degree of about 30,000. The polyester polymers may be synthesized according to a known method.

Examples of a saturated polyester used as the polyester polymers, include VYLON 200, VYLON 290 and VYLON 600 (each trade name, manufactured by Toyobo Co., Ltd.), KA-1038C (trade name, manufactured by Arakawa Chemical Industries, Ltd.), and TP220 and TP235 (each trade name, manufactured by The Nippon Synthetic Chemical Industry Co., Ltd.).

(Polycarbonate-Series Polymers)

The polycarbonate-series polymer that can be used in the receptor layer in the present invention is explained in more detail.

The polycarbonate polymers mean a polyester composed of a carbonic acid and a diol as a unit. The polycarbonate polymers can be synthesized by, for example, a method in which a diol and a phosgene are reacted or a method in which a diol and a carbonic acid ester are reacted.

Examples of the diol component include bisphenol A, ethylene glycol, propylene glycol, diethylene glycol, butanediol, pentanediol, hexanediol, 1,4-cyclohexanedimethanol, nonanediol, 4,4'-bicyclo(2,2,2)hepto-2-ylidene bisphenol, 4,4'-(octahydro-4,7-methano-5H-indene-5-ylidene)bisphenol and 2,2',6,6'-tetrachloro bisphenol A. Preferred are bisphenol A, ethylene glycol, diethylene glycol, butanediol and pentanediol. More preferred are bisphenol A, ethylene glycol and butanediol. Especially preferred are bisphenol A and ethylene glycol. As for the polycarbonate polymers that can be used in the present invention, at least one of the above-described diol components is used. A plurality of diols may be used as a mixture thereof.

The following is a detailed explanation of a bisphenol A-polycarbonate that is an especially preferred embodiment of the present invention.

Technologies related to unmodified polycarbonates that center around the bisphenol A-polycarbonate are described in U.S. Pat. No. 4,695,286. The polycarbonate polymers that can be used in the present invention are a polycondensation compound having a molecular weight (weight average molecular weight (Mw)) of generally about 1,000 or more, preferably about 3,000 or more, more preferably about 5,000 or more, and especially preferably about 10,000 or more. Specific examples of the polycarbonate polymers include Makrolon-5700 (trade name, manufactured by Bayer AG) and LEXAN-141 (trade name, manufactured by General Electric Corporation)

Technologies of producing modified polycarbonates by mixing bisphenol A with a diol such as ethylene glycol are described in U.S. Pat. No. 4,927,803. The polyether block unit may be produced from a linear aliphatic diol having 2 to about 10 carbon atoms. But, a polyether block unit produced from ethylene glycol is preferred. In a preferred embodiment of the present invention, the polyether block unit has a number molecular weight of about 4,000 to about 50,000, while the bisphenol A-polycarbonate block unit has a number molecular weight of about 15,000 to about 250,000. A molecular weight of the whole block copolymer is preferably in the range of about 30,000 to about 300,000. Specific examples thereof include Makrolon KL3-1013 (trade name, manufactured by Bayer AG).

It is also preferable that these unmodified and modified bisphenol A-polycarbonates are mixed together. Specifically, it is preferred to blend an unmodified bisphenol A-polycarbonate with a polyether-modified polycarbonate in a ratio by mass of from 80:20 to 10:90. The ratio by mass of from 50:50 to 40:60 is especially preferred from a viewpoint of improvement in resistance to finger print. Technologies of blending the unmodified and modified bisphenol A-polycarbonates are also described in JP-A-6-227160.

As for a preferable embodiment of the thermoplastic resin (polymers) used in the receptor layer, use can be made of a blend of the above-described polycarbonate polymers and the above-described polyester polymers. In the blend, it is preferred to secure compatibility of the polycarbonate polymers and the polyester polymers. The polyester polymers preferably have a glass transition temperature (Tg) of about 40° C. to about 100° C., and the polycarbonate polymers preferably have a Tg of about 100° C. to about 200° C. It is preferable that the polyester polymers have a Tg lower than that of the polycarbonate polymers and act as a plasticizer to the polycarbonate polymers. A preferable Tg of a finished polyester/polycarbonate blend is in the range of 40° C. to 100° C. Even though a polyester/polycarbonate blend polymer has a higher Tg, it may be used advantageously by addition of a plasticizer.

In a further preferable embodiment, an unmodified bisphenol A-polycarbonate and polyester polymers are blended in such a ratio by mass that a Tg of the finished blend not only becomes a preferable value but also a cost can be controlled to the minimum. The polycarbonate polymers and the polyester polymers can be blended advantageously in a ratio by mass of approximately from 75:25 to 25:75. It is more preferable to blend them in a ratio by mass of from about 60:40 to about 40:60. Technologies of a blend series of the polycarbonate polymers and the polyester polymers are disclosed in JP-A-6-227161.

As for the polycarbonate polymers that can be used in the receptor layer, a net structure of a crosslinked polymer may be formed in the receptor layer by reacting a polycarbonate having an average molecular weight of about 1,000 to about 10,000, the ends of which have at least 2 hydroxyl groups, with a crosslinking agent capable of reacting with the hydroxyl groups. As described in JP-A-6-155933, there are known technologies for a crosslinking agent such as a multi-functional isocyanate, thereby to improve adhesiveness to a dye donator after transfer. Besides, as the technologies disclosed in JP-A-8-39942, there are technologies in which a receiving sheet for a heat-sensitive dye transfer process is constructed using dibutyl tin diacetate at a time of crosslinking reaction of a polycarbonate with isocyanate. Such the technologies enable to improve not only acceleration of the crosslinking reaction, but also image stability, resistance to finger print, and the like.

(Vinyl Chloride-Series Polymers)

The vinyl chloride-series polymers, particularly a copolymer using vinyl chloride, used in the receptor layer are explained in more detail.

The polyvinyl chloride-series copolymer is preferably one having a vinyl chloride constituent content of 85 to 97% by mass and a polymerization degree of 200 to 800. A monomer forming such a copolymer together with vinyl chloride has no particular restrictions, and any monomer may be used as far as it can be copolymerized with vinyl chloride. However, it is particularly preferably vinyl acetate. Accordingly, the polyvinyl chloride copolymer used in the receptor layer is advantageously a vinyl chloride-vinyl acetate copolymer. However, the vinyl chloride-vinyl acetate copolymer is not necessarily constituted of vinyl chloride and vinyl acetate alone, and may include vinyl alcohol and maleic acid constituents to an extent to which the effects of the present invention would be obtained. Examples of other monomer constituents of such a copolymer constituted mainly of vinyl chloride and vinyl acetate include vinyl alcohol and its derivatives such as vinyl propionate; acrylic or methacrylic acids and their derivatives such as their methyl, ethyl, propyl, butyl and 2-ethylhexyl esters; maleic acid and its derivatives such as diethyl maleate, dibutyl maleate and dioctyl maleate; vinyl ether derivatives such as methyl vinyl ether, butyl vinyl ether and 2-ethylhexyl vinyl ether; acrylonitrile and methacrylonitrile; and styrene. The ratio of each of the vinyl chloride and vinyl acetate components in the copolymer may be any ratio, but it is preferable that the ratio of the vinyl chloride component is 50 mass % or more of the copolymer. In addition, it is preferable that the ratio of the above-recited constituents other than the vinyl chloride and vinyl acetate is 10 mass % or less of the copolymer.

Examples of such a vinyl chloride-vinyl acetate copolymer include SOLBIN C, SOLBIN CL, SOLBIN CH, SOLBIN CN, SOLBIN C5, SOLBIN M, SOLBIN MF, SOLBIN A, SOLBIN AL, SOLBIN TA5R, SOLBIN TAO, SOLBIN MK6, and SOLBIN TA2 (trade names, manufactured by Nissin Chemical Industry Co., Ltd.); S-LEC A, S-LEC C and S-LEC M (trade names, manufactured by Sekisui Chemical Co., Ltd.); Vinylite VAGH, Vinylite VYHH, Vinylite VMCH, Vinylite VYHD, Vinylite VYLF, Vinylite VYNS, Vinylite VMCC, Vinylite VMCA, Vinylite VAGD, Vinylite VERR and Vinylite VROH (trade names, manufactured by Union Carbide Corporation); and DENKA VINYL 1000GKT, DENKA VINYL 1000L, DENKA VINYL 1000CK, DENKA VINYL 1000A, DENKA VINYL 1000LK2, DENKA VINYL 1000AS, DENKA VINYL 1000MT2, DENKA VINYL 1000CSK, DENKA VINYL 1000CS, DENKA VINYL 1000GK, DENKA VINYL 1000GSK, DENKA VINYL 1000GS, DENKA VINYL 1000LT3, DENKA VINYL 1000D and DENKA VINYL 1000W (trade names, manufactured by Denki Kagaku Kogyo Kabushiki Kaisha).

(Latex Polymer)

In the present invention, other than the aforementioned polymers, latex polymers can also be preferably used. Hereinafter, the latex polymer will be explained.

In the heat-sensitive transfer image-receiving sheet used in the present invention, the latex polymer that can be used in the receptor layer is preferred to form a dispersion in which hydrophobic polymers comprising a monomer unit of water-insoluble vinyl chloride are dispersed as fine particles in a water-soluble dispersion medium. The dispersed state may be one in which polymer is emulsified in a dispersion medium, one in which polymer underwent emulsion polymerization, one in which polymer underwent micelle dispersion, one in which polymer molecules partially have a hydrophilic structure and thus the molecular chains themselves are dispersed in a molecular state, or the like. Latex polymers are described in "Gosei Jushi Emulsion (Synthetic Resin Emulsion)", compiled by Taira Okuda and Hiroshi Inagaki, issued by Kobunshi Kanko Kai (1978); "Gosei Latex no Oyo (Application of Synthetic Latex)", compiled by Takaaki Sugimura, Yasuo Kataoka, Souichi Suzuki, and Keishi Kasahara, issued by Kobunshi Kanko Kai (1993); Soichi Muroi, "Gosei Latex no Kagaku (Chemistry of Synthetic Latex)", issued by Kobunshi Kanko Kai (1970); Yoshiaki Miyosawa (supervisor) "Suisei Coating-Zairyo no Kaihatsu to Oyo (Development and Application of Aqueous Coating Material)", issued by CMC Publishing Co., Ltd. (2004) and JP-A-64-538, and so forth. The dispersed particles preferably have a mean particle size (diameter) of about 1 to 50,000 nm, more preferably about 5 to 1,000 nm.

The particle size distribution of the dispersed particles is not particularly limited, and the particles may have either wide particle-size distribution or monodispersed particle-size distribution.

The latex polymer for use in the present invention may be latex of the so-called core/shell type, other than ordinary latex polymer of a uniform structure. When using a core/shell type latex polymer, it is preferred in some cases that the core and the shell have different glass transition temperatures. The glass transition temperature (Tg) of the latex polymer for use in the present invention is preferably −30° C. to 100° C., more preferably 0° C. to 80° C., further more preferably 10° C. to 70° C., and especially preferably 15° C. to 60° C.

The latex polymer that can be used in the receptor layer, use can be made of polyvinyl chlorides, a copolymer comprising vinyl chloride unit, such as a vinyl chloride-vinyl acetate copolymer and a vinyl chloride acrylate copolymer. In this case, the vinyl chloride unit in molar ratio is preferably in the range of from 50% to 95%. These polymers may be straight-chain, branched, or cross-linked polymers, the so-called homopolymers obtained by polymerizing single type of monomers, or copolymers obtained by polymerizing two or more types of monomers. In the case of the copolymers, these copolymers may be either random copolymers or block copolymers. The molecular weight of each of these polymers is preferably 5,000 to 1,000,000, and further preferably 10,000 to 500,000 in terms of number average molecular weight. Polymers having excessively small molecular weight impart insufficient dynamic strength to the layer containing the latex, and polymers having excessively large molecular weight bring about poor filming ability. Crosslinkable latex polymers are also preferably used.

The latex polymer that can be used in the present invention is commercially available, and polymers described below may be utilized. Examples thereof include G351 and G576 (trade names, manufactured by Nippon Zeon Co., Ltd.); VINYBLAN 240, VINYBLAN 270, VINYBLAN 277, VINYBLAN 375, VINYBLAN 386, VINYBLAN 609, VINYBLAN 550, VINYBLAN 601, VINYBLAN 602, VINYBLAN 630, VINYBLAN 660, VINYBLAN 671, VINYBLAN 683, VINYBLAN 680, VINYBLAN 680S, VINYBLAN 681N, VINYBLAN 685R, VINYBLAN 277, VINYBLAN 380, VINYBLAN 381, VINYBLAN 410, VINYBLAN 430, VINYBLAN 432, VINYBLAN 860, VINYBLAN 863, VINYBLAN 865, VINYBLAN 867, VINYBLAN 900, VINYBLAN 900GT, VINYBLAN 938 and VINYBLAN 950 (trade names, manufactured by Nissin Chemical Industry Co., Ltd.).

These latex polymers may be used singly, or two or more of these polymers may be blended, if necessary.

In the receptor layer, a ratio of the latex polymer comprising a component of vinyl chloride is preferably 50 mass % or more of the whole solid content in the layer.

In the present invention, it is preferable to prepare the receptor layer by applying an aqueous type coating solution and then drying it. The "aqueous type" so-called here means that 60% by mass or more of the solvent (dispersion medium) of the coating solution is water. As a component other than water in the coating solution, a water miscible organic solvent may be used, such as methyl alcohol, ethyl alcohol, isopropyl alcohol, methyl cellosolve, ethyl cellosolve, dimethylformamide, ethyl acetate, diacetone alcohol, furfuryl alcohol, benzyl alcohol, diethylene glycol monoethyl ether, and oxyethyl phenyl ether.

The latex polymer for use in the present invention preferably has a minimum film-forming temperature (MFT) of from −30 to 90° C., more preferably from 0 to 70° C. In order to control the minimum film-forming temperature, a film-forming aid may be added. The film-forming aid is also called a temporary plasticizer, and it is an organic compound (usually an organic solvent) that reduces the minimum film-forming temperature of a latex polymer. It is described in, for example, Souichi Muroi, "Gosei Latex no Kagaku (Chemistry of Synthetic Latex)", issued by Kobunshi Kanko Kai (1970). Preferable examples of the film-forming aid are listed below, but the compounds that can be used in the present invention are not limited to the following specific examples.

Z-1: Benzyl alcohol

Z-2: 2,2,4-Trimethylpentanediol-1,3-monoisobutyrate

Z-3: 2-Dimethylaminoethanol

Z-4: Diethylene glycol

The latex polymer for use in the present invention may be used (blended) with another latex polymer. Preferable examples of the another latex polymer include polylactates, polyurethanes, polycarbonates, polyesters, polyacetals, and SBR's. Among these, polyesters and polycarbonates are preferable.

In combination with the above-described latex polymer for use in the present invention, any polymer can be used. The polymer that can be used in combination is preferably transparent or translucent, and colorless. The polymer may be a natural resin, polymer, or copolymer; a synthetic resin, polymer, or copolymer; or another film-forming medium; and specific examples include gelatins, polyvinyl alcohols, hydroxyethylcelluloses, cellulose acetates, cellulose acetate butyrates, polyvinylpyrrolidones, caseins, starches, polyacrylic acids, polymethylmethacrylic acids, polyvinyl chlorides, polymethacrylic acids, styrene-maleic anhydride copolymers, styrene-acrylonitrile copolymers, styrene-butadiene copolymers, polyvinyl acetals (e.g. polyvinyl formals, polyvinyl butyrals, etc.), polyesters, polyurethanes, phenoxy resins, polyvinylidene chlorides, polyepoxides, polycarbonates, polyvinyl acetates, polyolefins, and polyamides. In the coating liquid, a binder may be dissolved or dispersed in an aqueous solvent or in an organic solvent, or may be in the form of an emulsion.

The glass transition temperature (Tg) of the binder for use in the present invention is preferably in the range of −30° C. to 70° C., more preferably −10° C. to 50° C., still more preferably 0° C. to 40° C., in view of film-forming properties (brittleness for working) and image preservability. A blend of two or more types of polymers can be used as the binder. When a blend of two or more polymers is used, the average Tg obtained by summing up the Tg of each polymer weighted by its proportion, is preferably within the foregoing range. Also, when phase separation occurs or when a core-shell structure is adopted, the weighted average Tg is preferably within the foregoing range.

The glass transition temperature (Tg) is calculated according to the following equation:

$$1/Tg=\Sigma(Xi/Tgi)$$

wherein, assuming that the polymer is a copolymer composed of n monomers from i=1 to i=n, Xi is a weight fraction of the i-th monomer (ΣXi=1) and Tgi is glass transition temperature (measured in absolute temperature) of a homopolymer formed from the i-th monomer. The symbol Σ means the sum of i=1 to i=n. The value of the glass transition temperature of a homopolymer formed from each monomer (Tgi) can be adopted from J. Brandrup and E. H. Immergut, "Polymer Handbook, 3rd. Edition", Wiley-Interscience (1989). However, with respect to a glass transition temperature of the heat transfer layer for use in the present invention, values that are obtained by actual measurement are employed.

The polymer used for the binder for use in the present invention can be easily obtained by a solution polymerization method, a suspension polymerization method, an emulsion polymerization method, a dispersion polymerization method, an anionic polymerization method, a cationic polymerization method, or the like. Above all, an emulsion polymerization method in which the polymer is obtained as a latex is the most preferable. Also, a method is preferable in which the polymer is prepared in a solution, and the solution is neutralized or an emulsifier is added to the solution, to which water is then added, to prepare an aqueous dispersion by forced stirring. For example, an emulsion polymerization method comprises conducting polymerization under stirring at about 30° C. to about 100° C. (preferably 60° C. to 90° C.) for 3 to 24 hours by using water or a mixed solvent of water and a water-miscible organic solvent (such as methanol, ethanol, or acetone) as a dispersion medium, a monomer mixture in an amount of 5 mass % to 150 mass % based on the amount of the dispersion medium, an emulsifier and a polymerization initiator. Various conditions such as the dispersion medium, the monomer concentration, the amount of initiator, the amount of emulsifier, the amount of dispersant, the reaction temperature, and the method for adding monomers are suitably determined considering the type of the monomers to be used. Furthermore, it is preferable to use a dispersant when necessary.

In the coating solution of the latex polymer to be used in the present invention, an aqueous solvent can be used as the solvent, and a water-miscible organic solvent may optionally be used in combination. Examples of the water-miscible organic solvent include alcohols (for example, methyl alcohol, ethyl alcohol, and propyl alcohol), cellosolves (for example, methyl cellosolve, ethyl cellosolve, and butyl cellosolve), ethyl acetate, and dimethylformamide. The amount of the organic solvent to be added is preferably 50 mass % or less of the entire solvent, more preferably 30 mass % or less of the entire solvent.

Furthermore, in the latex polymer to be used in the present invention, the polymer concentration is, based on the amount of the latex liquid, preferably 10 mass % to 70 mass %, more preferably 20 mass % to 60 mass %, and especially preferably 30 mass % to 55 mass %.

The latex polymer in the image-receiving sheet that can be used in the present invention includes a state of a gel or dried film formed by removing a part of solvents by drying after coating.

[Emulsified Dispersion]

In the present invention, incorporation of an emulsified dispersion (emulsion) in the receptor layer is preferable, especially when the latex polymer is used.

The term "emulsification" as used herein follows the commonly used definition. According to "Kagaku Daijiten (ENCYCLOPEDIA CHIMICA)", Kyoritsu Shuppan Co., Ltd., for example, "emulsification" is defined as "a phenomenon in which, in one liquid, another liquid which does not dissolve in the first liquid are dispersed as fine globules, to form an emulsion". In addition, the term "emulsified dispersion" refers to "a dispersion in which fine globules of one liquid are dispersed in another liquid which does not dissolve the globules". The "emulsified dispersion" preferred in the present invention is "a dispersion of oil globules in water". The content of an emulsified dispersion in the image-receiving sheet for use in the present invention is preferably from 0.03 $g/m^2$ to 25.0 $g/m^2$, more preferably from 1.0 $g/m^2$ to 20.0 $g/m^2$.

In the present invention, it is preferable that a high-boiling solvent be included as an oil-soluble substance in the emulsified dispersion. Examples of the high-boiling solvent preferably used include phthalic acid esters (such as dibutyl phthalate, dioctyl phthalate, and di-2-ethyl-hexyl phthalate), phosphoric or phosphonic acid esters (such as triphenyl phosphate, tricresyl phosphate, tri-2-ethylhexyl phosphate), fatty acid esters (such as di-2-ethylhexyl succinate and tributyl citrate), benzoic acid esters (such as 2-ethylhexyl benzoate and dodecylbenzoate), amides (such as N,N-diethyldodecanamide and N,N-dimethyloleinamide), alcohol and phenol compounds (such as isostearyl alcohol and 2,4-di-tert-amylphenol), anilines (such as N,N-dibutyl-2-butoxy-5-tert-octylaniline), chlorinated paraffins, hydrocarbons (such as dodecylbenzene and diisopropylnaphthalene), and carboxylic acids (such as 2-(2,4-di-tert-amylphenoxy)butyric acid). Of these high-boiling solvents, phosphoric or phosphonic acid esters (such as triphenyl phosphate, tricresyl phosphate, and tri-2-ethylhexyl phosphate) are preferred over the others. In addition to such a high-boiling solvent, an organic solvent having a boiling point of 30° C. to 160° C. (such as ethyl acetate, butyl acetate, methyl ethyl ketone, cyclohexanone, methyl cellosolve acetate, or dimethylformamide) may be used as an auxiliary solvent. The content of high-boiling solvent in the emulsified dispersion is preferably from 3.0 to 25% by mass, and more preferably from 5.0 to 20% by mass.

It is preferable that the emulsified dispersion further contain an agent for imparting fastness to images and an ultraviolet absorbent. The compounds preferably used as such agents are any of the compounds represented by formulae (B), (Ph), (E-1) to (E-3), (TS-I) to (TS-VII), (TS-VIIIA), (UA) to (UE) disclosed in JP-A-2004-361936. Further, homopolymers or copolymers insoluble in water and soluble in organic solvents (preferably the compounds disclosed in JP-A-2004-361936, paragraph Nos. 0208 to 0234) may be included therein.

[Plasticizer]

For the purpose of enhancing the sensitivity of the receptor layer, a plasticizer (high boiling organic solvent) may also be added. Examples of such a plasticizer include compounds generally used as plasticizers for vinyl chloride resins, and more specifically monomeric plasticizers such as phthalates, phosphates, adipates and sebacates, and polyester-type plasticizers produced by polymerization of adipic acid or sebacic acid and propylene glycol. Although the former plasticizers are generally low in molecular weight, olefin-type special copolymer resins, which are used as polymeric plasticizer usable for vinyl chloride, may also be used. Examples of resins usable for such a purpose include products marketed under the names of ELVALOY 741, ELVALOY 742, ELVALOY HP443, ELVALOY HP553, ELVALOY EP4015, ELVALOY EP4043, ELVALOY EP4051 (trade names, manufactured by DuPont-Mitsui Polychemicals Co., Ltd.). Such plasticizers can be added to the resins in a proportion of about 100% by mass based on the resin in the receptor layer, but it is appropriate to use them in a proportion of 30% by mass or below in view of bleeding of prints. When the latex polymer is used, it is preferable that those plasticizers be used in a state of the emulsified dispersion as mentioned above.

The receptor layer for use in the present invention can be cast by extrusion coating of a melt of the polymer resin as recited above without resorting to solvent coating. The techniques of this extrusion coating are described in *Encyclopedia of Polymer Science and Engineering*, vol. 3, p. 563, John Wiley, New York (1985), and ibid., vol. 6, p. 608 (1986). In addition, the technique for heat-sensitive dye transfer materials is disclosed in JP-A-7-179075, and it is also preferably applicable to the present invention. As the polymer resin, copolymer obtained by condensing cyclohexane dicarboxylate and a 50:50 by mole % mixture of ethylene glycol and bisphenol-A-diethanol (COPOL; registered trade mark) is especially preferred.

[Releasing Agent]

If the image-receiving surface of the heat-sensitive transfer image-receiving sheet lacks a sufficient releasing property, problems of so-called abnormal transfer arises. Examples of the abnormal transfer include a problem that a heat-sensitive transfer sheet and a heat-sensitive transfer image-receiving sheet mutually weld by heat from a thermal head for the image-forming, and thereby a big noise due to peeling arises at the time of peeling; a problem that a dye layer is entirely transferred; and a problem that the receptor layer is peeled from the support. As a method of solving such problems of releasing property, there are known a method of introducing various kinds of releasing agents (lubricant) in the receptor layer and a method of disposing a releasing layer additionally on the receptor layer. In the present invention, it is preferable to use a releasing agent in the receptor layer in order to keep more securely the releasing property between the heat-sensitive transfer sheet and the image-receiving sheet at the time of printing images.

As the releasing agent, solid waxes such as polyethylene wax, amide wax and Teflon (registered trade name) powder; silicone oil, phosphate-series compounds, fluorine-based surfactants, silicone-based surfactants and others including releasing agents known in the technical fields concerned may be used. Among these, fluorine-series compounds typified by fluorine-based surfactants, silicone-based surfactants and silicone-series compounds such as silicone oil and/or its hardened products are preferably used.

As the silicone oil, straight silicone oil and modified silicone oil or their hardened products may be used.

Examples of the straight silicone oil include dimethylsilicone oil, methylphenylsilicone oil and methyl hydrogen silicone oil. Examples of the dimethylsilicone oil include KF96-10, KF96-100, KF96-1000, KF96H-10000, KF96H-12500 and KF96H-100000 (all of these names are trade names, manufactured by Shin-Etsu Chemical Co., Ltd.). Examples of the methylphenylsilicone oil include KF50-100, KF54 and KF56 (all of these names are trade names, manufactured by Shin-Etsu Chemical Co., Ltd.).

The modified silicone oil may be classified into reactive silicone oils and non-reactive silicone oils. Examples of the reactive silicone oils include amino-modified, epoxy-modified, carboxyl-modified, hydroxy-modified, methacryl-modified, mercapto-modified, phenol-modified or one-terminal reactive/hetero-functional group-modified silicone oils. Examples of the amino-modified silicone oil include KF-393, KF-857, KF-858, X-22-3680, X-22-3801C, KF-8010, X-22-161A and KF-8012 (all of these names are trade names, manufactured by Shin-Etsu Chemical Co., Ltd.). Examples of the epoxy-modified silicone oil include KF-100T, KF-101, KF-60-164, KF-103, X-22-343 and X-22-3000T (all of these names are trade names, manufactured by Shin-Etsu Chemical Co., Ltd.). Examples of the carboxyl-modified silicone oil include X-22-162C (trade name, manufactured by Shin-Etsu Chemical Co., Ltd.). Examples of the hydroxy-modified silicone oil include X-22-160AS, KF-6001, KF-6002, KF-6003, X-22-170DX, X-22-176DX, X-22-176D and X-22-176DF (all of these names are trade names, manufactured by Shin-Etsu Chemical Co., Ltd.). Examples of the methacryl-modified silicone oil include X-22-164A, X-22-164C, X-24-8201, X-22-174D and X-22-2426 (all of these names are trade names, manufactured by Shin-Etsu Chemical Co., Ltd.).

Reactive silicone oils may be hardened upon use, and may be classified into a reaction-curable type, photocurable type, catalyst-curable type, and the like. Among these types, silicone oil that is the reaction-curable type is particularly preferable. As the reaction-curable type silicone oil, products obtained by reacting an amino-modified silicone oil with an epoxy-modified silicone oil and then by curing are preferable. Also, examples of the catalyst-curable type or photocurable type silicone oil include KS-705F-PS, KS-705F-PS-1 and KS-770-PL-3 (all of these names are trade names, catalyst-curable silicone oils, manufactured by Shin-Etsu Chemical Co., Ltd.) and KS-720 and KS-774-PL-3 (all of these names are trade names, photocurable silicone oils, manufactured by Shin-Etsu Chemical Co., Ltd.). The addition amount of the curable type silicone oil is preferably 0.5 to 30% by mass based on the resin constituting the receptor layer. The releasing agent is used preferably in an amount of 2 to 4% by mass and further preferably 2 to 3% by mass based on 100 parts by mass of the polyester resin. If the amount is too small, the releasability cannot be secured without fail, whereas if the amount is excessive, a protective layer is not transferred to the heat-sensitive transfer image-receiving sheet resultantly.

Examples of the non-reactive silicone oil include polyether-modified, methylstyryl-modified, alkyl-modified, higher fatty acid ester-modified, hydrophilic special-modified, higher alkoxy-modified or fluorine-modified silicone oils. Examples of the polyether-modified silicone oil include KF-6012 (trade name, manufactured by Shin-Etsu Chemical Co., Ltd.) and examples of the methylstyryl-modified silicone oil include 24-510 (trade name, manufactured by Shin-Etsu Chemical Co., Ltd.). Modified silicones represented by any one of the following Formulae 1 to 3 may also be used.

Formula 1

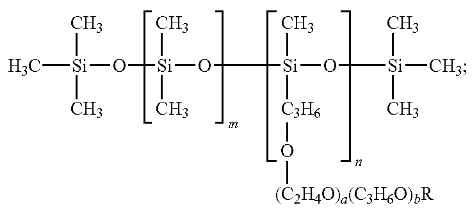

Formula 2

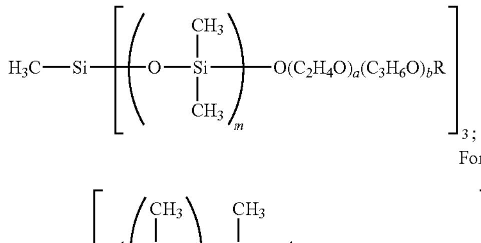

Formula 3

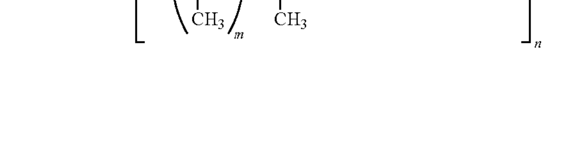

In the Formula 1, R represents a hydrogen atom or a straight-chain or branched alkyl group which may be substituted with an aryl or cycloalkyl group. m and n respectively denote an integer of 2,000 or less, and a and b respectively denote an integer of 30 or less.

In the Formula 2, R represents a hydrogen atom or a straight-chain or branched alkyl group which may be substituted with an aryl or cycloalkyl group. m denotes an integer of 2,000 or less, and a and b respectively denote an integer of 30 or less.

In the Formula 3, R represents a hydrogen atom or a straight-chain or branched alkyl group which may be substituted with an aryl or cycloalkyl group. m and n respectively denote an integer of 2,000 or less, and a and b respectively denote an integer of 30 or less. $R^1$ represents a single bond or a divalent linking group, E represents an ethylene group which may be further substituted, and P represents a propylene group which may be further substituted.

Silicone oils such as those mentioned above are described in "SILICONE HANDBOOK" (The Nikkan Kogyo Shimbun, Ltd.) and the technologies described in each publication of JP-A-8-108636 and JP-A-2002-264543 may be preferably used as the technologies to cure the curable type silicone oils.

In some cases, a dye binder is transferred to the receptor layer in a highlight portion of monochrome printing, to cause an irregular transfer. In addition, it is known that an addition polymerization-type silicone generally progresses a hardening reaction in the presence of a catalyst, and that almost all of complexes of transition metal of VIII group, such as Fe group and Pt group, are effective as the hardening catalyst. Among these, a platinum compound has the highest efficiency in general, and a platinum catalyst, which is generally a platinum complex soluble in the silicone oil, is preferably used. Addition amount necessary for the reaction is generally sufficiently about 1 to 100 ppm.

This platinum catalyst has a strong interaction with an organic compound containing an element such as N, P and S, an ionic compound of heavy metal such as Sn, Pb, Hg, Bi and As, or an organic compound containing a polyvalent bond such as an acetylene group. Therefore, if the above-described compounds (catalyst poison) are used together with the platinum catalyst, the ability of the catalyst to hydrosilylate is lost. Resultantly, the platinum catalyst cannot work as the hardening catalyst. Therefore, a problem arises that the platinum catalyst causes silicone to lack in hardening ability, when used with such a catalyst poison (See "Silicone Handbook" published by Nikkan Kogyo Shunbun shya). As a result, such an addition polymerization-type silicone causing such a hardening failure cannot show a releasability needed, when it is used in the receptor layer. As a hardener reacting with an active hydrogen, it is considered to use an isocyanate compound. However, this isocyanate compound and an organic tin compound working as a catalyst to the isocyanate compound act as a catalyst poison to the platinum catalyst. Therefore, the addition polymerization-type silicone has been never used together with the isocyanate compound in the past. Resultantly, the addition polymerization-type silicone has been never used together with a modified silicone having an active hydrogen that shows a releasability needed when hardened with the isocyanate compound.

However, the hardening failure of the addition polymerization-type silicone can be prevented by 1) setting an equivalent amount of the reactive group of the hardener capable of reacting with the active hydrogen, to the reactive group of both the thermoplastic resin and the modified silicone having an active hydrogen, in the range of from 1:1 to 10:1, and 2) setting an addition amount of the platinum catalyst based on the addition polymerization-type silicone in the range of 100 to 10,000 ppm in terms of platinum atom of the platinum catalyst. If the equivalent amount of the reactive group of the hardener capable of reacting with the active hydrogen according to the 1) described above is too small, an amount of silicone having an active hydrogen hardened with an active hydrogen of the thermoplastic resin is so small that an excellent releasability needed cannot be achieved. On the other hand, if the equivalent ratio is too large, a time which is allowed to use an ink in a coating solution for the receptor layer is so short that such the equivalent ratio cannot be substantially applied to the present invention. Beside, if the addition amount of the platinum catalyst according to the 2) described above is too small, activity is lost by the catalyst poison, whereas if the addition amount is too large, a time which is allowed to use an ink in a coating solution for the receptor layer is so short that such the addition amount cannot be substantially applied to the present invention.

In the present invention, the amount of the receptor layer to be applied is preferably 0.5 to 10 g/$m^2$ (solid basis, hereinafter, the amount to be applied in the present specification is a value on solid basis unless otherwise noted).

<Releasing Layer>

In the case where the hardened modified silicone oil is not added to the receptor layer, the silicone oil may be added to a releasing layer provided on the receptor layer. In this case, the receptor layer may be provided using at least one of the above-described thermoplastic resins. Besides, a receptor layer to which silicone is added may be used. The releasing layer contains a hardened modified silicone oil. A kind of the silicone to be used and a method of using the silicone are the same as for use in the receptor layer. Also, in the case where a catalyst or a retardant is used, the above described descriptions related to addition of these additives to the receptor layer may be applied. The releasing layer may be formed using only a silicone, or alternatively a mixture of a silicone and a binder resin having a good compatibility therewith. A thickness of the releasing layer is generally in the range of about 0.001 to about 1 g/$m^2$.

Examples of the fluorine surfactants include Fluorad FC-430 and FC-431 (trade names manufactured by 3M Corp.).

<Undercoat Layer>

An undercoat layer is preferably formed between the receptor layer and the support. As the undercoat layer, for example, a white background controlling layer, a charge controlling layer, an adhesive layer, or a primer layer may be formed. These layers may be formed in the same manner as those described in, for example, each specification of JP-B-3585599 and JP-B-2925244.

(Heat Insulation Layer)

A heat insulation layer serves to protect the support from heat when a thermal head or the like is used to carry out a transfer operation under heating. Also, because the heat insulation layer generally has proper cushion characteristics, a heat-sensitive transfer image-receiving sheet having high printing sensitivity can be obtained even in the case of using paper as a support. The heat insulation layer may be a single layer, or multi-layers. The heat insulation layer is generally arranged at a nearer location to the support than the receptor layer.

In the image-receiving sheet for use in the present invention, the heat insulation layer contains hollow polymer particles.

The hollow polymer particles in the present invention are polymer particles having independent pores inside of the particles. Examples of the hollow polymer particles include (1) non-foaming type hollow particles obtained in the following manner: a dispersion medium, such as water, is contained inside of a capsule wall formed of a polystyrene, acryl resin, or styrene/acryl resin, and, after a coating solution is applied and dried, the dispersion medium in the particles is vaporized out of the particles, with the result that the inside of each particle forms a hollow; (2) foaming type microballoons obtained in the following manner: a low-boiling point liquid, such as butane and pentane, is encapsulated in a resin constituted of any one of polyvinylidene chloride, polyacrylonitrile, polyacrylic acid, and polyacrylate, or their mixture or polymer, and after the resin coating material is applied, it is heated to expand the low-boiling point liquid inside of the particles, whereby the inside of each particle is made to be hollow; and (3) microballoons obtained by foaming the above (2) under heating in advance, to make hollow polymer particles.

The particle size of the hollow polymer particles is preferably 0.1 to 20 μm, more preferably 0.1 to 2 μm, further preferably 0.1 to 1 μm, particularly preferably 0.2 to 0.8 μm. It is because an excessively small size may lead to decrease of the void ratio (hollow ratio) of the particles, prohibiting desirable heat-insulating property, while an excessively large size in relation to the film thickness of the heat insulation layer may result in problems in preparation of smooth surface and cause coating troubles due to the coarse or bulky particles.

These hollow polymer particles preferably have a hollow ratio of about 20 to 70%, more preferably 20 to 50%. With too small hollow ratio, it cannot give a sufficient heat-insulating efficiency, while with an excessively large hollow ratio for the hollow particles that have the above-described preferable particle diameter, imperfect hollow particles increase prohibiting sufficient film strength.

The "hollow ratio" of the hollow polymer particles as referred to here is a value P calculated according to the Formula (a), based on the transmission image photographed by a transmission micrograph of hollow particles.

$$P = \left\{1/n \times \sum_{i=1}^{n} (Rai/Rbi)^3\right\} \times 100(\%) \quad \text{Formula (a)}$$

In formula (a), Rai represents the circle-equivalent diameter of the inner periphery (which shows the periphery of a hollow portion), among two peripheries constituting an image of a specific particle i; Rbi represents the circle-equivalent diameter of the outer periphery (which shows the outer shape of a particle in interest), among the two peripheries constituting the image of the specific particle i; and n is the number of measured particles, and n is generally 300 or more. Herein, the term "circle-equivalent diameter" means the diameter of a circle having an area equivalent to the (projected) area that the hollow portion's periphery or the particle's outer shape has.

The glass transition temperature (Tg) of the hollow polymer particles is preferably 70° C. or higher, more preferably 100° C. or higher. These hollow polymer particles may be used in combinations of two or more of those, according to the need.

Such hollow polymer particles are commercially available. Specific examples of the above (1) include Rohpake 1055, manufactured by Rohm and Haas Co.; Boncoat PP-1000, manufactured by Dainippon Ink and Chemicals, Incorporated; SX866(B), manufactured by JSR Corporation; and Nippol MH5055, manufactured by Nippon Zeon (all of these product names are trade names). Specific examples of the above (2) include F-30, and F-50, manufactured by Matsumoto Yushi-Seiyaku Co., Ltd. (all of these product names are trade names). Specific examples of the above (3) include F-30E, manufactured by Matsumoto Yushi-Seiyaku Co., Ltd, and Expancel 461DE, 551DE, and 551DE20, manufactured by Nippon Ferrite (all of these product names are trade names). Among these, the hollow polymer particles of the above (1) may be preferably used.

(Water-Soluble Polymer)

In the heat-sensitive transfer image-receiving sheet according to the present invention, it is also one of preferable embodiments that when hollow polymer particles are contained in a heat insulation layer, a water-soluble polymer (a hydrophilic polymer) is contained together with the hollow polymer particles.

Herein, "water-soluble polymer" means a polymer which dissolves, in 100 g water at 20° C., in an amount of preferably 0.05 g or more, more preferably 0.1 g or more, further preferably 0.5 g or more, and particularly preferably 1 g or more. As the water-soluble polymer, all of natural polymers, semisynthetic polymers, and synthetic polymers are preferably used in the present invention.

Among the water-soluble polymers which can be used in the present invention, the natural polymers and the semisynthetic polymers will be explained in detail. Specific examples include the following polymers: plant type polysaccharides such as κ-carrageenans, τ-carrageenans, λ-carrageenans, and pectins; microbial type polysaccharides such as xanthan gums and dextrins; animal type natural polymers such as gelatins and caseins; and cellulose-based polymers such as carboxymethylcelluloses, hydroxyethylcelluloses, and hydroxypropylcelluloses.

Gelatin is one of preferable embodiments in the present invention. Gelatin having a molecular weight of from 10,000 to 1,000,000 may be used in the present invention. Gelatin that can be used in the present invention may contain an anion such as $Cl^-$ and $SO_4^{2-}$, or alternatively a cation such as $Fe^{2+}$, $Ca^{2+}$, $Mg^{2+}$, $Sn^{2+}$, and $Zn^{2+}$. Gelatin is preferably added as an aqueous solution.

Among the water-soluble polymers which can be used in the present invention, the synthetic polymers include polyvinylpyrrolidones, polyvinylpyrrolidone copolymers, polyvinyl alcohols, polyethylene glycols, polypropylene glycols, and water-soluble polyesters. Among the synthetic polymers that can be used in the present invention as the water-soluble polymer, polyvinyl alcohols are preferable. The polyvinyl alcohols are explained in detail below.

Examples of the polyvinyl alcohols include completely saponificated polyvinyl alcohols, partially saponificated polyvinyl alcohols, and modified polyvinyl alcohols. With respect to the polyvinyl alcohols, those described in Koichi Nagano, et al., "Poval", Kobunshi Kankokai, Inc. are useful.

The viscosity of polyvinyl alcohol can be adjusted or stabilized by adding a trace amount of a solvent or an inorganic salt to an aqueous solution of polyvinyl alcohol, and there can be employed compounds described in the aforementioned reference "Poval", Koichi Nagano et al., published by Kobunshi Kankokai, pp. 144-154. For example, a coated-surface quality can be improved by an addition of boric acid, and the addition of boric acid is preferable. The amount of boric acid added is preferably 0.01 to 40 mass % with respect to polyvinyl alcohol.

Specific examples of the polyvinyl alcohol include PVA-105, PVA-110, PVA-117 and PVA-117H as the completely saponificated polyvinyl alcohol; PVA-203, PVA-205, PVA-210, and PVA-220 as the partially saponificated polyvinyl alcohol; and C-118, HL-12E, KL-118, and MP-203 as the modified polyvinyl alcohol.

The solid content of the hollow polymer particles in the heat insulation layer preferably falls in a range from 5 to 2,000 parts by mass, more preferably 5 to 1,000 parts by mass, and further preferably 5 to 400 parts by mass, assuming that the solid content of the binder resin be 100 parts by mass. Also, the ratio by mass of the solid content of the hollow polymer particles in the coating solution is preferably 1 to 70% by mass and more preferably 10 to 40% by mass. If the ratio of the hollow polymer particles is excessively low, sufficient heat insulation cannot be obtained, whereas if the ratio of the hollow polymer particles is excessively large, the adhesion between the hollow polymer particles is reduced, and thereby sufficient film strength cannot be obtained, causing deterioration in abrasion resistance.

A thickness of the heat insulation layer containing the hollow polymer particles is preferably from 5 to 50 μm, more preferably from 5 to 40 μm.

A void ratio (porosity ratio) of the heat insulation layer, which is calculated from the thickness of the heat insulation layer containing hollow polymer particles and the solid-matter coating amount of the heat insulation layer including the hollow polymer particles, is preferably 10 to 70% and more preferably 15 to 60%. When the void ratio for the heat-insulation layer is too low, sufficient heat insulation property cannot be obtained. When the void ratio is too large, the binding force among hollow polymer particles deteriorates, and thus sufficient film strength cannot be obtained, and abrasion resistance deteriorates.

The void ratio of the heat insulation layer as referred to herein is a value V calculated according to formula (b) below.

$$V=1-L/L\times\Sigma gi\cdot di \qquad \text{Formula (b)}$$

In formula (b), L represents the thickness of the heat-insulating layer; gi represents the coating amount of a particular material i in terms of solid matter for the heat-insulating layer; and di represents the specific density of the particular material i. When di represents the specific density of the hollow polymer particles, di is the specific density of the wall material of hollow polymer particles.

(Undercoat Layer)

An undercoat layer may be formed between the receptor layer and the heat insulation layer. As the undercoat layer, for example, a white background controlling layer, a charge controlling layer, an adhesive layer, and a primer layer may be formed. These layers may be formed in the same manner as those described in, for example, each specification of JP-B-3585599 and JP-B-2925244.

(Support)

A water-proof support is preferably used in the present invention. The use of the waterproof support makes it possible to prevent the support from absorbing moisture, whereby a fluctuation in the performance of the receptor layer with lapse of time can be prevented. As the waterproof support, for example, coated paper or laminate paper may be used.

—Coated Paper—

The coated paper is paper obtained by coating a sheet such as base paper with various resins, rubber latexes, or high-molecular materials, on one side or both sides of the sheet, wherein the coating amount differs depending on its use. Examples of such coated paper include art paper, cast coated paper, and Yankee paper.

(A) Polyolefin resins such as polyethylene resin and polypropylene resin; copolymer resins composed of an olefin such as ethylene or propylene and another vinyl monomer; and acrylic resins.

(B) Thermoplastic resins having an ester linkage: for example, polyester resins obtained by condensation of a dicarboxylic acid component (such a dicarboxylic acid component may be substituted with a sulfonic acid group, a carboxyl group, or the like) and an alcohol component (such an alcohol component may be substituted with a hydroxyl group, or the like); polyacrylate resins or polymethacrylate resins such as polymethylmethacrylate, polybutylmethacrylate, polymethylacrylate, polybutylacrylate, or the like; polycarbonate resins, polyvinyl acetate resins, styrene acrylate resins, styrene-methacrylate copolymer resins, vinyltoluene acrylate resins, or the like.

Concrete examples of them are those described in JP-A-59-101395, JP-A-63-7971, JP-A-63-7972, JP-A-63-7973, and JP-A-60-294862.

Commercially available thermoplastic resins usable herein are, for example, Vylon 290, Vylon 200, Vylon 280, Vylon 300, Vylon 103, Vylon GK-140, and Vylon GK-130 (products of Toyobo Co., Ltd.); Tafton NE-382, Tafton U-5, ATR-2009, and ATR-2010 (products of Kao Corporation); Elitel UE 3500, UF 3210, XA-8153, KZA-7049, and KZA-1449 (products of Unitika Ltd.); and Polyester TP-220 and R-188 (products of The Nippon Synthetic Chemical Industry Co., Ltd.); and thermoplastic resins in the Hyros series from Seiko Chemical Industries Co., Ltd., and the like (all of these names are trade names).

(C) Polyurethane resins, etc.

(D) Polyamide resins, urea resins, etc.

(E) Polysulfone resins, etc.

(F) Polyvinyl chloride resins, polyvinylidene chloride resins, vinyl chloride/vinyl acetate copolymer resins, vinyl chloride/vinyl propionate copolymer resins, etc.

(G) Polyol resins such as polyvinyl butyral; and cellulose resins such as ethyl cellulose resin and cellulose acetate resin.

(H) Polycaprolactone resins, styrene/maleic anhydride resins, polyacrylonitrile resins, polyether resins, epoxy resins, and phenolic resins.

The thermoplastic resins may be used either alone or in combination of two or more.

The thermoplastic resin may contain a whitener, a conductive agent, a filler, a pigment or dye including, for example, titanium oxide, ultramarine blue, and carbon black; or the like, if necessary.

—Laminated Paper—

The laminated paper is a paper which is formed by laminating various kinds of resin, rubber, polymer sheets or films on a sheet such as a base paper or the like. Specific examples of the materials useable for the lamination include polyolefins, polyvinyl chlorides, polyethylene terephthalates, polystyrenes, polymethacrylates, polycarbonates, polyimides, and triacetylcelluloses. These resins may be used alone, or in combination of two or more.

Generally, the polyolefins are prepared by using a low-density polyethylene. However, for improving the thermal resistance of the support, it is preferred to use a polypropylene, a blend of a polypropylene and a polyethylene, a high-density polyethylene, or a blend of a high-density polyethylene and a low-density polyethylene. From the viewpoint of cost and its suitableness for the laminate, it is preferred to use the blend of a high-density polyethylene and a low-density polyethylene.

The blend of a high-density polyethylene and a low-density polyethylene is preferably used in a blend ratio (a mass ratio) of 1/9 to 9/1, more preferably 2/8 to 8/2, and most preferably 3/7 to 7/3. When the thermoplastic resin layer is formed on the both surfaces of the support, the back side of the support is preferably formed using, for example, the high-density polyethylene or the blend of a high-density polyethylene and a low-density polyethylene. The molecular weight of the polyethylenes is not particularly limited. Preferably, both of the high-density polyethylene and the low-density polyethylene have a melt index of 1.0 to 40 g/10 minute and a high extrudability.

The sheet or film may be subjected to a treatment to impart white reflection thereto. As a method of such a treatment, for example, a method of incorporating a pigment such as titanium oxide into the sheet or film can be mentioned.

The thickness of the support is preferably from 25 μm to 300 μm, more preferably from 50 μm to 260 μm, and further preferably from 75 μm to 220 μm. The support can have any rigidity according to the purpose. When it is used as a support for electrophotographic image-receiving sheet of photographic image quality, the rigidity thereof is preferably near to that in a support for use in color silver halide photography.

(Curling Control Layer)

When the support is exposed as it is, there is the case where the heat-sensitive transfer image-receiving sheet is made to curl by moisture and/or temperature in the environment. It is therefore preferable to form a curling control layer on the backside of the support. The curling control layer not only prevents the image-receiving sheet from curling but also has a water-proof function. For the curling control layer, a polyethylene laminate, a polypropylene laminate or the like is used. Specifically, the curling control layer may be formed in a manner similar to those described in, for example, JP-A-61-110135 and JP-A-6-202295.

(Writing Layer and Charge Controlling Layer)

For the writing layer and the charge control layer, an inorganic oxide colloid, an ionic polymer, or the like may be used. As the antistatic agent, use may be made of any antistatic agent including a cationic antistatic agent, such as a quaternary ammonium salt and a polyamine derivative, an anionic antistatic agent, such as an alkyl phosphate, and a nonionic antistatic agent, such as a fatty acid ester. Specifically, the writing layer and the charge control layer may be formed in a manner similar to those described, for example, in the specification of Japanese Patent No. 3585585.

The method of producing the heat-sensitive transfer image-receiving sheet for use in the present invention is explained below.

The heat-sensitive transfer image-receiving sheet for use in the present invention can be preferably formed, by applying at least one receptor layer, at least one intermediate layer and at least one heat-insulation layer, on a support, through simultaneous multi-layer coating.

It is known that in the case of producing an image-receiving sheet composed of plural layers having different functions from each other (for example, an air cell layer, a heat insulation layer, an intermediate layer and a receptor layer) on a support, it may be produced by applying each layer successively one by one, or by overlapping the layers each already coated on a support or substrate, as shown in, for example, JP-A-2004-106283, JP-A-2004-181888 and JP-A-2004-345267. It has been known in photographic industries, on the other hand, that productivity can be greatly improved, for example, by providing plural layers through simultaneous multi-layer coating. For example, there are known methods such as the so-called slide coating (slide coating method) and curtain coating (curtain coating method) as described in, for example, U.S. Pat. Nos. 2,761,791, 2,681,234, 3,508,947, 4,457,256 and 3,993,019; JP-A-63-54975, JP-A-61-278848, JP-A-55-86557, JP-A-52-31727, JP-A-55-142565, JP-A-50-43140, JP-A-63-80872, JP-A-54-54020, JP-A-5-104061, JP-A-5-127305, and JP-B-49-7050; and Edgar B. Gutoff, et al., "Coating and Drying Defects: Troubleshooting Operating Problems", John Wiley & Sons Company, 1995, pp. 101-103.

In the present invention, the productivity is greatly improved and, at the same time, image defects can be remarkably reduced, by using the above simultaneous multilayer coating for the production of an image-receiving sheet having a multilayer structure.

The plural layers in the present invention are structured using resins as its major components. Coating solutions forming each layer are preferably water-dispersible latexes. The solid content by mass of the resin put in a latex state in each layer coating solution is preferably in a range from 5 to 80% and particularly preferably 20 to 60%. The average particle size of the resin contained in the above water-dispersed latex is preferably 5 μm or less and particularly preferably 1 μm or less. The above water-dispersed latex may contain a known additive, such as a surfactant, a dispersant, and a binder resin, according to the need.

In the present invention, it is preferred that a laminate composed of plural layers be formed on a support and solidified just after the forming, according to the method described in U.S. Pat. No. 2,761,791. For example, in the case of solidifying a multilayer structure by using a resin, it is preferable to raise the temperature immediately after the plural layers are formed on the support. Also, in the case where a binder (e.g., a gelatin) to be gelled at lower temperatures is contained, there is the case where it is preferable to drop the temperature immediately after the plural layers are formed on the support.

In the present invention, the coating amount of a coating solution per one layer constituting the multilayer is preferably in a range from 1 g/m$^2$ to 500 g/m$^2$. The number of layers in the multilayer structure may be arbitrarily selected from a number of 2 or more. The receptor layer is preferably disposed as a layer most apart from the support.

3) Image Formation

In the image-forming method of the present invention, an image is preferably formed by superposing a heat-sensitive transfer sheet on a heat-sensitive transfer image-receiving sheet so that a heat transfer layer of the heat-sensitive transfer sheet is in contact with a dye receptor layer of the heat-sensitive transfer image-receiving sheet, and giving thermal energy in accordance with image signals given from a thermal head. Further, it is preferred that an image is formed by superposing a heat-sensitive transfer sheet on a heat-sensitive transfer image-receiving sheet so that a heat transfer layer of the heat-sensitive transfer sheet is in contact with a dye receptor layer of the heat-sensitive transfer image-receiving sheet, and giving thermal energy in accordance with image signals given from a thermal head, and thereby forming a protective layer on the image by using the thermal head to transfer the protective layer having the transferable protective layer laminated structure.

Specifically, image-forming can be achieved by the similar manner to that as described in, for example, JP-A-2005-88545. In the present invention, a printing time is preferably less than 15 seconds, and more preferably in the range of 3 to 12 seconds, furthermore preferably 3 to 7 seconds, from the viewpoint of shortening a time taken until a consumer gets a print.

In order to accomplish the above-described printing time, a line speed at the time of printing is preferably 0.8 m sec/line or less, more preferably 0.73 m sec/line or less, and further preferably 0.65 m sec/line or less. Further, from the viewpoint of improvement in transfer efficiency as one of speeding-up conditions, the maximum ultimate temperature of the thermal head at the time of printing is preferably in the range of from 180° C. to 450° C., more preferably from 200° C. to 450° C., and furthermore preferably from 350° C. to 450° C.

The method of the present invention may be utilized for printers, copying machines and the like, which employs a heat-sensitive transfer recording system.

As a means for providing heat energy in the thermal transfer, any of the conventionally known providing means may be used. For example, application of a heat energy of about 5 to 100 mJ/mm$^2$ by controlling recording time in a recording device such as a thermal printer (e.g. trade name: Video Printer VY-100, manufactured by Hitachi, Ltd.), sufficiently attains the expected result.

Also, the heat-sensitive transfer image-receiving sheet for use in the present invention may be used in various applications enabling thermal transfer recording, such as heat-sensitive transfer image-receiving sheets in a form of thin sheets (cut sheets) or rolls; cards; and transmittable type manuscript-making sheets, by optionally selecting the type of support.

4) Measurement of Glass Transition Temperature

Next, a glass transition temperature (Tg) and a glass transition point (Tg-A) are explained below.

The noncrystalline solid changes by heating from the state in which the solid is as hard as crystals, or has no fluidity (so-called glass state) to the state in which viscosity of the solid drastically decreases in a certain narrow temperature range, so that fluidity of the solid increases (so-called rubbery state). The above-said temperature at which the state changes is a glass transition temperature (Tg). The glass transition temperature can be obtained by calculation as described above, but also by actual measurement. At the glass transition temperature, not only physical changes occur as described above, but also endothermic and exothermic phenomena arise according to the physical changes. Therefore, as to the measurement of the glass transition temperature, there are a physical measuring method such as a method of measuring a change of mechanical property by thermomechanical analysis (TMA), or a change of dynamic viscoelasticity while altering a temperature up and down; a thermodynamic method such as and a method of measuring a change of thermal response of the sample using differential scanning calorimetry (DSC) while altering a temperature. Thus, the glass transition temperature (Tg) is a measurable physical quantity that is defined with respect to the simple noncrystalline solid. Therefore, such the glass transition temperature (Tg) is thought to be the same phase transition point as the melting point and the boiling point.

On the other hand, the glass transition point (Tg-A) according to the present invention indicates a glass transition temperature of the ink layer (heat transfer layer) per se (itself) of the ink sheet. As melting points and boiling points of aqueous solutions are present and measurable, the heat transfer layer, which is a mixture, has a glass transition temperature being measurable.

In the present invention, each heat transfer layer is preferably coated in order of a yellow heat transfer layer, a magenta heat transfer layer and a cyan heat transfer layer. Accordingly, in this case, "glass transition point (Tg-A) reduces in area order" means that each value of the glass transition point (Tg-A) reduce in order of the yellow heat transfer layer, the magenta heat transfer layer and the cyan heat transfer layer.

In each of the yellow, magenta and cyan heat transfer layers, preferable range of the glass transition point (Tg-A) is explained below. In the yellow heat transfer layer, Tg-A is preferably in the range of 50° C. or more to 85° C. or less, more preferably in the range of 50° C. or more to 70° C. or less. In the magenta heat transfer layer, Tg-A is preferably in the range of 46° C. or more to 80° C. or less, more preferably in the range of 47° C. or more to 70° C. or less. In the cyan heat transfer layer, Tg-A is preferably in the range of 45° C. or more to 75° C. or less, more preferably in the range of 46° C. or more to 65° C. or less. If Tg-A exceed their upper preferable limits, a transfer density sometimes becomes low. On the other hand, Tg-A lower than their preferable range sometimes causes a trouble such as a ribbon wrinkle trouble, even though the obtained transfer density is enough.

When Tg-A are reduced in order of the yellow, magenta and cyan heat transfer layer, it is preferred that a difference of Tg-A between each of a couple of heat transfer layers is 1° C. or more. On the other hand, there is no particular upper limitation, however, if the Tg-A of a heat transfer layer is too low (for example, Tg-A of the cyan heat transfer layer is less than 45° C.), a ribbon wrinkle trouble arises as mentioned above. As a result, a substantial upper limit to the difference of the Tg-A values is 15° C. or less. Such a difference of Tg-A values can be applied to not only a couple of a yellow heat transfer layer and a magenta heat transfer layer, but also a couple of a magenta heat transfer layer and a cyan heat transfer layer.

As the (Tg-A) of the heat transfer layer according to the present specification, was employed the value that is obtained by measuring a thermal response to a change of temperature owing to thermo scanning in a range of from −20° C. to 150° C. by means of DSC instrument (EXSTAR 6000 model DSC instrument manufactured by SEIKO INSTRUMENT) with respect to the heat transfer layer that was physically peeled off from the heat-sensitive transfer sheet.

According to the present invention, it is possible to provide an image-forming method applying a heat-sensitive transfer system which has excellent continuous printing suitability and forms an image that hardly involves defects.

The present invention will be described in more detail based on the following examples, but the invention is not intended to be limited thereto.

EXAMPLES

In the following examples, the terms "part(s)" and "%" are values by mass, unless otherwise specified.

[Preparation of Heat-Sensitive Transfer Sheets]

(Preparation of a Coating Liquid for Heat-Sensitive Transfer Sheet and a Coating Liquid for Protective Layer)

For preparation of heat-sensitive transfer sheets, the following coating liquids were prepared.

| Preparation of a coating liquid for yellow heat transfer layer PY-1 | |
|---|---|
| Yellow dye compound (Y1-6) | 3.9 parts by mass |
| Yellow dye compound (Y3-7) | 3.9 parts by mass |
| Polyvinylacetoacetal resin (trade name: ESLEC KS-1, manufactured by Sekisui Chemical Co., Ltd.) | 6.1 parts by mass |
| Polyvinylbutyral resin (trade name: DENKA BUTYRAL #6000-C, manufactured by DENKI KAGAKU KOGYOU K. K.) | 2.1 parts by mass |
| Releasing agent (trade name: X-22-3000T, manufactured by Shin-Etsu Chemical Co., Ltd.) | 0.05 part by mass |
| Releasing agent (trade name: TSF 4701, manufactured by MOMENTIVE Performance Materials Japan LLC.) | 0.03 parts by mass |
| Matting agent (trade name: Flo-thene UF, manufactured by Sumitomo Seika Chemicals Co., Ltd.) | 0.15 parts by mass |
| Methyl ethyl ketone/toluene (2/1, at mass ratio) | 84 parts by mass |
| **Preparation of a coating liquid for magenta heat transfer layer PM-1** | |
| Magenta dye compound (M1-2) | 0.1 parts by mass |
| Magenta dye compound (M2-1) | 0.7 parts by mass |
| Magenta dye compound (M2-3) | 6.6 parts by mass |
| Cyan dye compound (C2-2) | 0.4 parts by mass |
| Polyvinylacetal resin (trade name: ESLEC KS-1, manufactured by Sekisui Chemical Co., Ltd.) | 8.0 parts by mass |
| Polyvinylbutyral resin (trade name: DENKA BUTYRAL #6000-C, manufactured by DENKI KAGAKU KOGYOU K. K.) | 0.2 parts by mass |
| Releasing agent (trade name: X-22-3000T, manufactured by Shin-Etsu Chemical Co., Ltd.) | 0.05 parts by mass |
| Releasing agent (trade name: TSF 4701, manufactured by MOMENTIVE Performance Materials Japan LLC.) | 0.03 parts by mass |
| Matting agent (trade name: Flo-thene UF, manufactured by Sumitomo Seika Chemicals Co., Ltd.) | 0.15 parts by mass |
| Methyl ethyl ketone/toluene (2/1, at mass ratio) | 84 parts by mass |
| **Preparation of a coating liquid for cyan heat transfer layer PC-1** | |
| Cyan dye compound (C1-3) | 1.2 parts by mass |
| Cyan dye compound (C2-2) | 6.6 parts by mass |
| Polyvinylacetal resin (trade name: ESLEC KS-1, manufactured by Sekisui Chemical Co., Ltd.) | 7.4 parts by mass |

-continued

| | |
|---|---|
| Polyvinylbutyral resin (trade name: DENKA BUTYRAL #6000-C, manufactured by DENKI KAGAKU KOGYOU K. K.) | 0.8 parts by mass |
| Releasing agent (trade name: X-22-3000T, manufactured by Shin-Etsu Chemical Co., Ltd.) | 0.05 parts by mass |
| Releasing agent (trade name: TSF 4701, manufactured by MOMENTIVE Performance Materials Japan LLC.) | 0.03 parts by mass |
| Matting agent (trade name: Flo-thene UF, manufactured by Sumitomo Seika Chemicals Co., Ltd.) | 0.15 parts by mass |
| Methyl ethyl ketone/toluene (2/1, at mass ratio) | 84 parts by mass |

Preparation of release-layer-coating liquid for heat-sensitive transferable protective layer PU1

| | |
|---|---|
| Modified cellulose resin (trade name: L-30, manufactured by DAICEL CHEMICAL INDUSTRIES, LTD.) | 5.0 parts by mass |
| Methyl ethyl ketone | 95.0 parts by mass |

Preparation of separation-layer-coating liquid for heat-sensitive transferable protective layer PO1

| | |
|---|---|
| Acrylic resin solution (Solid content: 40%) (trade name: UNO-1, manufactured by Gifu Ceramics Limited) | 90 parts by mass |
| Methanol/isopropanol (1/1, at mass ratio) | 10 parts by mass |

Preparation of adhesive-layer-coating liquid for heat-sensitive transferable protective layer A1

| | |
|---|---|
| Acrylic resin (trade name: DIANAL BR-77, manufactured by MITSUBISHI RAYON CO., LTD.) | 25 parts by mass |
| The following ultraviolet absorber UV-1 | 1 part by mass |
| The following ultraviolet absorber UV-2 | 2 parts by mass |
| The following ultraviolet absorber UV-3 | 1 part by mass |
| The following ultraviolet absorber UV-4 | 1 part by mass |
| PMMA fine particles (polymethyl methacrylate fine particles) | 0.4 part by mass |
| Methyl ethyl ketone/toluene (2/1, at mass ratio) | 70 parts by mass |

(UV-1)

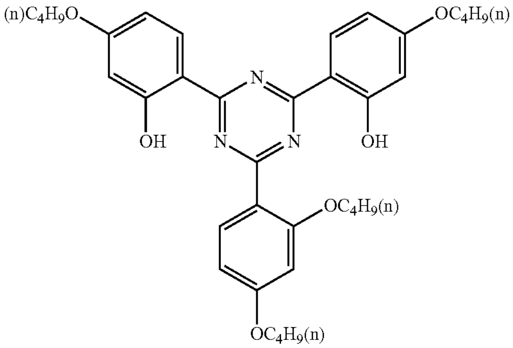

(UV-2)

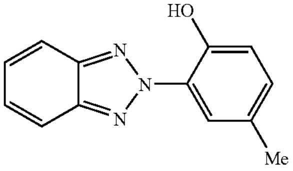

(UV-3)

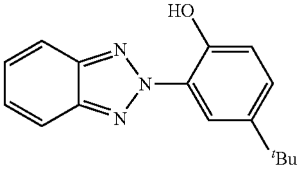

(UV-4)

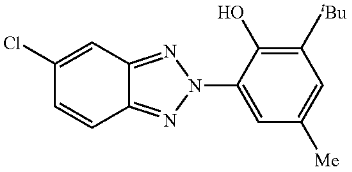

(Preparation of Back-Layer-Coating Liquid)

In order to producing a back heat resistance layer of the heat-sensitive transfer sheet, the following coating liquid was prepared.

| Back side layer-coating solution BC1 | |
|---|---|
| Acrylic-series polyol resin (trade name: ACRYDIC A-801, manufactured by Dainippon Ink and Chemicals, Incorporated) | 26.0 parts by mass |
| Zinc stearate (trade name: SZ-2000, manufactured by Sakai Chemical Industry Co., Ltd.) | 0.43 part by mass |
| Phosphate (trade name: PLYSURF A217, manufactured by Dai-ichi Kogyo Seiyaku Co., Ltd.) | 1.27 parts by mass |
| Isocyanate (50% solution) (trade name: BURNOCK D-800, manufactured by Dainippon Ink and Chemicals, Incorporated) | 8.0 parts by mass |
| Methyl ethyl ketone/toluene (2/1, at mass ratio) | 64 parts by mass |

(Preparation of Sheets by Coating of Coating Liquids Described Above)

A polyester film 6.0 μm in thickness (trade name: Diafoil K200E-6F, manufactured by MITSUBISHI POLYESTER FILM CORPORATION), that was subjected to an adhesion-treatment on one surface of the film, was used as a support. The following back side-layer coating solution BC1 was applied onto the support on the other surface that was not subjected to the adhesion-treatment, so that the coating amount based on the solid content after drying would be 1 $g/m^2$. After drying, the coated film was hardened by heat at 60° C.

A heat-sensitive transfer sheet A was prepared by coating the above-described coating liquids on the easy adhesion layer coating side of the thus-prepared polyethylene film so that a yellow heat transfer layer, a magenta heat transfer layer, a cyan heat transfer layer, and a protective layer could be disposed in area order. In the case of forming a protective layer, the release-layer-coating liquid for protective layer PU1 was coated and dried, and then the separation-layer-coating liquid for protective layer PO1 was coated and dried, and then the adhesion-layer-coating liquid for protective layer A1 was coated.

A coating amount of each of five layers applied in this preparation was controlled so that the solid content coating amount would become the value set forth below.

| | |
|---|---|
| Yellow heat transfer layer | 0.8 $g/m^2$ |
| Magenta heat transfer layer | 0.8 $g/m^2$ |
| Cyan heat transfer layer | 0.8 $g/m^2$ |
| Protective releasing layer | 0.3 $g/m^2$ |
| Protective separation layer | 0.5 $g/m^2$ |
| Protective adhesive layer | 2.2 $g/m^2$ |

Further, heat-sensitive transfer sheet samples 100 to 109 as set forth in Table 1 were prepared changing each of color heat transfer layer coating liquids as described below.

[Preparation of Heat Sensitive Image-Receiving Sheet]

(Preparation of Heat-Sensitive Transfer Image-Receiving Sheet S1)

A paper support, on both sides of which polyethylene was laminated, was subjected to corona discharge treatment on the surface thereof, and then a gelatin subbing layer containing sodium dodecylbenzenesulfonate was disposed on the treated surface. The heat insulation layer and the receptor layer each having the following composition were multilayer-coated on the gelatin subbing layer, in the state that a undercoat layer, a heat insulation layer, a lower receptor layer, and a upper receptor layer were laminated in this order from the side of the support, by a method illustrated in FIG. 9 in U.S. Pat. No. 2,761,791. The coating was performed so that coating amounts of the undercoat layer, the heat insulation layer, the lower receptor layer, and the upper receptor layer after drying would be 6.7 $g/m^2$, 8.6 $g/m^2$, 2.6 $g/m^2$ and 2.7 $g/m^2$, respectively.

| Upper Receptor Layer | |
|---|---|
| Vinyl chloride-series latex (as a solid content) (trade name: Vinybran 900, manufactured by Nisshin Chemicals Co., Ltd.) | 22.2 parts by mass |
| Vinyl chloride-series latex (as a solid content) (trade name: Vinybran 276, manufactured by Nisshin Chemicals Co., Ltd.) | 2.5 parts by mass |
| Gelatin | 0.5 parts by mass |
| Ester wax EW-1 as set forth below | 2.0 parts by mass |
| Surfactant F-1 as set forth below | 0.04 parts by mass |
| **Lower receptor layer** | |
| Vinyl chloride-series latex (as a solid content) (trade name: Vinybran 690, manufactured by Nisshin Chemicals Co., Ltd.) | 24.4 parts by mass |
| Gelatin | 1.4 parts by mass |
| Surfactant F-1 | 0.04 parts by mass |
| **Heat insulation layer** | |
| Hollow latex polymer particles (as a solid content) (trade name: MH5055, manufactured by Nippon Zeon Co., Ltd.) | 579 parts by mass |
| Gelatin | 279 parts by mass |

-continued

| Undercoat layer | |
|---|---|
| Polyvinyl alcohol (POVAL PVA 205, trade name, a product of Kuraray) | 16.8 parts by mass |
| Styrene butadiene rubber latex (as a solid content) (SN-307, trade name, a product of NIPPON A & L INC) | 150 parts by mass |
| Surfactant F-1 | 0.1 parts by mass |

(EW-1)

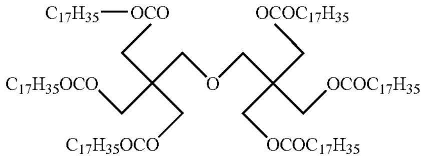

(F-1)

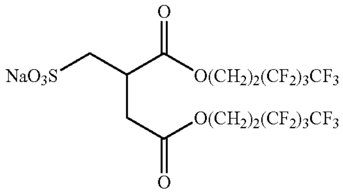

[Image Formation]

Each of the above heat-sensitive transfer sheets and the heat-sensitive transfer image-receiving sheet S1 were processed so that they can be loaded to a sublimation-type thermal transfer printer ASK2000 (trade name, manufactured by FUJIFILM Corporation). Thereby output was achieved at a high speed print mode. At the time of printing, line speed was 0.73 m sec/line and a maximum ultimate temperature of a thermal head was 450° C.

[Evaluation Test]

Samples 102 to 109 each of which provides Tg-A values as shown in Table 1 were prepared adjusting a molecular weight of the binder in a dye layer on basis of the heat-sensitive transfer sheet sample 100. However, with respect to the sample 101, print was formed using a heat-sensitive transfer sheet manufacture by K.K. DNP Print Rush.

After stabilization of the above-described sublimation type printer, heat-sensitive transfer sheet samples 100 to 109 and heat-sensitive transfer image-receiving sheet S1 by leaving them for 12 hours under the constant conditions of temperature 15° C. and humidity 20% RH, 30 sheets of print were output using digital image information from which KG sized solid black image ((R, G, B)=(0, 0, 0)) would be formed. For quantification of ribbon shrivel (crease) that occurred in the $30^{th}$ print, a print image was input on the conditions of 24 bit color and 100 dpi while controlling network scanner ES-2000 (a product of SEIKO EPSON) with PhotoShop CS (a product of Adobe) to make a data file with bmp format as a 8 bit color information in each pixel. In order to eliminate noise information at the edge of image in the time when the image was input, image analysis was performed using a central portion (98%) of the image. For image analysis of the ribbon shrivel, G information that provides the strongest visual sensitivity was extracted. The ribbon shrivel was defined as a pixel that failed to reproduce of black at the spot providing 25 or more information. RS was defined as a total number of such the pixels counted using a spreadsheet soft Excel (a product of Microsoft). The less the ribbon-shrivel occurs, the lower the RS value becomes. Whereas, the more the ribbon-shrivel occurs, the higher the RS value becomes.

Further, in order to measure a transfer density of the above-described print, a V density at the area where irregular transfer does not occur was measured using X-rite 53 OLP (a product of X-rite Corporation) in terms of average value of 20 points abstracted in the image.

Further, with respect to the blocking owing to a failure of transfer, whether occurrence of the blocking is present was examined by naked eye. If occurrence of the blocking is found even in one sheet among 30 sheets examined as described above, the blocking is evaluated as "occurrence". The thus-obtained results are shown in Table 1.

TABLE 1

| Sample | Tg-A(° C.) | | | ribbon shrivel | transfer density | | |
|---|---|---|---|---|---|---|---|
| No. | Y | M | C | RS | (V density) | Blocking | Remarks |
| 100 | 51 | 68 | 57 | 125 | 1.8 | o(no occurrence) | Comparative example |
| 101 | 62 | 67 | 62 | 89 | 1.9 | o(no occurrence) | Comparative example |
| 102 | 51 | 60 | 65 | 852 | 2.0 | o(no occurrence) | Comparative example |
| 103 | 51 | 55 | 67 | 1283 | 2.1 | o(no occurrence) | Comparative example |
| 104 | 62 | 62 | 63 | 598 | 1.9 | o(no occurrence) | Comparative example |
| 105 | 75 | 68 | 57 | 35 | 2.1 | o(no occurrence) | This invention |
| 106 | 62 | 55 | 50 | 10 | 2.1 | o(no occurrence) | This invention |

TABLE 1-continued

| Sample No. | Tg-A(° C.) Y | M | C | ribbon shrivel RS | transfer density (V density) | Blocking | Remarks |
|---|---|---|---|---|---|---|---|
| 107 | 51 | 47 | 46 | 5 | 2.2 | o(no occurrence) | This invention |
| 108 | 65 | 62 | 54 | 9 | 2.2 | o(no occurrence) | This invention |
| 109 | 48 | 44 | 40 | 1585 | 2.3 | x(occurrence) | Comparative example |

From the results in Table 1, it is understood that in each of the samples 102, 103 and 104 whose value of Tg-A increases in area order respectively as compared to the sample 100, even though the transfer density of each sample increases, the ribbon shrivel worsens. In contrast, in each of the samples 105 to 108 whose value of Tg-A decreases in area order, increase of transfer density has been achieved as well as improvement of the ribbon shrivel. On the contrary, in the sample 109 in which the value of Tg-A of the Cyan dye layer is less than 45° C., it cause the problem that blocking occurred as well as occurrence of ribbon shrivel.

Example 2

The same tests as Example 1 were conducted using the following image-receiving sheets S2 and S3, respectively, in place of the image-receiving sheet S1 that was prepared in Example 1. As a result, it is understood that the samples which used the heat-sensitive transfer image-receiving sheet and the heat-sensitive transfer sheet according to the present invention showed excellent results. Among the samples using the image-receiving sheet S2, it is also understood that the samples which used the image-receiving sheet S2 together with the heat-sensitive transfer sheet according to the present invention showed excellent results.

(Preparation of Heat-Sensitive Transfer Image-Receiving Sheets)

Preparation of an Image-Receiving Sheet S2 (Image-Receiving Sheet for Comparison)

A synthetic paper (trade name: Yupo FPG 200, manufactured by Yupo Corporation, thickness: 200 μm) was used as the support; and, on one surface of the support, a white intermediate layer and a receptor layer, having the following compositions, were coated in this order by a bar coater. The coating was carried out such that the amount of the white intermediate layer and the amount of the receptor layer after each layer was dried would be 1.0 g/$m^2$ and 4.0 g/$m^2$, respectively, and these layers were respectively dried at 110° C. for 30 seconds.

| | |
|---|---|
| White intermediate layer | |
| Polyester resin (Trade name: Vylon 200, manufactured by Toyobo Co., Ltd.) | 10 parts by mass |
| Fluorescent whitening agent (Trade name: Uvitex OB, manufactured by Ciba-Geigy) | 1 part by mass |
| Titanium oxide | 30 parts by mass |
| Methyl ethyl ketone/toluene (1/1, at mass ratio) | 90 parts by mass |
| Receptor layer | |
| Vinyl chloride/vinyl acetate resin (Trade name: Solbin A, manufactured by Nisshin Chemicals Co., Ltd.) | 100 parts by mass |

-continued

| | |
|---|---|
| Amino-modified silicone (Trade name: X22-3050C, manufactured by Shin-Etsu Chemical Co., Ltd.) | 5 parts by mass |
| Epoxy-modified silicone (Trade name: X22-300E, manufactured by Shin-Etsu Chemical Co., Ltd.) | 5 parts by mass |
| Methyl ethyl ketone/toluene (1/1, at mass ratio) | 400 parts by mass |

Preparation of Image-Receiving Sheet S3 (Image-Receiving Sheet According to the Present Invention)

A paper support, on both sides of which polyethylene was laminated, was subjected to corona discharge treatment on the surface thereof, and then a gelatin subbing layer containing sodium dodecylbenzenesulfonate was disposed on the treated surface. On the gelatin subbing layer, were multilayer-coated a heat insulation layer having the same composition as that in the image-receiving sheet S1 and an intermediate layer consisting of gelatin alone so that these layers would be superposed in this order from the support side, according to the method described in FIG. 9 of U.S. Pat. No. 2,761,791. Immediately after coating, these layers were dried at 50° C. for 16 hours. These layers were coated so that a dry coating amount of each of the heat insulation layer and the intermediate layer would become 15 g/$m^2$ and 0.2 g/$m^2$, respectively. On the intermediate layer of the thus-obtained sample, was coated a receptor layer having the same composition as that in the image-receiving sheet S2 using a bar coater. The receptor layer was coated so that a dry coating amount would become 4.0 g/$m^2$. Immediately after coating, the sample was dried at 110° C. for 30 seconds.

Having described our invention as related to the present embodiments, it is our intention that the invention not be limited by any of the details of the description, unless otherwise specified, but rather be construed broadly within its spirit and scope as set out in the accompanying claims.

What we claim is:

1. An image-forming method applying a heat-sensitive transfer system which uses a heat-sensitive transfer image-receiving sheet and a heat-sensitive transfer sheet, in which the heat-sensitive transfer image-receiving sheet comprises a support, at least one dye receptor layer on the support, and at least one heat insulation layer containing both hollow polymer particles and a hydrophilic polymer that is disposed between the dye receptor layer and the support; and the heat-sensitive transfer sheet comprises at least one yellow heat transfer layer, at least one magenta heat transfer layer, and/or at least one cyan heat transfer layer on a support:

comprising controlling each glass transition point (Tg-A) of three heat transfer layers so that they decrease in area order; and comprising transferring at least three kinds of heat transfer dyes contained in the heat transfer layers to the dye receptor layer in order.

2. The image-forming method as described in claim 1, wherein the heat-sensitive transfer sheet comprises a yellow heat transfer layer, a magenta heat transfer layer, and a cyan heat transfer layer, and each layer is formed on the surface of the same support in area order.

3. The image-forming method as described in claim 1, comprising the step of:

using a printer in which a maximum ultimate temperature (Tm) of a thermal head is 180° C. or more to 450° C. or less, at the time when a heat-sensitive transfer is performed using the heat-sensitive transfer sheet containing the heat transfer dye.

4. The image-forming method as described in claim 3, wherein the printer has line speed of 0.8 m sec/line or less at the time of image formation.

5. The image-forming method as described in claim 1, wherein at least one of the hydrophilic polymer contained in the heat insulation layer of the heat-sensitive transfer image-receiving sheet is gelatin.

6. The image-forming method as described in claim 1, comprising the steps of:

superposing the heat-sensitive transfer sheet on the heat-sensitive transfer image-receiving sheet so that the dye receptor layer of the heat-sensitive transfer image-receiving sheet is in contact with the heat transfer layer of the heat-sensitive transfer sheet; and giving thermal energy from a thermal head in accordance with image signals, thereby to form an image.

7. The image-forming method as described in claim 1, comprising the steps of:

superposing the heat-sensitive transfer sheet on the heat-sensitive transfer image-receiving sheet so that the receptor layer of the heat-sensitive transfer image-receiving sheet is in contact with the heat transfer layer of the heat-sensitive transfer sheet;

giving thermal energy from a thermal head in accordance with image signals, thereby to form an image; and forming a protective layer by using the thermal head.

8. A heat-sensitive transfer sheet comprising at least one yellow heat transfer layer, at least one magenta heat transfer layer, and at least one cyan heat transfer layer on a support, wherein glass transition points (Tg-A) of the yellow heat transfer layer, the magenta heat transfer layer, and the cyan heat transfer layer decrease in that order.

9. The heat-sensitive transfer sheet as described in claim 8, wherein the glass transition point of the yellow heat transfer layer is 50° C. or more to 85° C. or less, the glass transition point of the magenta heat transfer layer is 46° C. or more to 80° C. or less, and the glass transition point of the cyan heat transfer layer is 45° C. or more to 75° C. or less.

10. The heat-sensitive transfer sheet as described in claim 8, wherein a difference of the glass transition point between the yellow heat transfer layer and the magenta heat transfer layer is 1° C. or more, and a difference of the glass transition point between the magenta heat transfer layer and the cyan heat transfer layer is 1° C. or more.

* * * * *